US 9,997,325 B2

(12) United States Patent
Hosch et al.

(10) Patent No.: US 9,997,325 B2
(45) Date of Patent: Jun. 12, 2018

(54) ELECTRON BEAM EXCITER FOR USE IN CHEMICAL ANALYSIS IN PROCESSING SYSTEMS

(75) Inventors: Jimmy W. Hosch, Dallas, TX (US); Matthew J. Goeckner, Plano, TX (US); Mike Whelan, Coppell, TX (US); Andrew Weeks Kueny, Dallas, TX (US); Kenneth C. Harvey, Dallas, TX (US); P.L. Stephan Thamban, Richardson, TX (US)

(73) Assignees: Verity Instruments, Inc., Carrollton, TX (US); Board of Regents, The University of Texas System, Austin, TX (US)

( * ) Notice: Subject to any disclaimer, the term of this patent is extended or adjusted under 35 U.S.C. 154(b) by 1220 days.

(21) Appl. No.: 12/460,462

(22) Filed: Jul. 16, 2009

(65) Prior Publication Data
US 2010/0032587 A1 Feb. 11, 2010

Related U.S. Application Data

(60) Provisional application No. 61/135,163, filed on Jul. 17, 2008, provisional application No. 61/271,060, filed on Jul. 15, 2009.

(51) Int. Cl.
*H01J 37/06* (2006.01)
*H01J 37/32* (2006.01)
(52) U.S. Cl.
CPC ........ *H01J 37/06* (2013.01); *H01J 37/32935* (2013.01); *H01J 37/32972* (2013.01)
(58) Field of Classification Search
CPC .................. H01J 37/06; H01J 37/32972; H01J 37/32935; H01J 37/32; H01J 37/305;
(Continued)

(56) References Cited

U.S. PATENT DOCUMENTS

| 4,030,967 A | 6/1977 | Ingrey et al. |
| 4,115,184 A | 9/1978 | Poulsen |

(Continued)

FOREIGN PATENT DOCUMENTS

| FR | 2788854 | 1/1999 |
| FR | 2788854 | 7/2000 |

(Continued)

OTHER PUBLICATIONS

PCT/US0904170, Verity et al, Search Report.
(Continued)

*Primary Examiner* — Douglas W Owens
*Assistant Examiner* — Henry Luong

(57) ABSTRACT

The present invention is directed to a gas line electron beam exciter, gas line electron beam excitation system and method for exciting a gas using an electron beam exciter. The electron beam exciter generally comprises a variable density electron source for generating a cloud of electrons in an electron chamber and a variable energy electron extractor for accelerating electrons from the electron chamber as an electron beam and into an effluent stream for fluorescing species in the effluent. The electron density of the electron beam is variably controlled by adjusting the excitation power applied to the variable density electron source. The electrons in the electron chamber reside at a reference electrical potential of the chamber, typically near ground electrical potential. The electron energy of the electron beam is variably controlled by adjusting an electrical potential across the variable energy electron extractor, which energizes the electrons through an extraction hole of the chamber and toward the extractor. The greater the difference in the electrical potential between the electron extractor and the electron source, the higher the energy imparted to the electrons in the electron beam. The excitation power applied
(Continued)

to the electron source can be adjusted independently from the electron energy of the electron beam, thereby altering the electron density of the electron beam without changing the energy level of the electrons of the electron beam.

9 Claims, 44 Drawing Sheets

(58) Field of Classification Search
CPC .............. H01J 2237/00; H01J 37/32917; H01J 37/32963; H01J 37/32981; H01J 37/32009; H01L 22/26
USPC ................. 250/492.3, 493.1, 339.07, 390.07; 315/111.01, 111.21, 111.31, 111.71, 315/111.81
See application file for complete search history.

(56) References Cited

U.S. PATENT DOCUMENTS

| | | |
|---|---|---|
| 4,121,082 A | 10/1978 | Harrington et al. |
| 4,121,083 A | 10/1978 | Smyth |
| 4,164,373 A | 8/1979 | Schuss et al. |
| 4,185,213 A | 1/1980 | Scannell |
| 4,256,779 A | 3/1981 | Sokol et al. |
| 4,293,220 A | 10/1981 | Denton et al. |
| 4,300,834 A | 11/1981 | Demers et al. |
| 4,312,732 A | 1/1982 | Degenkolb et al. |
| 4,314,875 A | 2/1982 | Flamm |
| RE31,018 E | 8/1982 | Harrington et al. |
| 4,361,441 A | 11/1982 | Tylko |
| 4,394,162 A | 7/1983 | Tylko |
| 4,432,644 A | 2/1984 | Demers et al. |
| 4,521,666 A | 6/1985 | Severance, Jr. et al. |
| 4,526,644 A | 7/1985 | Fujiyama et al. |
| 4,528,438 A | 7/1985 | Poulsen et al. |
| 4,563,566 A | 1/1986 | Reents |
| 4,570,048 A | 2/1986 | Poole |
| 4,575,241 A | 3/1986 | Demers et al. |
| 4,575,609 A | 3/1986 | Fassel et al. |
| 4,577,838 A | 3/1986 | Mathiesen |
| 4,578,022 A | 3/1986 | Kenney |
| 4,591,267 A | 5/1986 | Demers et al. |
| 4,599,134 A | 7/1986 | Babu et al. |
| 4,606,869 A | 8/1986 | Showak |
| 4,609,426 A * | 9/1986 | Ogawa .................. G01N 21/62 156/345.24 |
| 4,611,919 A | 9/1986 | Brooks, Jr. et al. |
| 4,636,339 A | 1/1987 | Kenney |
| 4,637,938 A | 1/1987 | Lee et al. |
| 4,656,330 A | 4/1987 | Poole |
| 4,659,899 A | 4/1987 | Welkie et al. |
| 4,689,112 A | 8/1987 | Bersin |
| 4,699,689 A | 10/1987 | Bersin |
| 4,735,633 A | 4/1988 | Chiu |
| 4,770,690 A | 9/1988 | Hanagan et al. |
| 4,776,690 A | 10/1988 | Quimby |
| 4,820,044 A | 4/1989 | Crighton et al. |
| 4,833,293 A | 5/1989 | O'hare |
| 4,846,920 A | 7/1989 | Keller et al. |
| 4,851,683 A | 7/1989 | Yang et al. |
| 4,857,136 A | 8/1989 | Zajac |
| 4,888,199 A * | 12/1989 | Felts ................... C23C 14/0042 204/192.13 |
| 4,896,017 A | 1/1990 | Koppel et al. |
| 4,897,282 A | 1/1990 | Kniseley et al. |
| 4,939,376 A | 7/1990 | Woodruff et al. |
| 4,954,212 A | 9/1990 | Gabriel et al. |
| 4,965,540 A | 10/1990 | Sullivan |
| 4,982,067 A | 1/1991 | Marantz et al. |
| 5,022,988 A | 6/1991 | Okarma et al. |
| 5,085,499 A | 2/1992 | Griffin et al. |
| 5,144,110 A | 9/1992 | Marantz et al. |
| 5,151,371 A | 9/1992 | Quimby et al. |
| 5,160,402 A | 11/1992 | Cheng |
| 5,208,644 A | 5/1993 | Litvak et al. |
| 5,220,150 A | 6/1993 | Pfender et al. |
| 5,229,311 A | 7/1993 | Lai et al. |
| 5,252,827 A | 10/1993 | Koga et al. |
| 5,297,422 A | 3/1994 | Baret |
| 5,329,091 A | 7/1994 | Bissinger |
| 5,347,460 A | 9/1994 | Gifford et al. |
| 5,353,722 A | 10/1994 | Vassiliou et al. |
| 5,367,163 A | 11/1994 | Otsuka et al. |
| 5,369,035 A | 11/1994 | Eastgate et al. |
| 5,374,802 A | 12/1994 | Dorfman et al. |
| 5,379,103 A | 1/1995 | Zigler |
| 5,405,488 A | 4/1995 | Dimitrelis et al. |
| 5,413,663 A | 5/1995 | Shimizu et al. |
| 5,414,504 A | 5/1995 | Litvak et al. |
| 5,451,259 A | 9/1995 | Krogh |
| 5,453,125 A | 9/1995 | Krogh |
| 5,479,254 A | 12/1995 | Woskov et al. |
| 5,486,677 A | 1/1996 | Maischner et al. |
| 5,495,107 A | 2/1996 | Hu et al. |
| 5,529,856 A | 6/1996 | Petri et al. |
| 5,534,107 A | 7/1996 | Gray et al. |
| 5,546,322 A | 8/1996 | Gifford et al. |
| 5,552,016 A | 9/1996 | Ghanayem |
| 5,563,412 A | 10/1996 | Zandbergen et al. |
| 5,596,405 A | 1/1997 | Seltzer et al. |
| 5,620,925 A | 4/1997 | Nakata et al. |
| 5,625,185 A | 4/1997 | Laser |
| 5,627,641 A | 5/1997 | Mauchien et al. |
| 5,642,190 A | 6/1997 | Krupa et al. |
| 5,671,045 A | 9/1997 | Woskov et al. |
| 5,673,109 A | 9/1997 | Keilbach |
| 5,690,796 A * | 11/1997 | DuPont ............... C23C 14/5826 204/192.12 |
| 5,712,702 A | 1/1998 | Mcgahay et al. |
| 5,716,422 A | 2/1998 | Muffoletto et al. |
| 5,716,495 A | 2/1998 | Butterbaugh et al. |
| 5,731,872 A | 3/1998 | Falk |
| 5,733,662 A | 3/1998 | Bogachek |
| 5,748,297 A | 5/1998 | Suk et al. |
| 5,759,237 A | 6/1998 | Li et al. |
| 5,759,922 A | 6/1998 | Donohoe et al. |
| 5,781,289 A | 7/1998 | Sabsabi et al. |
| 5,786,886 A | 7/1998 | Litvak et al. |
| 5,818,040 A | 10/1998 | Kinoshita et al. |
| 5,834,656 A | 11/1998 | Seltzer |
| 5,858,238 A | 1/1999 | Mcrea et al. |
| 5,866,986 A | 2/1999 | Pennington |
| 5,885,402 A | 3/1999 | Esquibel |
| 5,888,337 A | 3/1999 | Saito |
| 5,888,591 A | 3/1999 | Gleason et al. |
| 5,896,196 A | 4/1999 | Pinnaduwage |
| 5,946,082 A | 8/1999 | Litvak et al. |
| 5,964,724 A | 10/1999 | Rivera et al. |
| 5,986,747 A | 11/1999 | Moran |
| 5,986,757 A | 11/1999 | Seltzer |
| 6,007,671 A | 12/1999 | Fujimura et al. |
| 6,008,896 A | 12/1999 | Sabsabi et al. |
| 6,008,897 A | 12/1999 | Sabsabi et al. |
| 6,045,618 A | 4/2000 | Raoux et al. |
| 6,060,328 A | 5/2000 | En et al. |
| 6,075,593 A | 6/2000 | Trantow et al. |
| 6,077,386 A | 6/2000 | Smith, Jr. et al. |
| 6,090,302 A | 7/2000 | Smith, Jr. et al. |
| 6,104,487 A | 8/2000 | Buck et al. |
| 6,117,243 A | 9/2000 | Walther |
| 6,123,983 A | 9/2000 | Smith, Jr. et al. |
| 6,124,211 A | 9/2000 | Butterbaugh et al. |
| 6,126,778 A | 10/2000 | Donohoe et al. |
| 6,132,577 A | 10/2000 | Smith, Jr. et al. |
| 6,134,005 A | 10/2000 | Smith, Jr. et al. |
| 6,153,269 A | 11/2000 | Gleason et al. |
| 6,156,435 A | 12/2000 | Gleason et al. |
| 6,157,447 A | 12/2000 | Smith, Jr. et al. |
| 6,165,312 A | 12/2000 | Smith, Jr. et al. |
| 6,169,933 B1 | 1/2001 | Smith, Jr. et al. |
| 6,187,072 B1 | 2/2001 | Cheung et al. |
| 6,192,826 B1 | 2/2001 | Smith, Jr. et al. |

(56) References Cited

U.S. PATENT DOCUMENTS

| | | |
|---|---|---|
| 6,193,802 B1 | 2/2001 | Pang et al. |
| 6,194,628 B1 | 2/2001 | Pang et al. |
| 6,221,679 B1 | 4/2001 | Smith, Jr. et al. |
| 6,223,755 B1 | 5/2001 | Smith, Jr. et al. |
| 6,228,330 B1 | 5/2001 | Herrmann et al. |
| 6,238,937 B1 | 5/2001 | Toprac et al. |
| 6,245,190 B1 * | 6/2001 | Masuda ............ H01J 37/32082 118/723 MA |
| 6,246,473 B1 | 6/2001 | Smith, Jr. et al. |
| 6,254,717 B1 | 7/2001 | Smith, Jr. et al. |
| 6,255,222 B1 | 7/2001 | Xia et al. |
| 6,261,470 B1 | 7/2001 | Smith, Jr. et al. |
| 6,269,278 B1 | 7/2001 | Smith, Jr. et al. |
| 6,275,740 B1 | 8/2001 | Smith, Jr. et al. |
| 6,277,347 B1 | 8/2001 | Stearns et al. |
| 6,282,222 B1 | 8/2001 | Wieser et al. |
| 6,309,978 B1 | 10/2001 | Donohoe et al. |
| 6,312,556 B1 | 11/2001 | Donohoe et al. |
| 6,316,045 B1 | 11/2001 | Bernard et al. |
| 6,321,587 B1 | 11/2001 | Laush |
| 6,322,660 B1 | 11/2001 | Mcfee et al. |
| 6,322,756 B1 | 11/2001 | Arno et al. |
| 6,326,584 B1 | 12/2001 | Jewett et al. |
| 6,358,359 B1 | 3/2002 | Peinador et al. |
| 6,358,362 B1 | 3/2002 | En et al. |
| 6,358,760 B1 | 3/2002 | Huang et al. |
| 6,361,706 B1 | 3/2002 | Gabriel |
| 6,367,412 B1 | 4/2002 | Ramaswamy et al. |
| 6,368,346 B1 | 4/2002 | Nowak et al. |
| 6,383,402 B1 | 5/2002 | Smith, Jr. et al. |
| 6,387,325 B1 | 5/2002 | Keusch et al. |
| 6,387,708 B2 | 5/2002 | Wardlaw |
| 6,392,351 B1 | 5/2002 | Shun'ko |
| 6,419,801 B1 | 7/2002 | Smith, Jr. et al. |
| 6,419,846 B1 | 7/2002 | Toprac et al. |
| 6,422,823 B2 | 7/2002 | Bernard et al. |
| 6,445,015 B1 | 9/2002 | Braddock |
| 6,455,108 B1 | 9/2002 | Muffoletto et al. |
| 6,466,309 B1 | 10/2002 | Kossakovski et al. |
| 6,475,175 B1 | 11/2002 | Rivera et al. |
| 6,487,003 B1 | 11/2002 | Suzuki et al. |
| 6,498,779 B1 | 12/2002 | Michaud et al. |
| 6,508,990 B1 * | 1/2003 | Yoshida ................ B08B 7/0035 134/1 |
| 6,517,913 B1 | 2/2003 | Cheung et al. |
| 6,534,007 B1 | 3/2003 | Blonigan et al. |
| 6,538,734 B2 | 3/2003 | Powell |
| 6,546,938 B2 | 4/2003 | Selwyn et al. |
| 6,564,114 B1 | 5/2003 | Toprac et al. |
| 6,576,573 B2 | 6/2003 | Arno |
| 6,582,618 B1 | 6/2003 | Toprac et al. |
| 6,592,817 B1 | 7/2003 | Tsai et al. |
| 6,620,394 B2 | 9/2003 | Uhm et al. |
| 6,635,229 B1 | 10/2003 | Lee et al. |
| 6,641,789 B1 | 11/2003 | Thomson et al. |
| 6,643,014 B2 | 11/2003 | Chevalier et al. |
| 6,644,324 B1 | 11/2003 | Watson et al. |
| 6,670,651 B1 | 12/2003 | Braddock |
| 6,673,323 B1 | 1/2004 | Bhatnagar et al. |
| 6,677,604 B2 | 1/2004 | Mitrovic |
| 6,686,594 B2 | 2/2004 | Ji et al. |
| 6,689,252 B1 | 2/2004 | Shamouilian et al. |
| 6,689,930 B1 | 2/2004 | Pang et al. |
| 6,700,660 B2 | 3/2004 | Sabsabi et al. |
| 6,729,850 B2 | 5/2004 | Dandl et al. |
| 6,741,345 B2 | 5/2004 | Sabsabi et al. |
| 6,745,095 B1 | 6/2004 | Ben-dov et al. |
| 6,750,449 B2 | 6/2004 | Marcus |
| 6,757,061 B2 | 6/2004 | Powell |
| 6,791,692 B2 | 9/2004 | Powell et al. |
| 6,797,939 B2 | 9/2004 | Bayer et al. |
| 6,808,439 B2 | 10/2004 | Uhm et al. |
| 6,815,362 B1 | 11/2004 | Wong et al. |
| 6,835,278 B2 | 12/2004 | Selbrede et al. |
| 6,841,263 B2 | 1/2005 | Anderson et al. |
| 6,841,924 B1 | 1/2005 | Skupien et al. |
| 6,855,119 B2 | 2/2005 | Rivera et al. |
| 6,861,101 B1 | 3/2005 | Kowalsky et al. |
| 6,867,859 B1 | 3/2005 | Powell |
| 6,876,447 B2 | 4/2005 | Fretel et al. |
| 6,881,278 B2 | 4/2005 | Blonigan et al. |
| 6,888,040 B1 | 5/2005 | Shufflebotham et al. |
| 6,897,616 B2 | 5/2005 | Dandl |
| 6,911,092 B2 | 6/2005 | Sneh |
| 6,914,927 B2 | 7/2005 | Watson et al. |
| 6,919,279 B1 | 7/2005 | Rulkens et al. |
| 6,930,049 B2 | 8/2005 | Huang et al. |
| 6,936,900 B1 | 8/2005 | Braddock, IV |
| 6,952,657 B2 | 10/2005 | Jahns et al. |
| 6,962,679 B2 | 11/2005 | Josephson et al. |
| 6,975,393 B2 | 12/2005 | Mettes |
| 6,979,308 B1 | 12/2005 | Macdonald et al. |
| 6,986,471 B1 | 1/2006 | Kowalsky et al. |
| 6,989,556 B2 | 1/2006 | Braddock et al. |
| 7,005,214 B2 | 2/2006 | Takeuchi et al. |
| 7,005,305 B2 | 2/2006 | Grasshoff et al. |
| 7,006,205 B2 | 2/2006 | Agarwal et al. |
| 7,017,514 B1 | 3/2006 | Shepherd, Jr. et al. |
| 7,019,829 B2 | 3/2006 | Powell et al. |
| 7,021,903 B2 | 4/2006 | Bailey et al. |
| 7,045,172 B2 | 5/2006 | Taylor et al. |
| 7,053,994 B2 | 5/2006 | Mcmillin et al. |
| 7,072,028 B2 | 7/2006 | Powell et al. |
| 7,101,805 B2 | 9/2006 | Johnson et al. |
| 7,123,361 B1 | 10/2006 | Doughty |
| 7,160,521 B2 | 1/2007 | Porshnev et al. |
| 7,187,045 B2 | 3/2007 | Braddock |
| 7,190,037 B2 | 3/2007 | Braddock, IV et al. |
| 7,202,946 B2 | 4/2007 | Powell et al. |
| 7,217,371 B2 | 5/2007 | Litvak |
| 7,355,171 B2 | 4/2008 | Ludviksson |
| 2001/0003572 A1 | 6/2001 | Bernard et al. |
| 2001/0033808 A1 | 10/2001 | Wardlaw |
| 2002/0020429 A1 | 2/2002 | Selbrede et al. |
| 2002/0025685 A1 | 2/2002 | Huang et al. |
| 2002/0092618 A1 | 7/2002 | Collins |
| 2002/0134403 A1 | 9/2002 | Selwyn et al. |
| 2002/0135761 A1 | 9/2002 | Powell et al. |
| 2002/0139925 A1 | 10/2002 | Mitrovic |
| 2002/0159059 A1 | 10/2002 | Sabsabi et al. |
| 2002/0177799 A1 | 11/2002 | Rivera et al. |
| 2003/0052259 A1 | 3/2003 | Bayer et al. |
| 2003/0098419 A1 | 5/2003 | Ji et al. |
| 2003/0124427 A1 | 7/2003 | Takeuchi et al. |
| 2003/0133106 A1 | 7/2003 | Powell |
| 2003/0159711 A1 | 8/2003 | Blonigan et al. |
| 2003/0160956 A1 | 8/2003 | Chevalier et al. |
| 2003/0180458 A1 | 9/2003 | Sneh |
| 2003/0207145 A1 | 11/2003 | Anderson et al. |
| 2003/0223055 A1 | 12/2003 | Agarwal et al. |
| 2003/0234616 A1 | 12/2003 | Dandl |
| 2004/0001787 A1 | 1/2004 | Porshnev et al. |
| 2004/0104682 A1 * | 6/2004 | Horsky ................ H01J 27/205 315/111.81 |
| 2004/0106284 A1 | 6/2004 | Grasshoff et al. |
| 2004/0206979 A1 | 10/2004 | Braddock |
| 2004/0207029 A1 | 10/2004 | Braddock |
| 2004/0235299 A1 | 11/2004 | Srivastava et al. |
| 2004/0238123 A1 | 12/2004 | Becknell et al. |
| 2004/0238489 A1 | 12/2004 | Johnson et al. |
| 2005/0030531 A1 | 2/2005 | Powell et al. |
| 2005/0046825 A1 | 3/2005 | Powell et al. |
| 2005/0055175 A1 | 3/2005 | Jahns et al. |
| 2005/0155854 A1 | 7/2005 | Shufflebotham et al. |
| 2005/0190363 A1 | 9/2005 | Sogan et al. |
| 2005/0190364 A1 | 9/2005 | Sogan et al. |
| 2005/0221617 A1 | 10/2005 | Rueger |
| 2005/0260837 A1 | 11/2005 | Walther et al. |
| 2006/0087644 A1 | 4/2006 | Mcmillin et al. |
| 2006/0219938 A1 | 10/2006 | Huang |

(56) References Cited

U.S. PATENT DOCUMENTS

2006/0228815 A1    10/2006    Rueger
2007/0064227 A1    3/2007    Powell et al.

FOREIGN PATENT DOCUMENTS

JP    58084431 A1    5/1983
JP    58-84431    5/1999

OTHER PUBLICATIONS

Hara, Nobuyoshi Mukuhara, Shingo Ohtomo, Katsuhisa Shimizu,Yasufumi and Sugimoto, Katsuhisa "Corrosion Behavior of Stainless Steel and Aluminum in a Downstream Environment of CF$.O2 Microwave Plasma," Journal of The ElectroChemical Society, 149 (7) B297-6305 (2002).

Macgregor, S. J. Woolsey, G. A. Ogle, D. B. Farish, O."The Influence of Electrode-Fluorine Reactions on Corona and Glow Discharges in SF6," IEEE transactions on plasma science, vol. PS-14, No. 4, p. 538.

Michael E. Rybak1, Eric D. Salin, Development and characterization of induction heating_electrothermal vaporizationžIH-ETV/ sample introduction for inductively coupled plasma spectrometry, Spectrochimica Acta Part B: Atomic Spectroscopy 56(2001)289-307.

E.Chevalier , P.Maquin, An innovative integrated plasma tool for process and exhaust monitoring, Part of the SPIE Conference on In-Line Methods and Monitors for Process and Yield Improvement 88 Santa Clara, California, Sep. 1999 SPIE vol. pp. 88-94.

S. Greenfield, Plasma Spectroscopy Cones of Age, Pure & Appi. Chem., vol. 52, pp. 2509-2523 (1980).

S. Greenfield, Plasma Spectroscopy Cones of Age, *Analyst*, Nov. 1980, vol. 105, 1032-1044.

Guber, A.E. and Kohler, Spectroscopy for the Analysis of Selected Exhaust Gas Flows in Silicon Technology, Journal of Molecular Structure 348 (1995) 209-2 12.

Hirobe, Kadou and Tsuchimoto, Takashi, J. Electrochem, End Point Detection in Plasma Etching by Optical Emission Spectroscopy, Soc.: Solid-State Science and Technology, pp. 234-235(1990).

Hitchman, M. L. and Eichenberger, V. A simple method of end-point determination for plasma etching, J. Vac. Sci. Technol., 17(6), pp. 1378-1381 (1980).

Houk, R. S. and Thompson, Joseph J. Inductively coupled plasma mass spectrometry, Mass Spectrometry Reviews, 7, pp. 425-461(1988).

Pruette, Laura Karecki, Simon Chatterjee, Ritwik and Reif, Rafael, High density plasma oxide etching using nitrogen trifluoride and acetylene, J. Vac. Sci. Technol. A 18(6), pp. 2749-2759(2000).

Kirschner, Stefan Golloch, Alfred and Telghedert, Ursula, First Investigations for the Development of a Microwave-induced Plasma Atomic Emission Spectrometry System to Determine Trace Metals in Gases, Journal of Analytical Atomic Spectrometry, Vol. 9, pp. 971-974 (1994).

Monahan, Kevin M., Summary Abstract: High-contrast end point detection and plasma diagnostics for the polysilicon/oxide interface, J. Vac. Sci. Technol. A 2 (2), pp. 485-487(1984).

Pearton, Stephen J. Norton, David P. Dry Etching of Electronic Oxides, Polymers, and Semiconductors, Plasma Process. Polym., 2, 16-37(20050.

Poulsen, R. G., Plasma etching in integrated circuit manufacture—A review, J. Vae. Sci. Technol., vol. 14, No. 1,. pp. 266-274(1977).

Roland, James P. Marcoux, Paul. J. Ray, Gary W. and Rankin, Glenn H. Endpoint detection in plasma etching, J. Vac. Sci. Technol. A 3 (3), 631-637(1985).

Mohindra, Vivek Chae, Heeyeop Sawin, Herbert H. and Mocella, Michael T., Abatement of Perfluorocompounds (PFC's) in a Microwave Tubular Reactor using O2 as an Additive Gas, IEEE Transactions on Semiconductor Manufacturing, vol. 10, No. 3, pp. 399-411 (1997).

Woskov, P. P. Rhee, D. Y. Thomas, P. Cohn, D. R. Surma, J. E. and Titus, C. H., Microwave plasma continuous emissions monitor for trace-metals in furnace exhaust, Rev. Sci. Instrum. 67 (10), pp. 3700-3708(1996).

\* cited by examiner

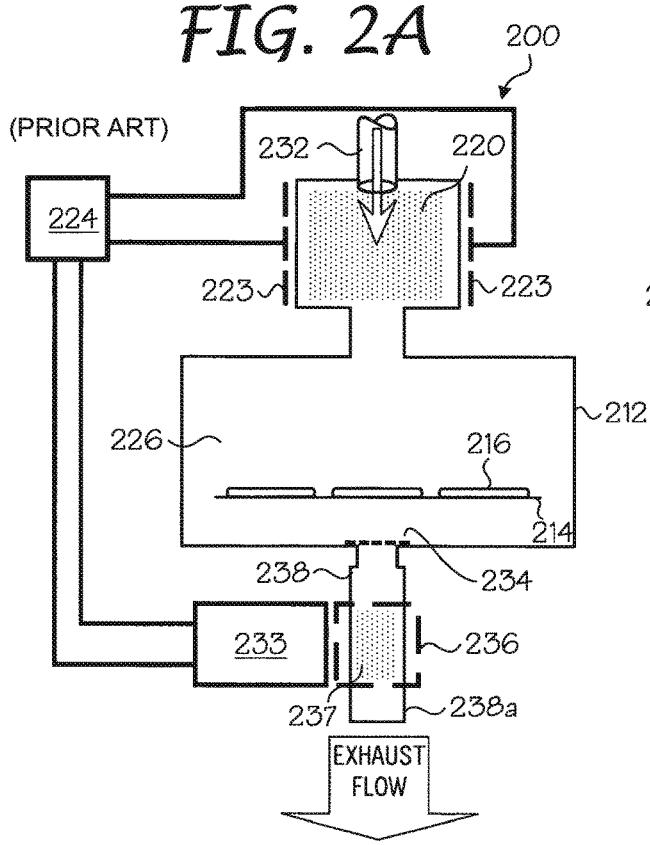
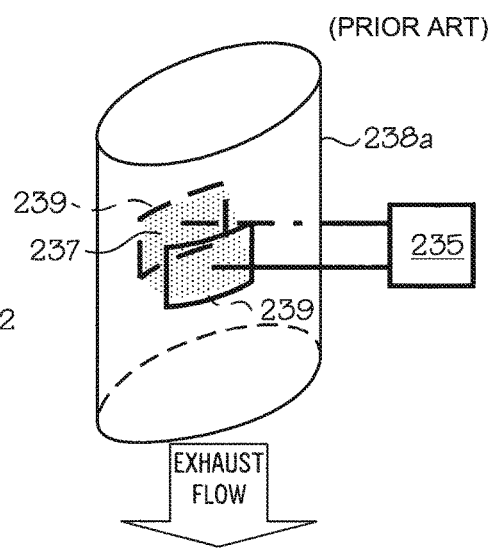
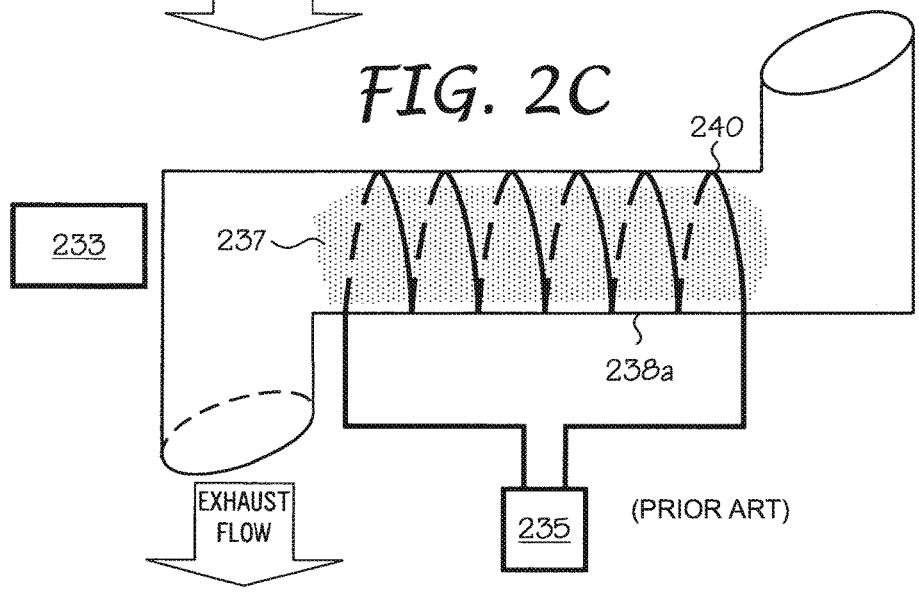

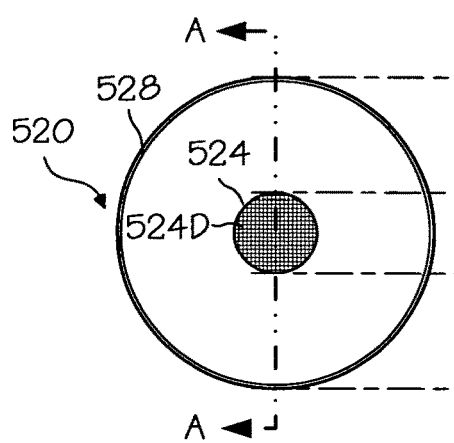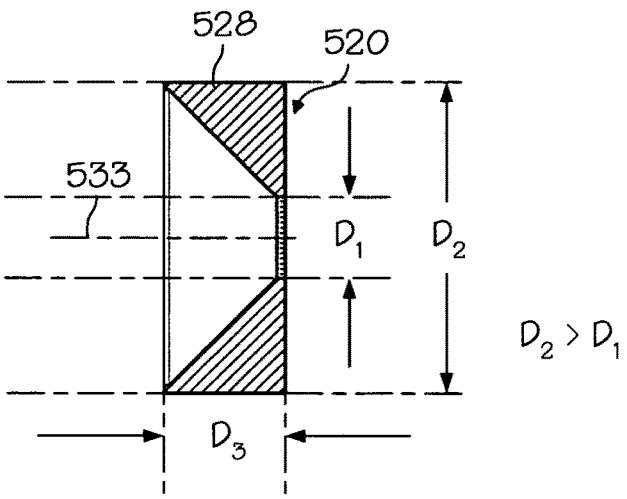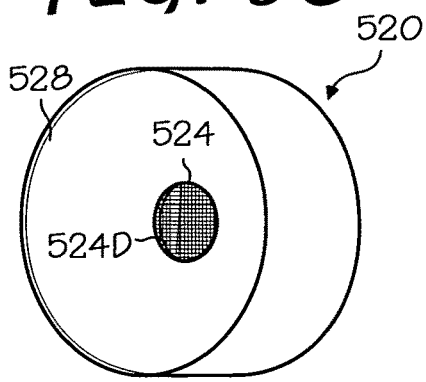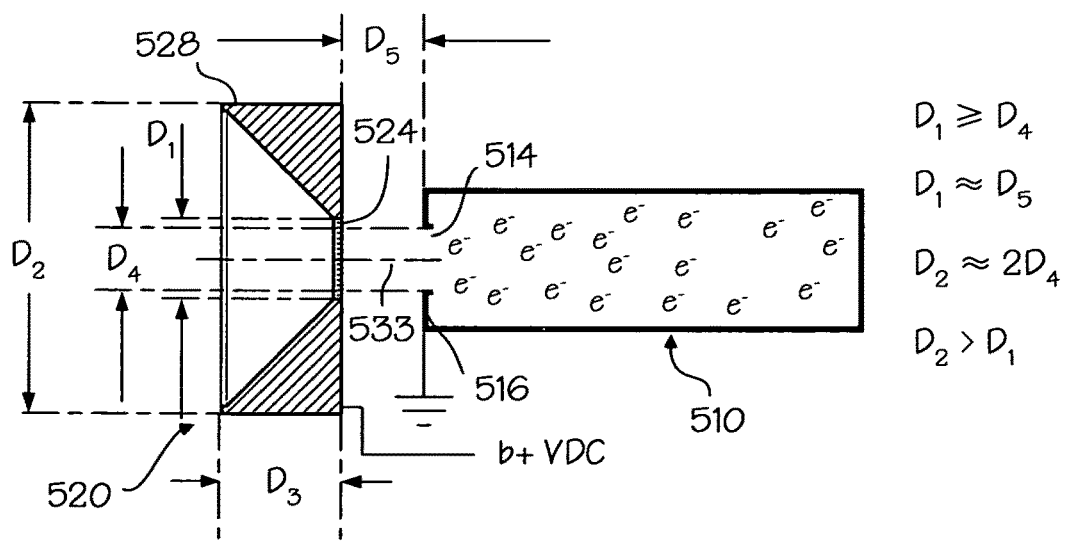

Electron Beam Extraction from an ICP Electron Source

Improved ICP Electron Source

Electron Beam Extraction from
a Hollow Cathode Electron Source

Electron Beam Extraction from a Field Emitter Array Electron Source

Electron Beam Extraction from a Hot Cathode Electron Source

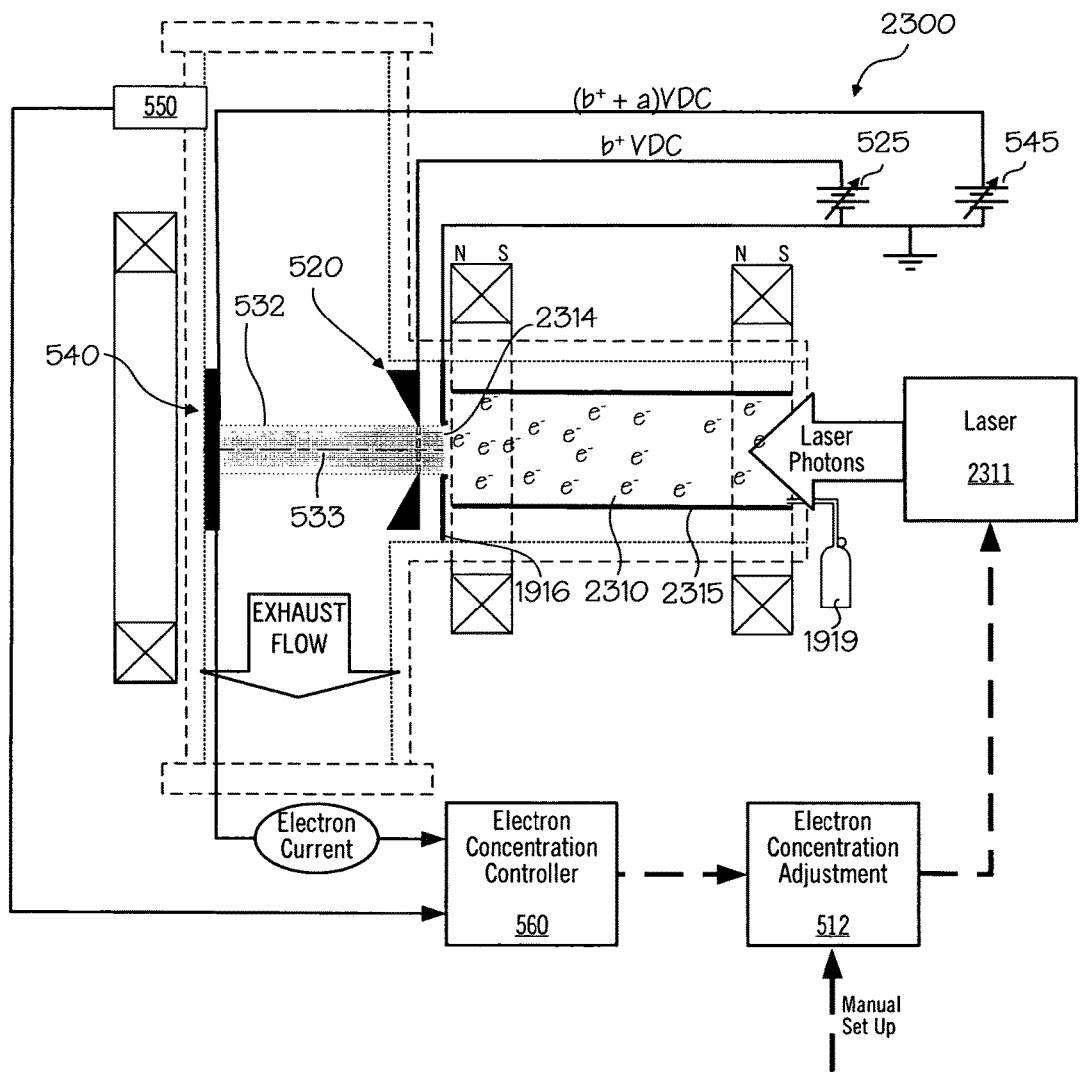

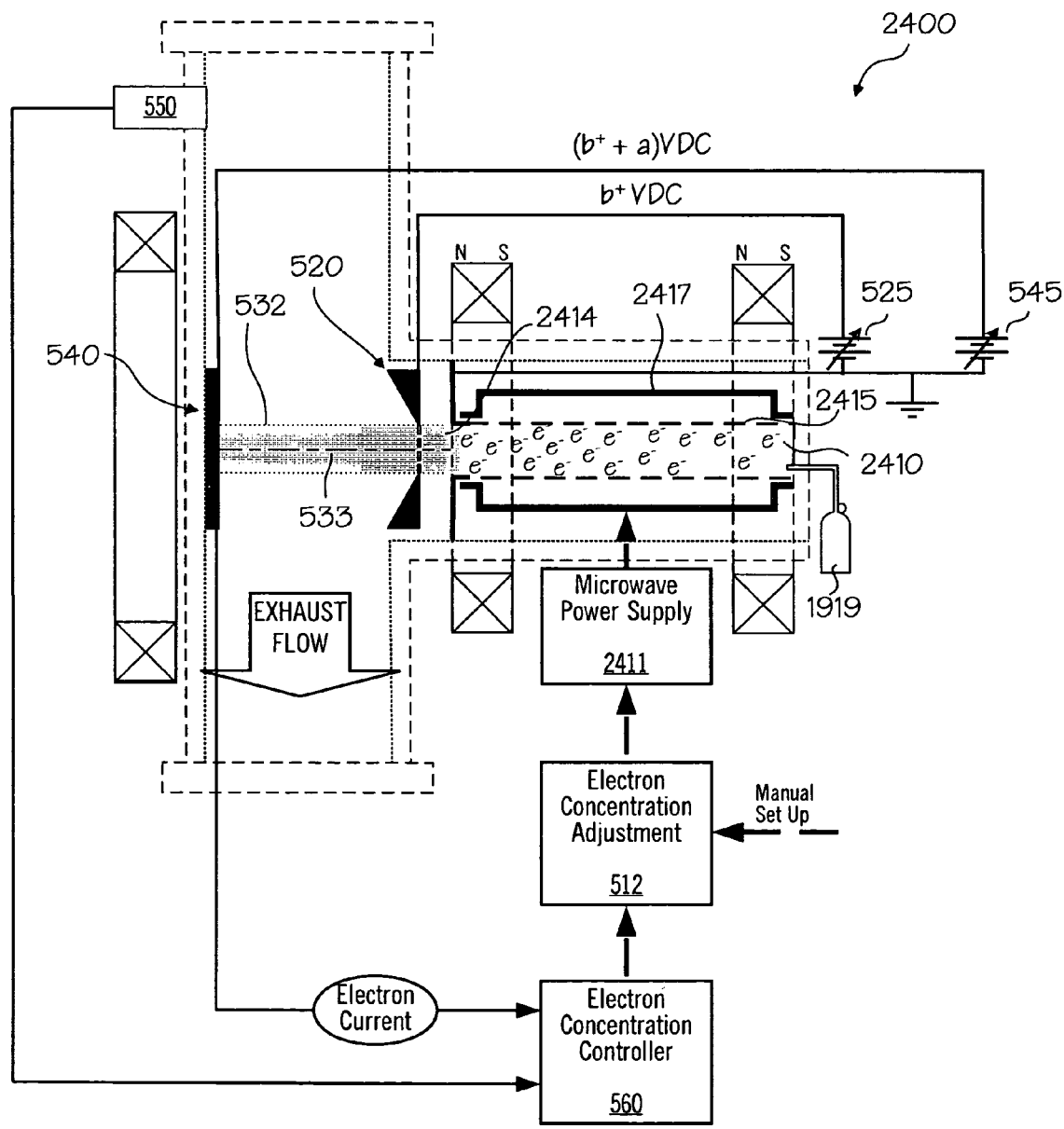

Continuous (CW) Operating Mode

Pulsed Operating Mode

Pulsed Operating Mode with Variable Extractor Voltage and Electron Source Power

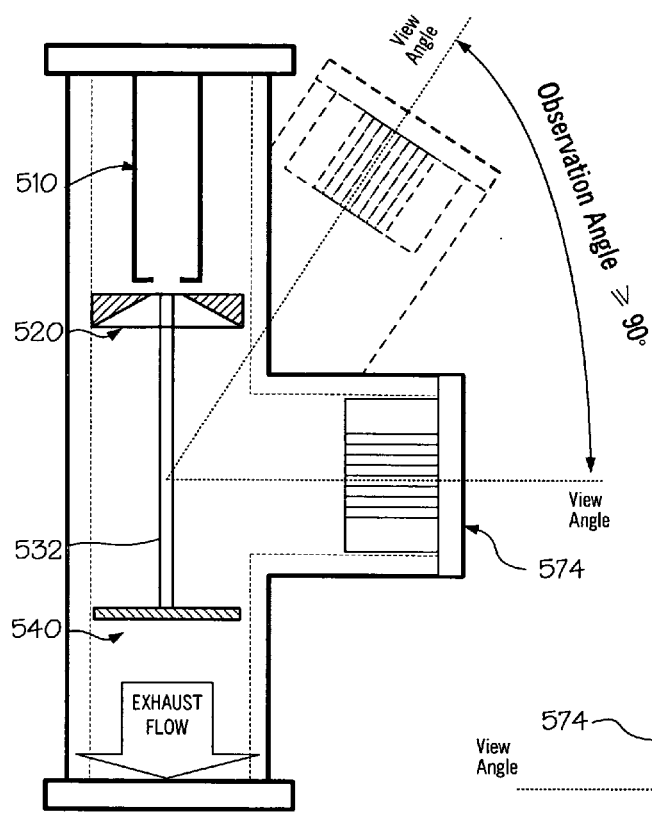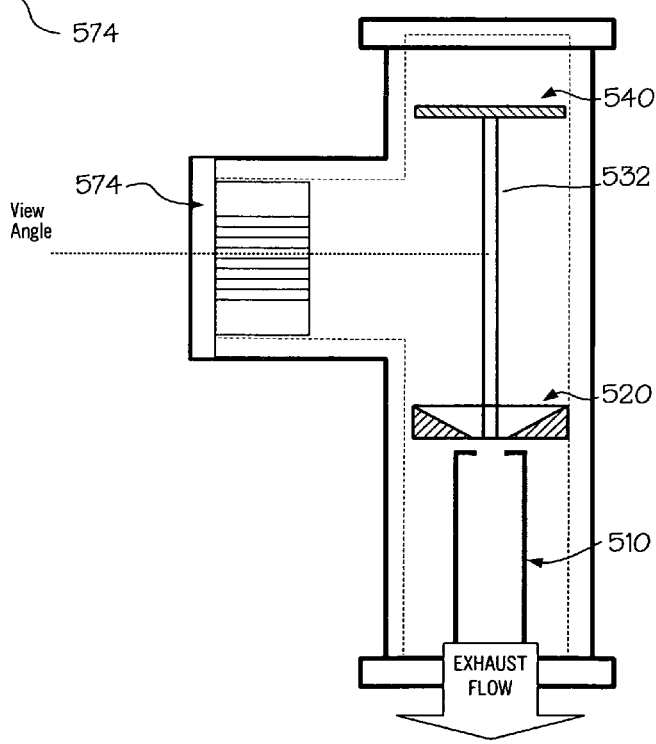

Grotian Diagram for Argon

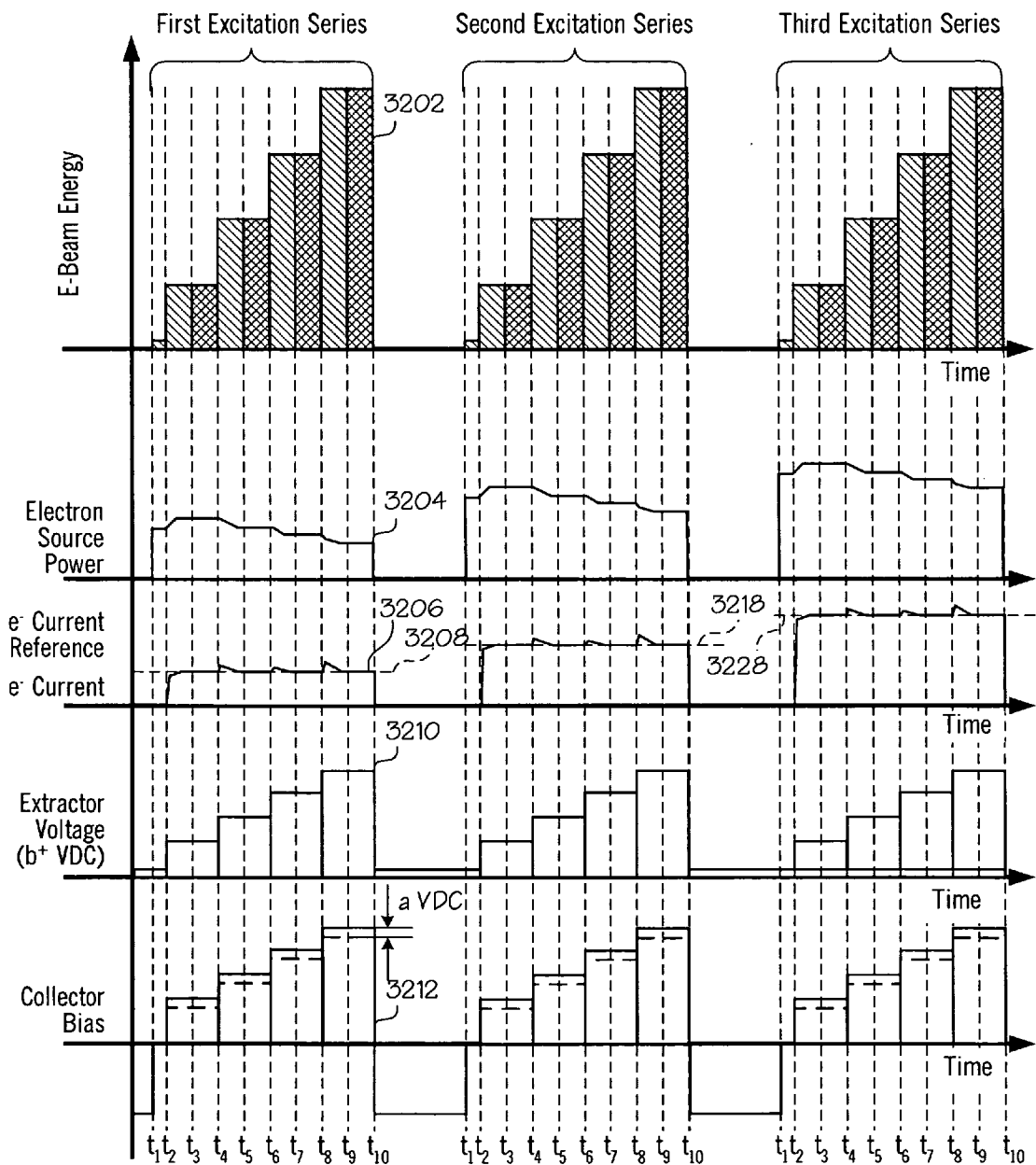

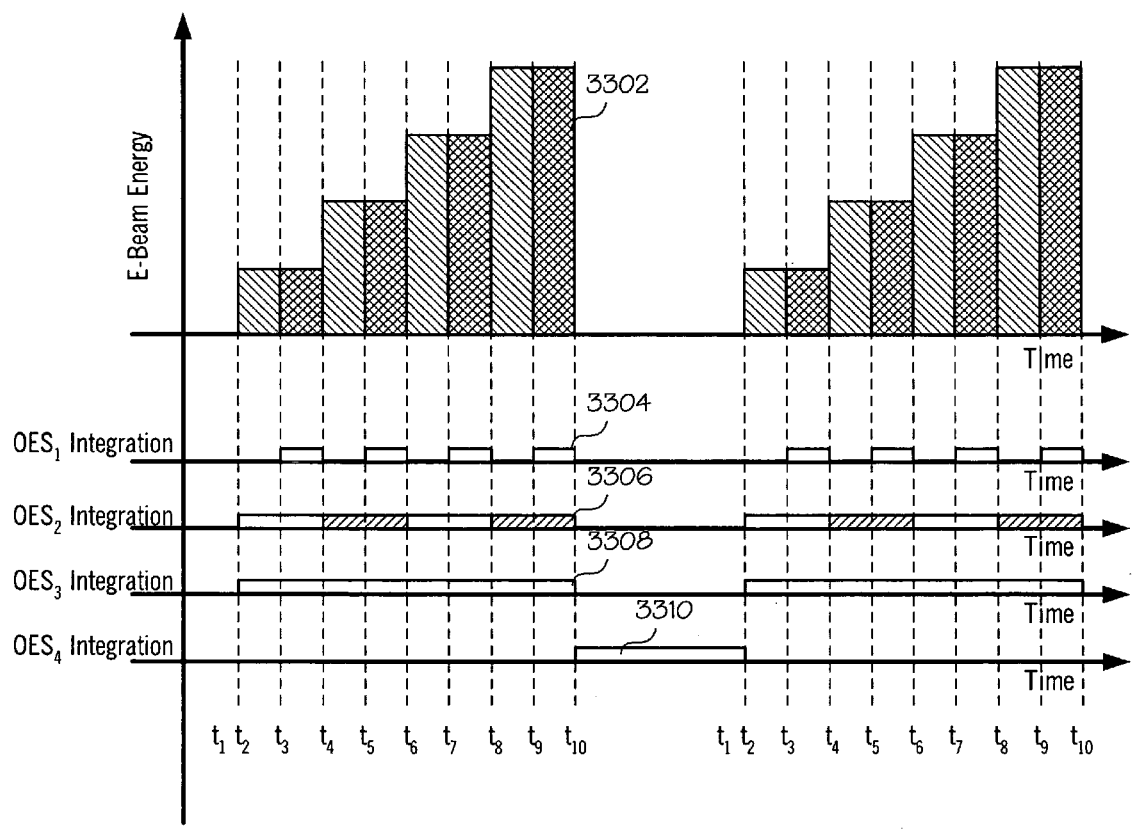

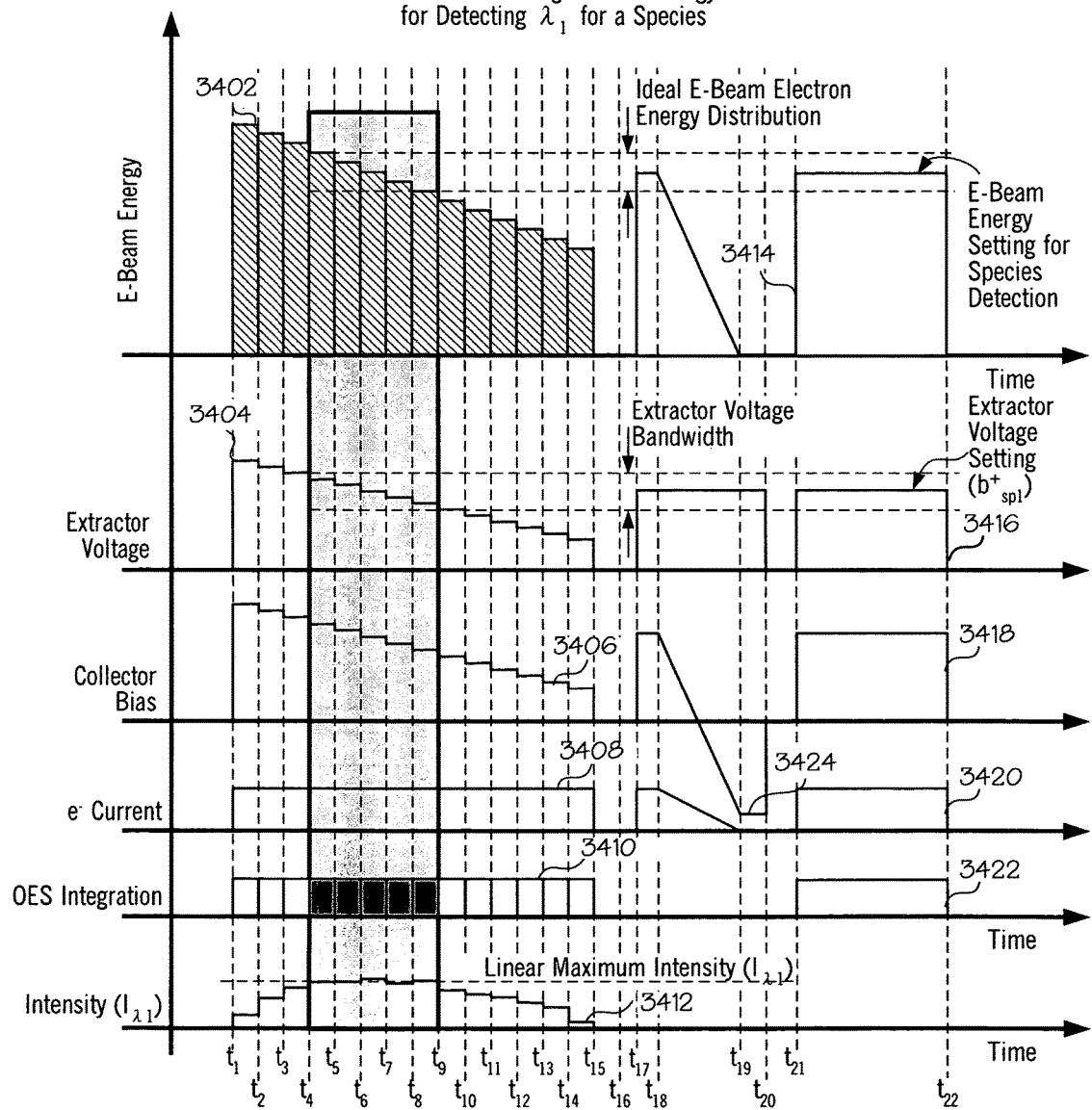

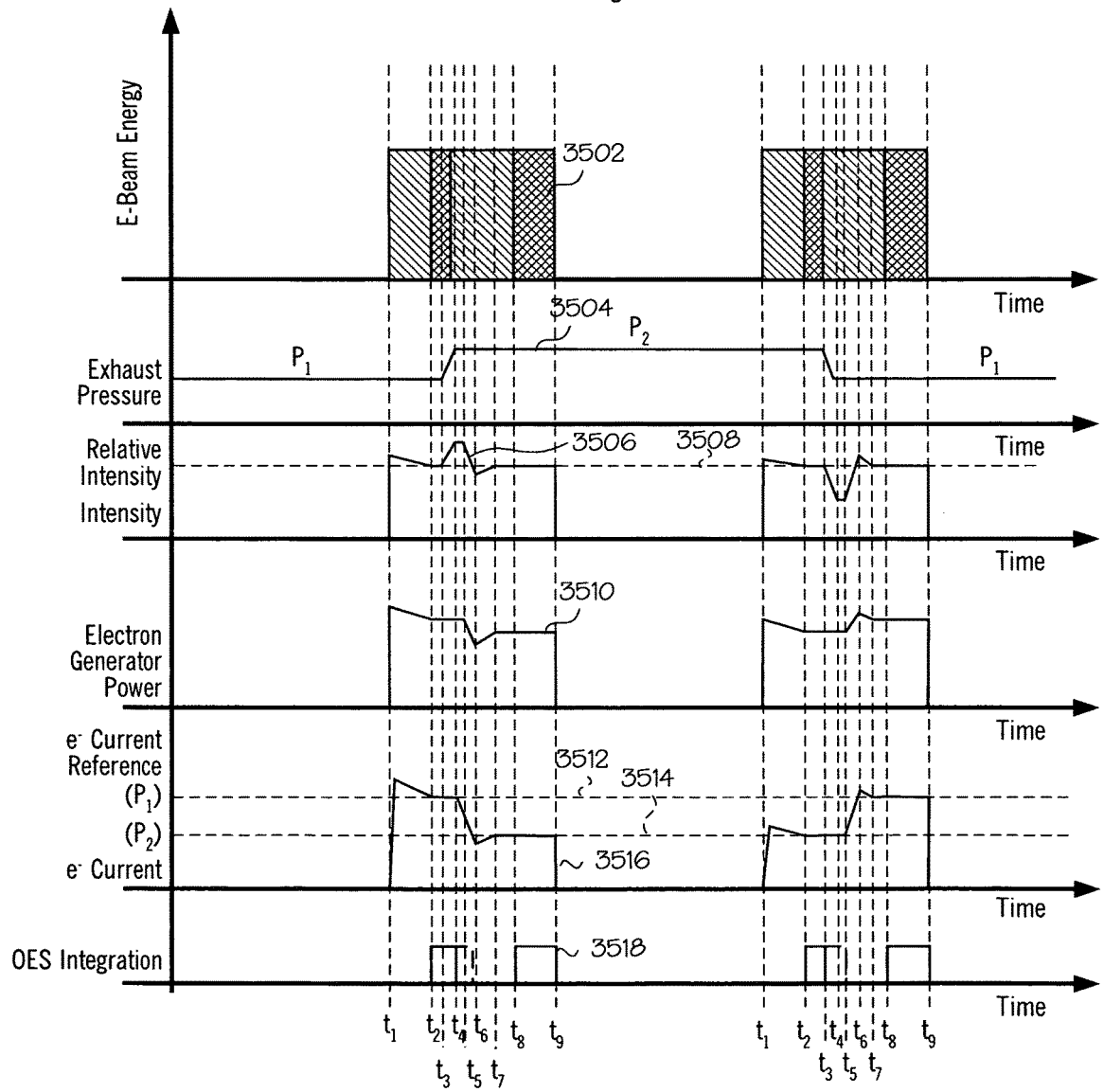

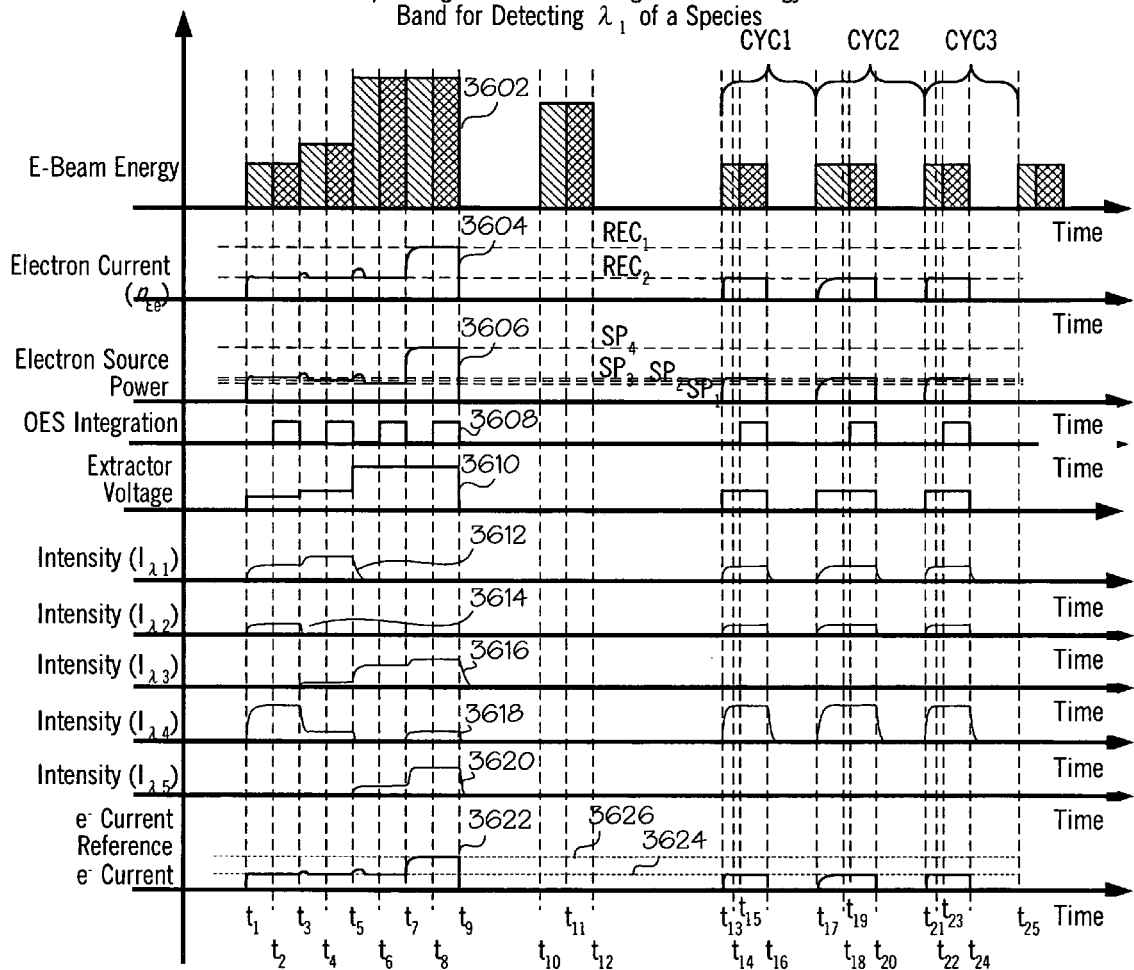

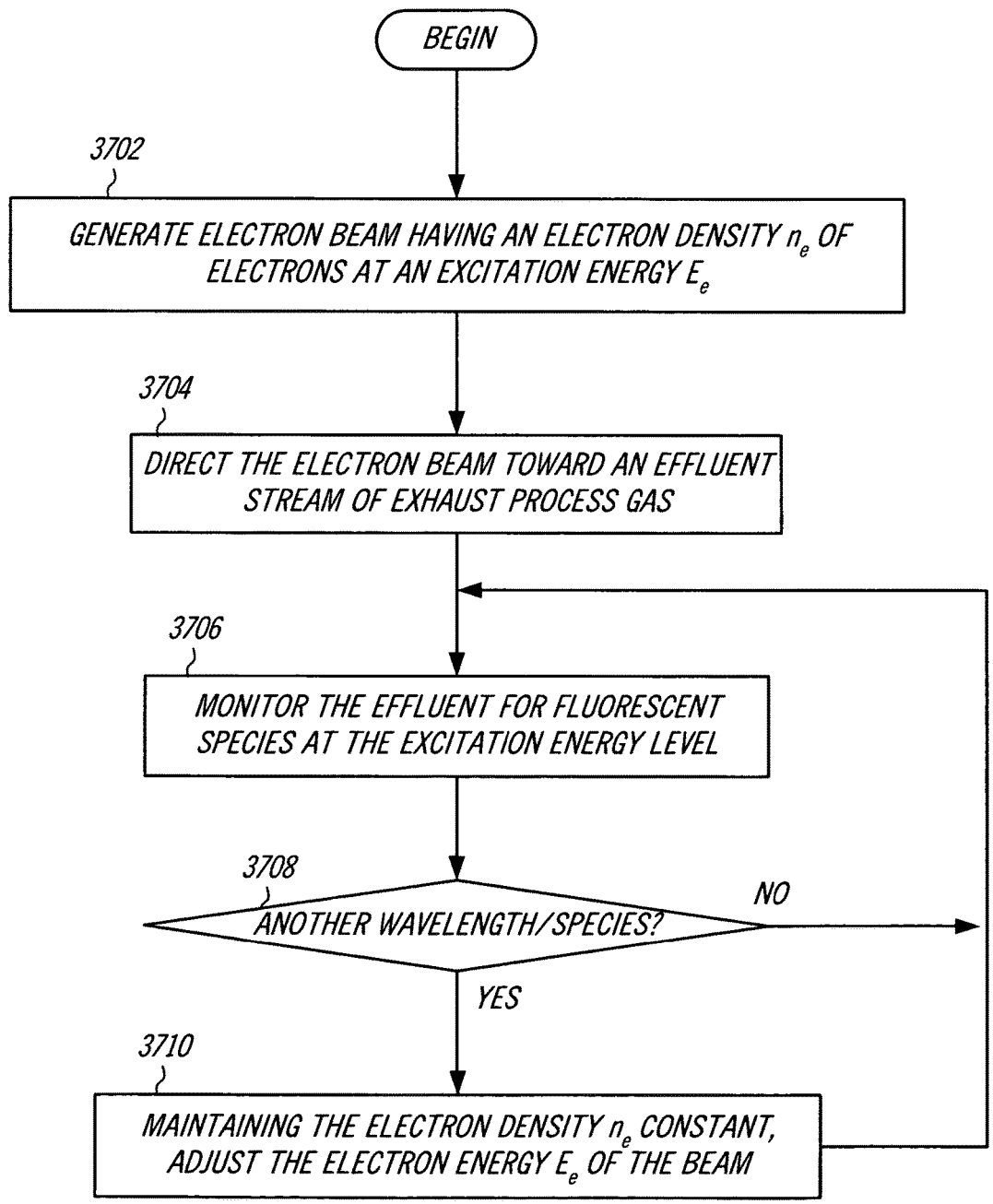

EXCITER SETUP FOR DETECTING WAVELENGTH $\lambda_1$ OF AN EXCITED SPECIES

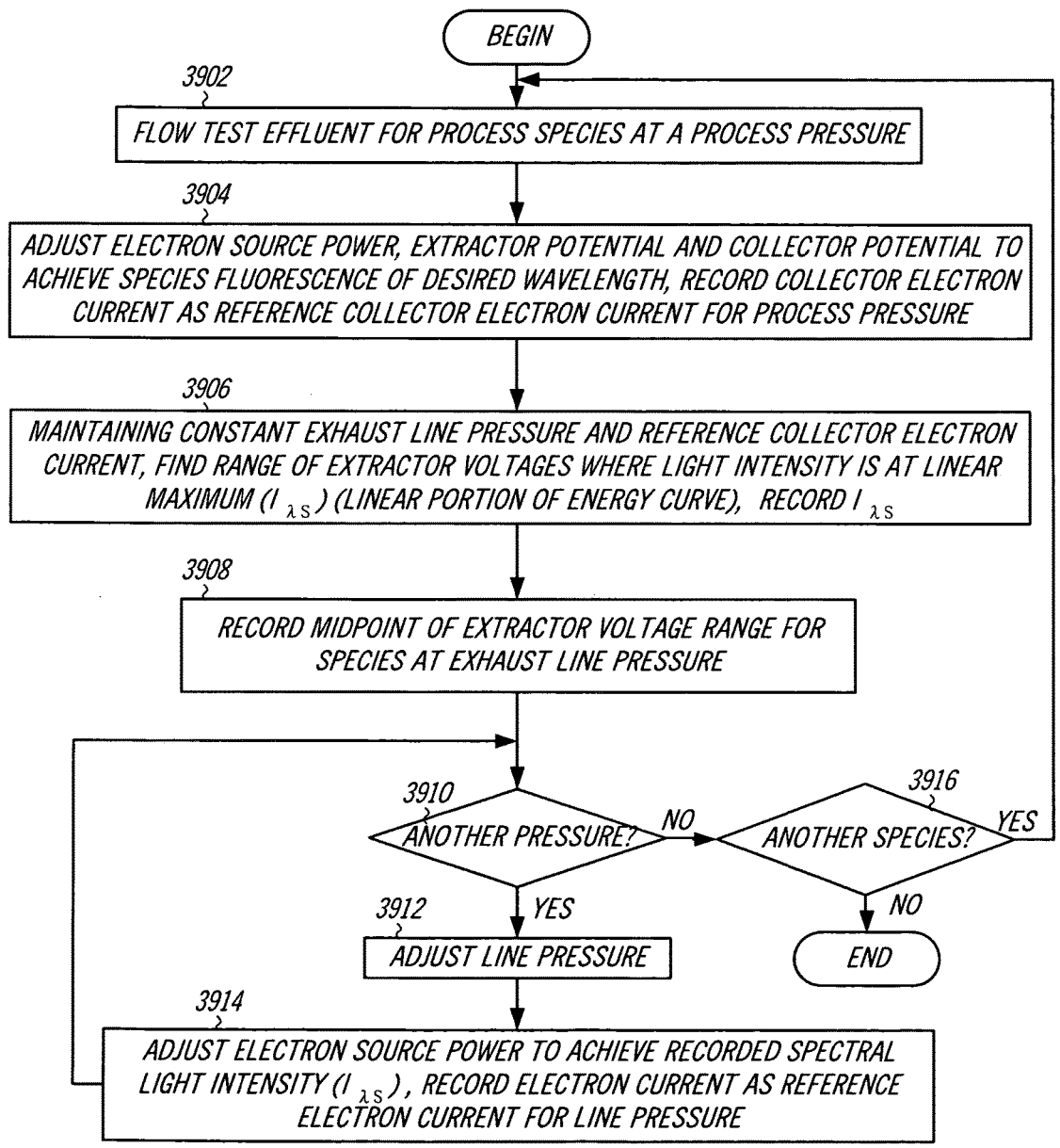

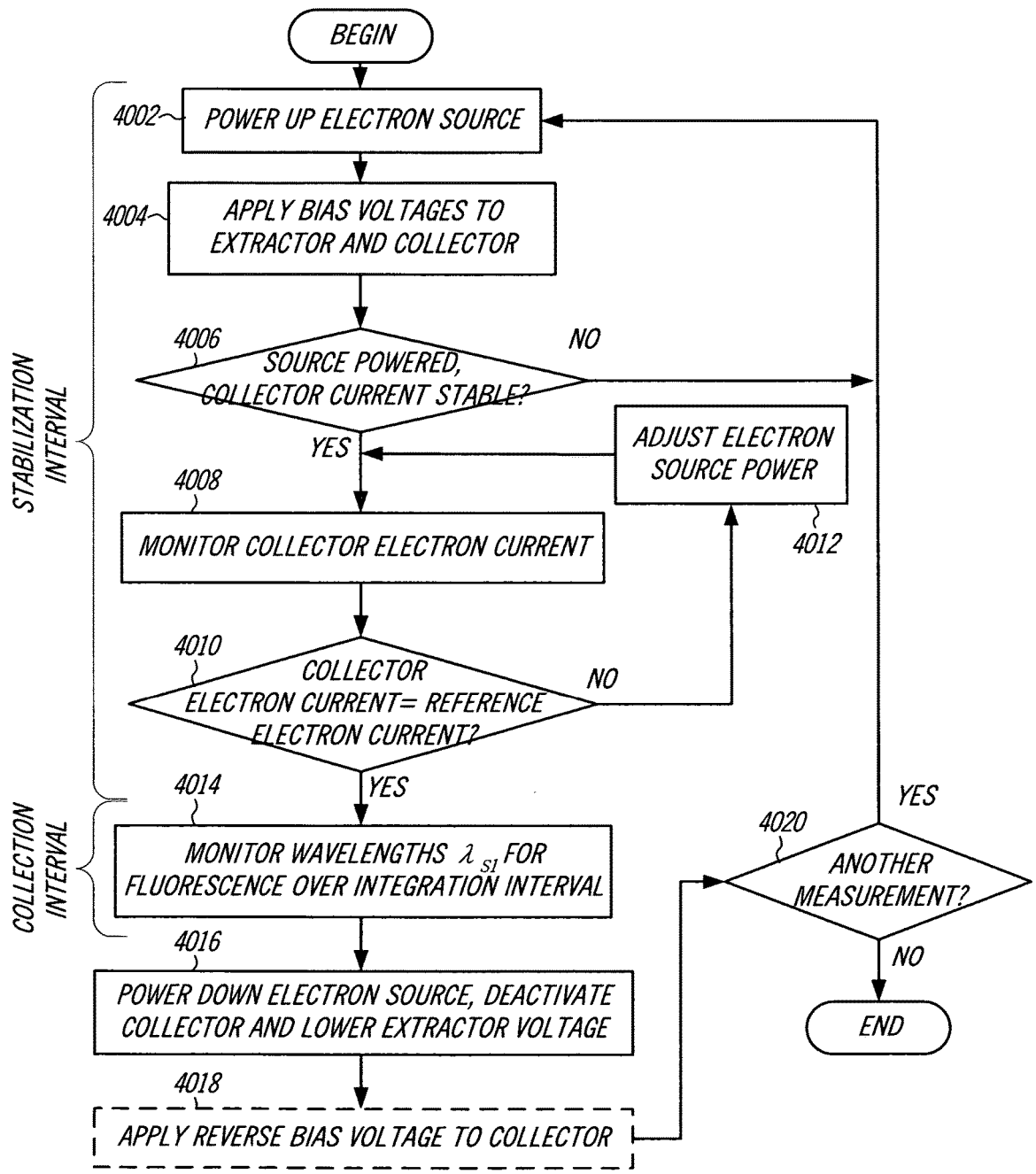

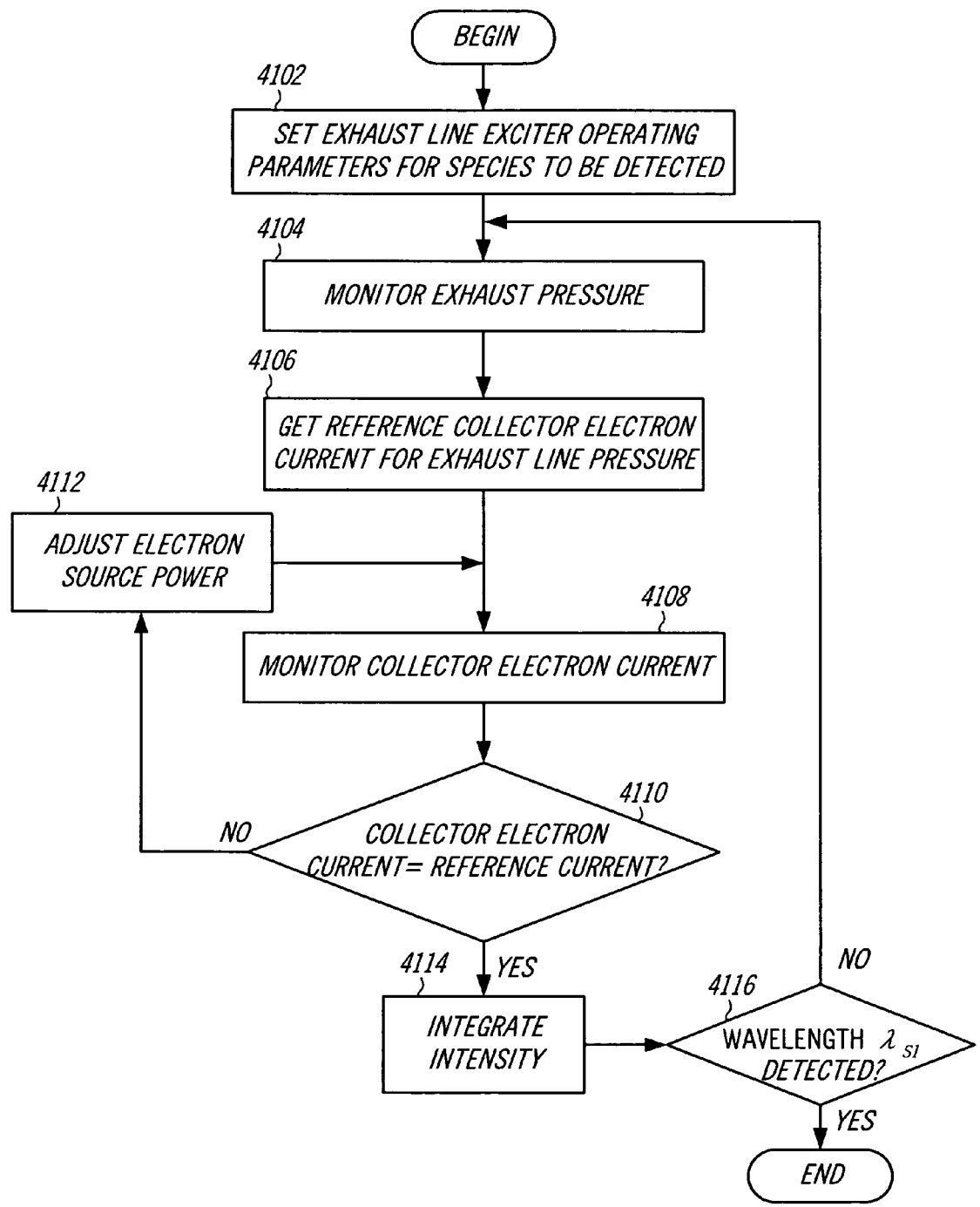

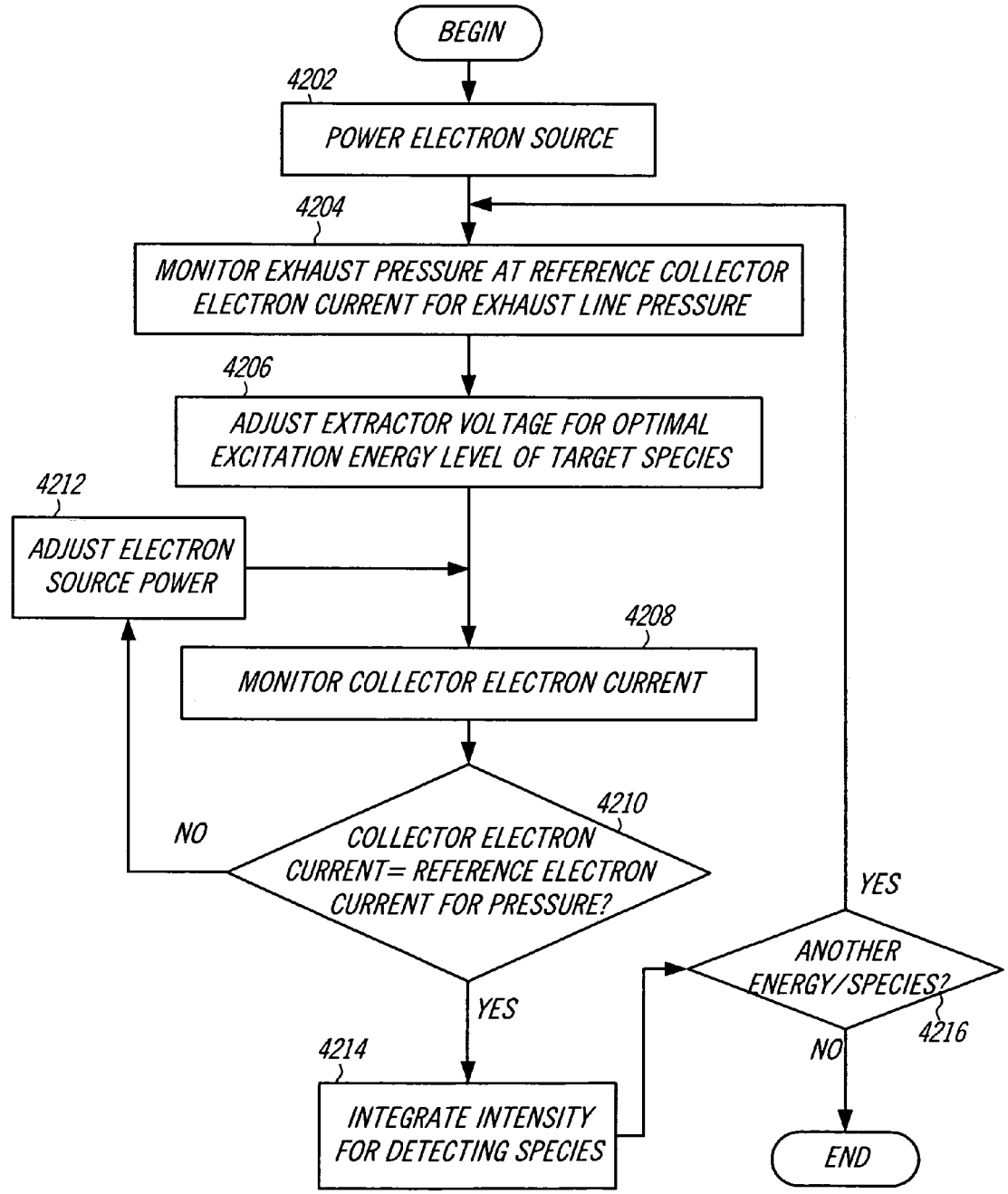

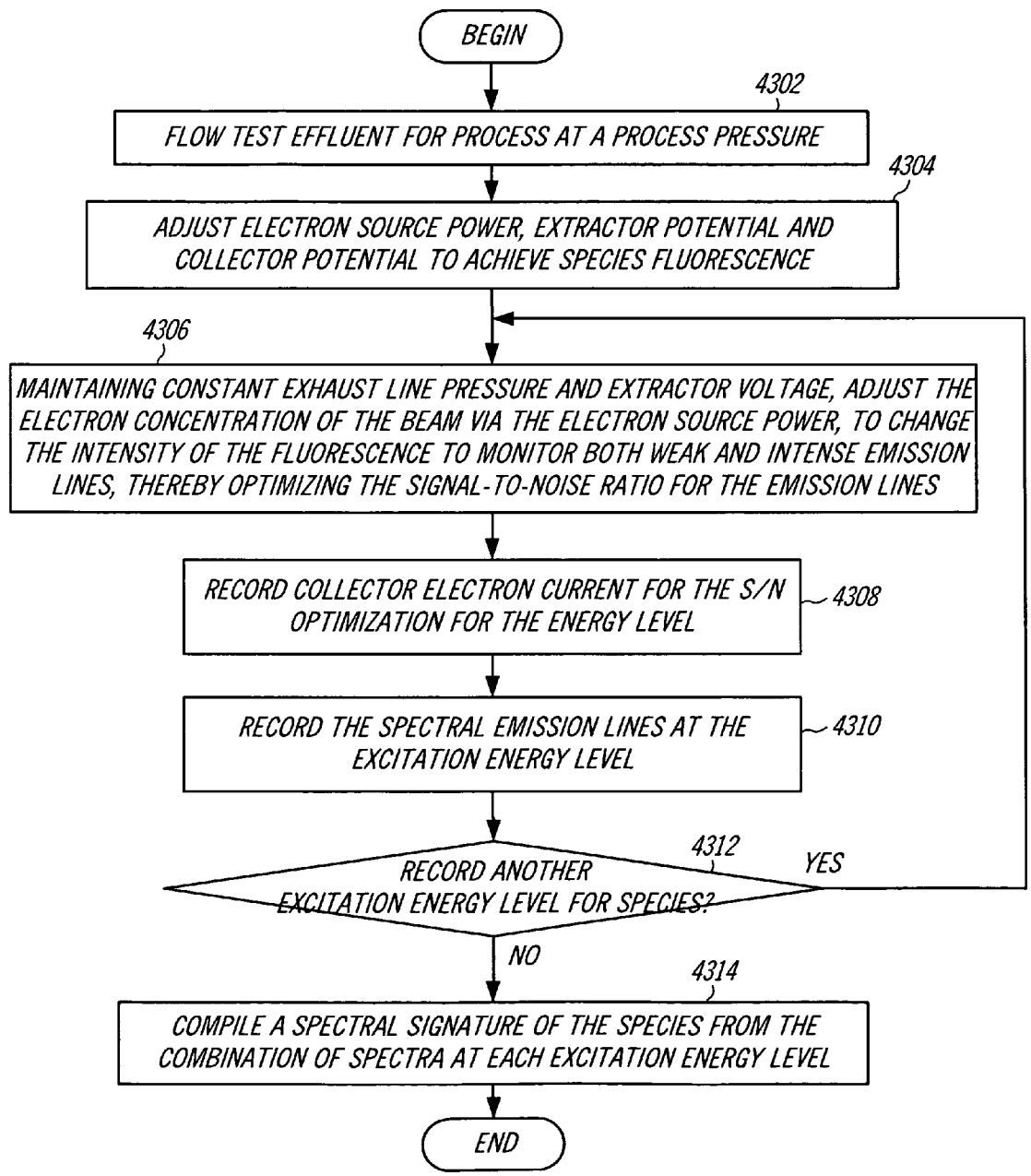

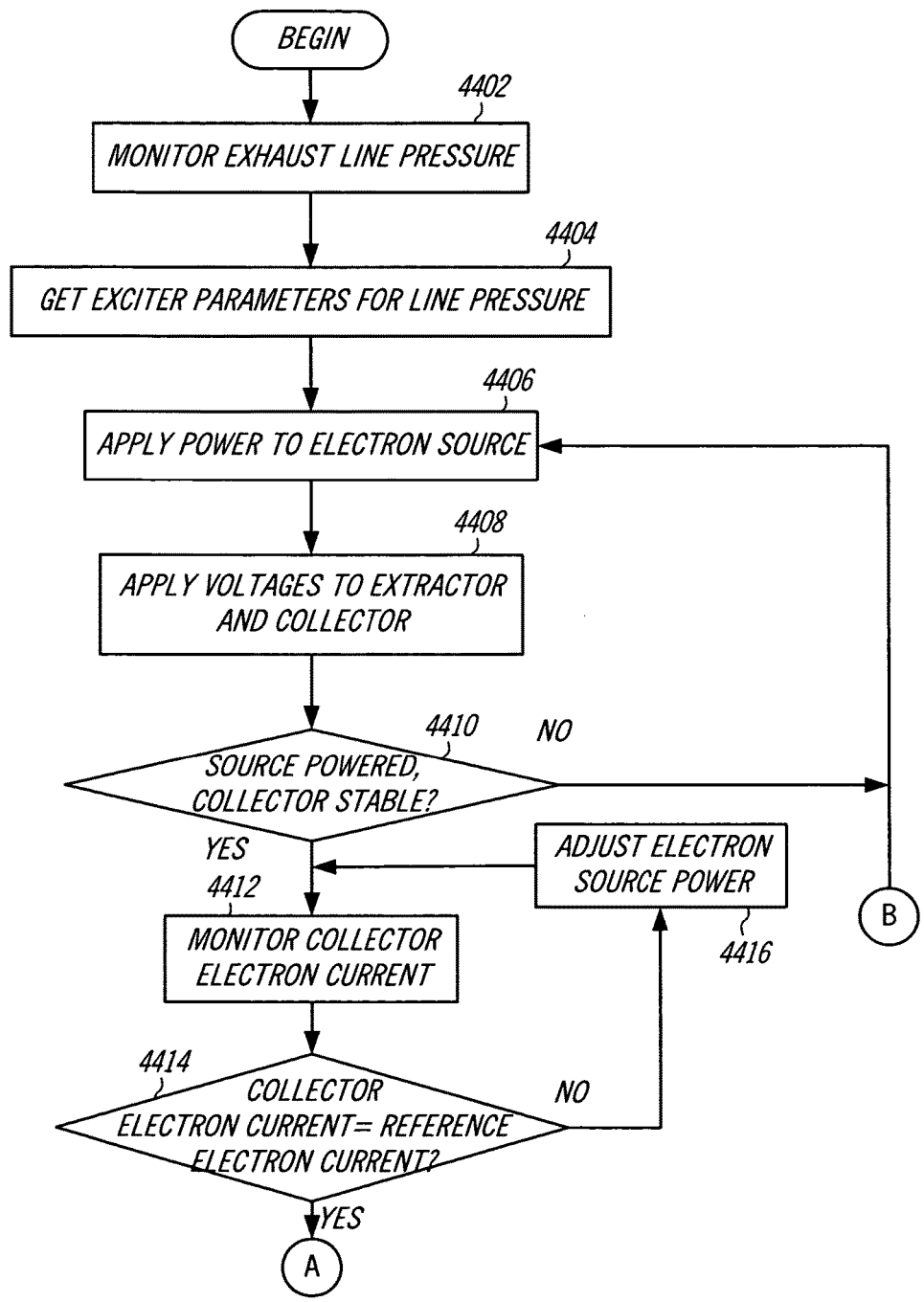

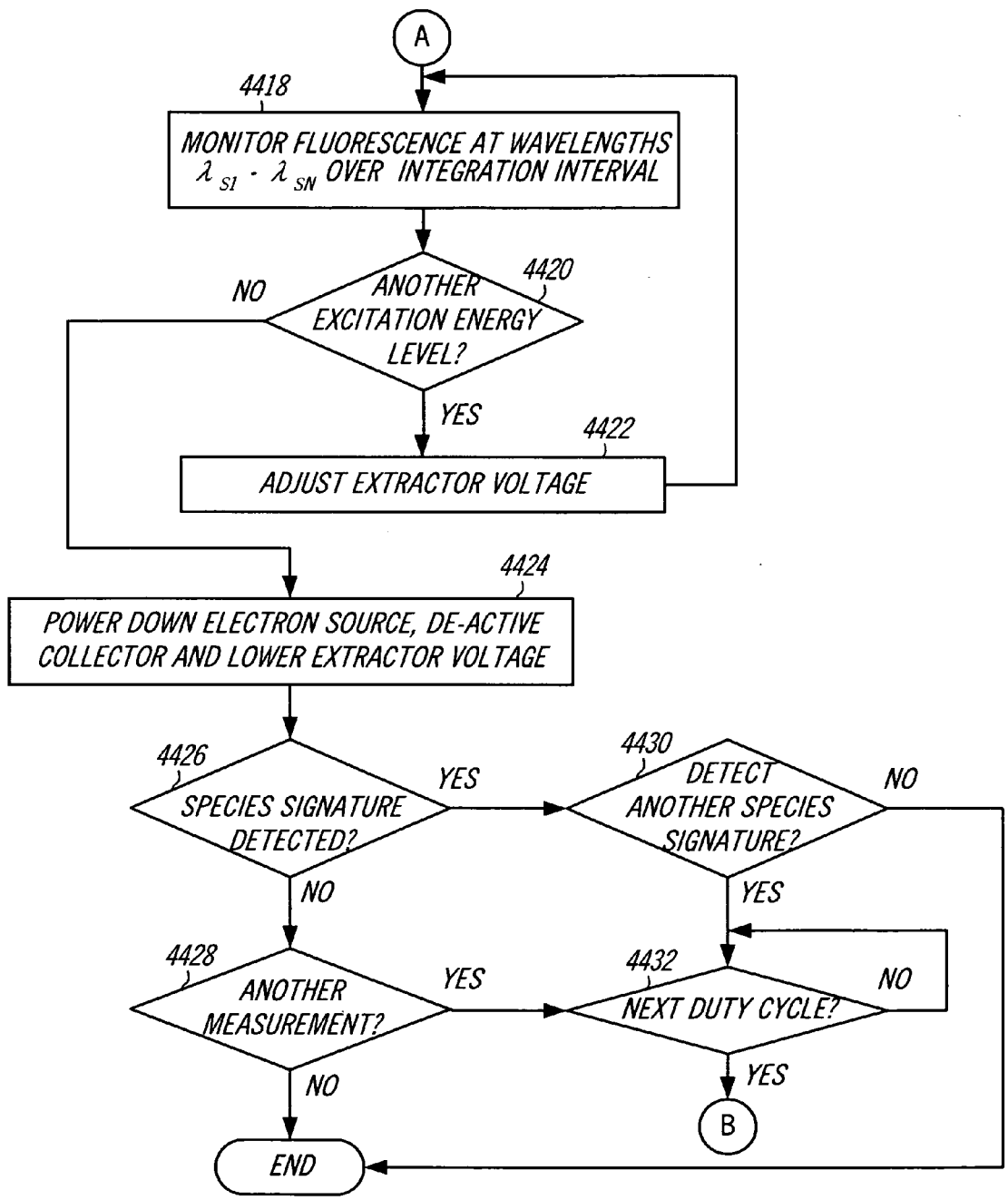

ELECTRON BEAM EXCITER FOR USE IN CHEMICAL ANALYSIS IN PROCESSING SYSTEMS

CROSS-REFERENCE TO RELATED APPLICATION

This application is related to and claims the benefit of U.S. Provisional Application Ser. No. 61/135,163, filed on Jul. 17, 2008 and entitled "Electron Beam Exciter for Use in Chemical Analysis in Processing Systems," and U.S. Provisional Application Ser. No. 61/271,060, filed on Jul. 15, 2009 and entitled "Electron Beam Exciter for Use in Chemical Analysis in Processing Systems," which are each incorporated herein by reference.

BACKGROUND OF THE INVENTION

The present invention relates generally to an apparatus for producing fluorescence in the gases from a reactor chamber.

Optical emission spectroscopy (OES) endpoint detection relies on the change in intensity of light emitted from the gas species involved with the etch process. During steady-state etching of the etch layer, the reactant gases and reaction gas products are excited by the plasma causing fluorescence of light at wavelengths characteristic of those species. When the etch layer is exhausted, the consumption rate of reactant gases and production rate of effluent gases change. Those changes cause the intensity of light from one or more emission wavelengths to change. Monitoring those wavelengths and appropriately combining the signal changes produce the familiar OES endpoint trend plot that is used to signal the end of the process step. Recent new plasma etch processes have been encountered in which this traditional monitoring method is failing to detect the endpoint. There seems to be at least two reasons for this failure.

"Remote plasma" processes use a plasma upstream of the location at which the etch process is to occur. The chemically activated species flow into the process chamber and successfully remove deposition films from every surface in the deposition chamber. However, neither the reactive species nor the effluents of the etch process are excited into high enough energy state(s) needed to produce fluorescence. The absence of fluorescence in the reaction chamber is the reason these "dark plasma" processes fail to produce a traditional OES endpoint.

Low energy plasmas are being used in new processes. Although these processes do excite the gas species to fluorescence that can be detected in the process chamber, the resulting spectra do not display the one or more wavelength intensity changes required for successful OES endpoint detection. This kind of failure appears to be different from the usual problem of low percent open etch area. The exact reasons that the endpoint signal is not detectable are not well understood.

A traditional OES endpoint signal for both of these problem processes has been demonstrated by striking a secondary plasma in the effluent gases downstream of the reaction chamber of the wafer plane. Success has been reported when attaching the secondary plasma unit to the side of the etch process chamber just before the throttle valve. Others have reported success placing the secondary plasma downstream from the turbo pump—a less well regulated pressure environment that can cause OES signal fluctuations. These "secondary plasma" units are commercially available. However, they suffer from two problems.

The OES signal is collected through a window that is relatively close to the secondary plasma. The energy of the plasma is such that it will break the effluent gases into small molecular components that will recombine on surfaces to form a polymer—a common problem in carbon halide etch chemistries. The polymer on the OES observation window attenuates the light signal so rapidly as to make the method impractical for a manufacturing tool requiring long mean times between maintenance.

Practitioners report that it is difficult to control the secondary plasma such its excitation of the effluent gas is stable over long periods of time. This is not surprising considering the heroic measures the OEM makes to produce a stable and repeatable plasma for processing. The cost constraints for a secondary plasma unit prohibit the use of all those same sophisticated techniques for producing stable reproducible plasma performance. Changes in the excitation of the effluent gas caused by fluctuations in the secondary plasma changes the light intensity that can be misinterpreted as changes in the manufacturing process being monitored.

BRIEF SUMMARY OF THE INVENTION

The present invention is directed to an electron beam exciter, electron beam excitation system and method for exciting gases using an electron beam exciter. The electron beam exciter generally comprises a variable density electron source for generating a cloud of electrons in an electron source chamber and a variable energy electron extractor for accelerating electrons from the electron source chamber as an electron beam and into a gas sample for fluorescing. The electron density (concentration) of the electron beam is variably controlled by adjusting the excitation power applied to the electron source. The electrons in the electron source chamber assume a reference potential by contacting a conductive surface at the chamber that is held at the reference potential, typically near ground electrical potential. The electron energy of the electron beam is variably controlled by adjusting a voltage to the electron extractor electrode, which changes the charge on the electrode. The potential difference between electron extractor electrode and the reference potential attracts the electrons from the cloud, through an extraction hole of the chamber toward the electron extractor electrode. The greater the disparity in the electrical potential between the electron extractor and the electron source, the higher the electron energy imparted to the electrons in the electron beam. The voltage to the extractor electrode can be adjusted independently from the excitation power applied to the electron source, thereby altering the energy of the electrons of the beam without changing the concentration of electrons of the electron beam. Conversely, the excitation power applied to the electron source can be adjusted independently from the electron energy of the electron beam, thereby changing the concentration of electrons in the electron beam without changing the energy of the electrons of the beam. Consequently, the electron density of the electron beam can the changed independently from the energy of the electrons in the beam, and, the energy of the electrons in the beam can then changed independently from the electron density of the electron beam.

The electron beam exciter further comprises an electron collector and counter for measuring the concentration of electrons in the electron beam. Electrons in the electron beam strike the electron collector and counter produce an electron current that is proportional to the electron hits. A change in the electron current is indicative of a change in the concentration of the electron density. By monitoring the electron current, the electron density of the electron beam can be stabilized at an optimal electron density for observing intensity changes in light emissions.

If a deviation in the electron current is detected, the excitation power to the electron source is adjusted to compensate for the deviation, thereby correcting the electron density without altering the electron energy of the beam. Conversely, the energy level of the electron beam can be changed, essentially independent from the electron density of the electron beam, to, for instance, excite a particular species. Changing the energy level of the electrons in the electron beam will alter the electron concentration of the beam, however, that change will be reflected by a change in the electron current generated by the electron collector and counter. The change can be counteracted by adjusting the excitation power applied to the electron source until the electron current again matches the reference electron current and the electron concentration of the beam.

The present electron beam exciter and electron beam excitation system can be operated in the exhaust line in a continuous beam operating mode or a pulsed beam operating mode while simultaneously maintaining the electron density of the electron beam at a constant concentration. The present exciter and excited system can also be operated in a variable electron energy operating mode, simultaneously with the continuous beam operating mode or the pulsed beam operating mode. Finally, the presently described electron beam exciter and electron beam excitation system can be operated in a variable electron density operating mode for altering the electron concentration of the electron beam, while maintaining the electron energy of the beam at a constant level.

BRIEF DESCRIPTION OF THE SEVERAL VIEWS OF THE DRAWINGS

The novel features believed characteristic of the present invention are set forth in the appended claims. The invention itself, however, as well as a preferred mode of use, further objectives and advantages thereof, will be best understood by reference to the following detailed description of an illustrative embodiment when read in conjunction with the accompanying drawings wherein:

FIGS. 2A, 2B and 2C are diagrams of ICP and CCP exhaust line plasma exciters as was known in the prior art;

FIGS. 9A, 9B and 9C depict a front view of the extractor, a cross-sectional view of the extractor at line AA and an orthogonal view of the extractor in accordance with an exemplary embodiment of the present invention;

FIG. 10 illustrates the geometry of the electron extractor and electron source components of the E-beam exciter in accordance with an exemplary embodiment of the present invention;

FIG. 23 is diagram of an E-beam exciter for exciting gases in an exhaust line by extracting electrons from a laser electron source type in accordance with still another exemplary embodiment of the present invention;

FIG. 24 is diagram of an E-beam exciter for exciting gases in an exhaust line by extracting electrons from microwave electron source type in accordance with still another exemplary embodiment of the present invention;

FIGS. 29A-29D are diagrams depicting the range of window observation angles for the present E-beam exciter in accordance with another exemplary embodiment of the present invention;

FIG. 32 is a timing diagram that represents three exemplary excitation series in accordance with an exemplary embodiment of the present invention;

FIG. 33 is a timing diagram that represents four possible integration patterns that correspond to the excitation series in FIG. 32 in accordance with an exemplary embodiment of the present invention;

FIG. 34 is one calibration excitation series for defining an optimal extractor voltage for producing a light emission in accordance with an exemplary embodiment of the present invention;

FIG. 35 is a timing diagram showing the pressure feedback correction of the present E-beam exciter in accordance with an exemplary embodiment of the present invention;

FIG. 36 is a timing diagram showing several operating modes of the present E-beam exciter in accordance with an exemplary embodiment of the present invention;

FIG. 37 is a flowchart illustrating a generic method for detecting excitation fluorescence at multiple excitation energy levels in accordance with an exemplary embodiment of the present invention;

FIG. 39 is a flowchart depicting a method for calibrating the present E-Beam exciter to an optimal extractor voltage for detecting wavelength $\lambda_1$ of an excited production species at various process pressures in accordance with an exemplary embodiment of the present invention;

FIG. 40 is a flowchart depicting a method for implementing the present E-Beam exciter with a generic duty with an electron current feedback for stabilizing the concentration of beam electrons in accordance with an exemplary embodiment of the present invention;

FIG. 41 is a flowchart depicting a method for implementing the present E-Beam exciter with an electron current feedback and pressure corrected reference currents for adjusting the density of the electron beam relative to the line pressure change in accordance with an exemplary embodiment of the present invention;

FIG. 42 is a flowchart depicting a similar method to that described above in FIG. 40 for implementing the present E-Beam exciter for adjusting the density of the electron beam relative to the line pressure change, but over a range of electron energy levels for detecting emissions in multiple wavelengths in accordance with an exemplary embodiment of the present invention;

FIG. 43 is a flowchart depicting a method for defining a unique spectral signature for a species in accordance with an exemplary embodiment of the present invention; and FIGS. 44A and 44B are a flowchart depicting a method for detecting one or more species in an effluent by its unique spectral signature in accordance with an exemplary embodiment of the present invention.

Figure 1:
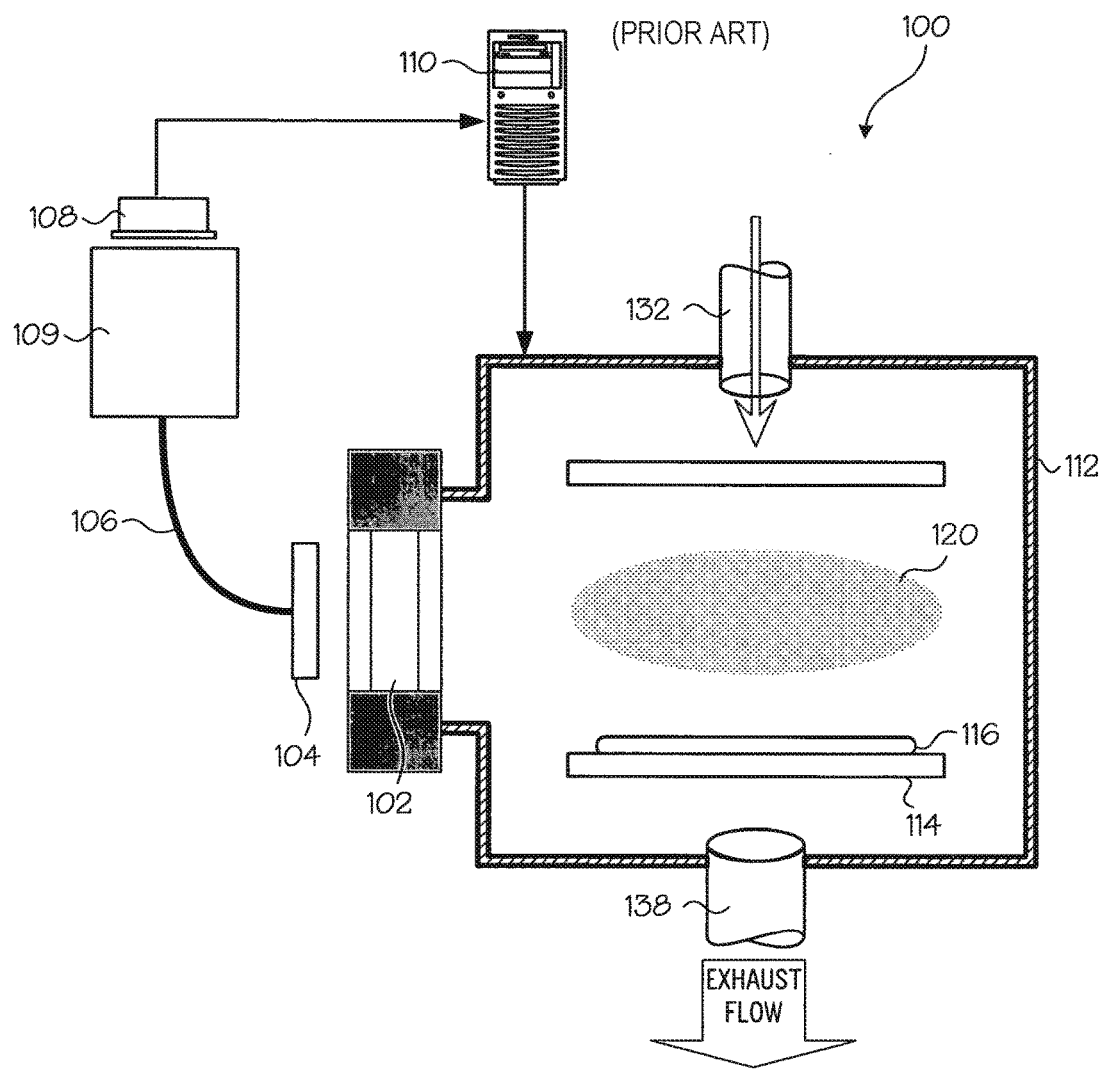
FIG. 1 is a diagram of an OES monitored production reactor as was known in the prior art.

Other features of the present invention will be apparent from the accompanying drawings and from the following detailed description.

DETAILED DESCRIPTION OF THE INVENTION

| Element Reference Number Designations | |
|---|---|
| 100: | OES measurement apparatus |
| 102: | Window |
| 104: | Collecting optics |
| 106: | Optical fiber |
| 108: | Sensor |
| 109: | Spectrograph |
| 110: | Process controller |
| 112: | Processing chamber |
| 114: | Wafer support |
| 116: | Wafer |
| 120: | Plasma |
| 132: | Process gas inlet |
| 138: | Processing chamber gas outlet |
| 200: | Exhaust plasma excitation apparatus |
| 202: | Window |
| 204: | Collecting Optics |
| 206: | Optical Fiber |
| 208: | Sensor |
| 209: | Spectrograph |
| 210: | Process Controller |
| 212: | Processing Chamber |
| 214: | Wafer Support |
| 216: | Wafer |
| 220: | First plasma region |
| 223: | Plasma electrodes |
| 224: | High frequency power source |
| 226: | Etching region |
| 232: | Process gas inlet |
| 233: | Emission spectrum detection mechanism |
| 234: | Shield plate with wire mesh pattern |
| 235: | Secondary high frequency power source |
| 236: | Second plasma region |
| 237: | Discharge plasma |
| 238: | Exhaust pipe |
| 238a: | Quartz exhaust pipe |
| 239: | Capacitive electrode plates |
| 240: | Induction coils |
| 310: | Treatment chamber |
| 311: | Opposed electrode |
| 312: | Sample |
| 313: | Discharge space |
| 314: | Insulating material |
| 315: | Exhaust port |
| 316: | Baffle |
| 317: | gap |
| 320: | Gas introduction system |
| 321: | Gas introduction pipe |
| 322: | Valve |

-continued

| | Element Reference Number Designations |
|---|---|
| 330: | Matching box |
| 331: | RF power source |
| 340: | High vacuum exhaust system |
| 341: | Turbo pump |
| 342: | Mechanical booster |
| 343: | Rotary pump |
| 344: | Exhaust pipe |
| 345: | Valve |
| 350: | Etching gas exhaust system |
| 351: | Orifice |
| 352: | Mechanical booster |
| 353: | Rotary pump |
| 416: | Exhaust pipe |
| 423: | Chamber monitoring system |
| 426: | Excitation chamber |
| 431: | Induction coil |
| 432: | Power source |
| 433: | Exhaust line |
| 434: | Photodiode |
| 436: | Photodiode |
| 437: | Level detector |
| 500: | Electron beam exhaust line exciter system |
| 502: | Electron beam exciter |
| 502A | Electron beam exciter on inlet |
| 502B | Electron beam exciter on exhaust above throttle valve |
| 502B | Electron beam exciter on exhaust above roughing pump |
| 504: | Exhaust line |
| 510: | Electron source |
| 512: | Electron concentration adjustment |
| 514: | Electron extraction hole |
| 516: | Reference potential surface |
| 515: | Electron chamber |
| 520: | Electron extractor/accelerator and beam optics |
| 520A: | Single opening electron extractor |
| 521A: | Opaque portion of extractor |
| 522: | Electron energy adjustment |
| 520B: | Electron extractor with circular openings |
| 520C: | Electron extractor with hexagonal shaped openings |
| 520D: | Electron extractor with square openings (mesh pattern) |
| 524: | Cone opening |
| 524A: | Circular electron extractor opening |
| 524B: | Circular shaped electron extractor openings |
| 524C: | Hexagonal shaped electron extractor openings |
| 524D: | Square shaped electron extractor openings (mesh pattern) |
| 525: | Variable potential extractor source |
| 526: | Beam focusing optics |
| 526A: | End beam focusing magnet |
| 526B: | Extractor beam focusing magnet |
| 526C: | Collector beam focusing magnet |
| 527: | Magnetic flux lines |
| 528: | Extractor beam focusing cone |
| 530: | Excitation region |
| 532: | Electron beam |
| 532A: | Electron beam |
| 532B: | Electron beam pattern |
| 532C: | Electron beam pattern |
| 532D: | Electron beam pattern |
| 533: | E-beam axis |
| 534: | Plume |
| 535: | Bright spots |
| 540: | Electron beam collector and counter |
| 541: | Depositions across electron collector |
| 545: | Variable bias collector source |
| 550: | Exhaust line pressure gauge |
| 560: | Electron concentration controller |
| 570: | Light collection optics |
| 572: | Emissions processor |
| 573: | Emissions processor |
| 574: | Viewport window |
| 579: | Light collection optics with optical fiber |
| 580: | Process chamber controller |
| 590: | Electron energy controller |
| 700: | Potential surface |
| 720: | Electron accelerator and extractor |
| 721: | Positive charge |
| 1900: | ICP electron beam exhaust line exciter system |
| 1910: | ICP electron source |

-continued

| | Element Reference Number Designations |
|---|---|
| 1911: | Variable ICP power supply (RF) |
| 1914: | ICP electron extraction hole |
| 1915: | Quartz (or sapphire) tube |
| 1916: | Reference potential surface |
| 1917: | Induction coils |
| 1918: | Reference potential surface extension |
| 1919: | Purge gas |
| 1920: | Exciter electrode heater |
| 1922: | Heater power supply |
| 1924: | Temperature sensor (thermocouple) |
| 1926: | Temperature control |
| 2000: | Hollow cathode electron beam exhaust line exciter system |
| 2010: | Hollow cathode electron source |
| 2011: | Hollow cathode power supply (variable VDC) |
| 2014: | Cathode electron extraction hole |
| 2015: | Hollow cathode |
| 2017: | Anode |
| 2100: | Field emitter array electron beam exhaust line exciter system |
| 2110: | Field emitter array electron source |
| 2111: | Field emitter power supply (variable VDC) |
| 2114: | Field emitter extraction hole |
| 2115: | Field emitter electron chamber |
| 2117: | Field emitter array |
| 2200: | Hot cathode electron beam exhaust line exciter system |
| 2210: | Hot cathode source |
| 2211: | Hot cathode power supply (variable DC Current) |
| 2214: | Hot cathode extraction hole |
| 2215: | Hot cathode electron chamber |
| 2217: | Hot cathode |
| 2300: | Laser electron beam exhaust line exciter system |
| 2310: | Laser source |
| 2311: | Laser power supply (variable DC Current) |
| 2314: | Laser extraction hole |
| 2315: | Laser electron chamber |
| 2400: | Microwave electron beam exhaust line exciter system |
| 2410: | Microwave source |
| 2411: | Microwave power supply |
| 2414: | Hot cathode extraction hole |
| 2415: | Microwave quartz electron chamber |
| 2417: | Microwave resonance chamber |
| 2634: | Plume |
| 2635: | Bright line spot |
| 2636: | Sampling location |
| 2702: | Short lifetime species |
| 2704: | Medium lifetime species |
| 2706: | Long lifetime species |
| 2736S: | Short lifetime sampling location |
| 2736M: | Medium lifetime sampling location |
| 2736L: | Long lifetime sampling location |
| 3000: | Reactor chamber |
| 3038: | Exhaust line |
| 3042: | Turbo pump |
| 3044: | Roughing pump |
| 3040: | Throttle valve |
| 3045: | Purge gas |

Plasma light emission has been used as a diagnostic tool since plasmas were first discovered. The spectra of light emitted is particularly important. The intensity of the emission spectra from a given species of particles (atoms, molecules, ions and solids) can be modeled as:

$$I_{b \to c} = Q_{b \to c} \sum_a n_a \int_{v_{min}}^{\infty} \sigma_{a \to b} v g_e(v) dv \qquad (1)$$

Where:
$I_{b \to c}$ = the intensity of emitted light by an excited species undergoing emission relaxation from excited energy state b to lower energy state c;
$n_a$ = the number of particles in energy state a;
$Q_{b \to c}$ = the quantum yield for light emission from decay of the excited energy state b to the lower energy state c;

$\sigma_{a \to b}$=the cross section for electron impact excitation of the particles from a to b;

$v_{min}$=the minimum electron speed required to excite the particle from energy state 'a' to energy state 'b'; and $g_e(v)$=the electron energy (or speed) distribution function, EEDF.

In addition to exciting particles, the higher energy electrons are also typically able to break molecular bonds. Often the speed distribution is approximated as "Maxwell-Boltzmann" or "Maxwellian" distributions.

$$g_e(v) = 4\pi n_e \left(\frac{m_e}{2\pi k T_e}\right)^{3/2} v^2 \exp\left(\frac{-\frac{1}{2} m_e v^2}{k T_e}\right) \quad (2)$$

Where:
$g_e(v)$=distribution of electron speeds (energies);
$n_e$=the electron density (number of electrons/cc);
$m_e$=the mass of the electron (9.109 382 15(45)×10$^{-31}$ kg); and
$T_e$=the electron temperature (1° K. corresponds to 8.617343(15)×10$^{-5}$ eV)

Real speed distributions are often similar to this approximation, with some important complexities. From these equations it is evident that the emission spectra depend on quantum mechanical constants as well as the distribution of particle states, the density of electrons, and the electron temperature (or energy distribution).

Optical emission spectroscopy (OES) is used in many applications to measure the concentration of one or more atomic or molecular species in a gas mixture. The semiconductor industry has long used OES to detect the endpoint of plasma etch processes by detecting the concentration changes of reactants and effluents that occur when the etch layer is exhausted, exposing the stop layer to the etching plasma. More recent analysis methods, such as Partial Least Squares (PLS), have been used to correlate the complex OES spectra to the concentrations of selected species in the reactive plasma. Similarly, the spectra have been used with analysis techniques, such as Principle Components Analysis (PCA), to detect when the process is behaving normally and when it changes from normal, expected behavior. These latter monitoring methods are called Fault Detection and Classification (FDC) or tool monitoring. Other industries use similar techniques.

An exemplary emissions monitoring system is depicted in FIG. 1 as system 100. In a typical process, semiconductor wafer 116, or some other work piece, is held on wafer support 114 in direct contact with plasma 120 and both are contained within reactor chamber 112. Process gases enter chamber 112 via process gas inlet 132 and reactant gases, reaction gas products and contaminants are evacuated from reactor chamber 112 as effluent through gas outlet 138 using a vacuum pump. OES monitoring is an extremely useful technique for analyzing the conditions within chamber 112, although other methods for monitoring chamber conditions are also known. Using OES, optical emissions from plasma 120 are received at collector optics 104, which are optically coupled to an exterior surface of chamber viewport window 102. The collector optics and chamber window may be oriented such that only certain portions of plasma 120 are observed. Collector optics 104 is optically coupled to spectrograph 109 by way of optical fiber 106. Spectrograph 109 separates the light emissions into individual spectral wavelengths and projects them onto sensor 108, which converts the spectra to electrical signals. The state of the process within reactor chamber 112 may be determined by the presence or absence of certain gas species in the reaction chamber. Process controller 110 monitors particular spectral wavelengths that correspond to one or more species for intensity changes and then alters the ongoing reactor based on that analysis. OES monitoring of chamber gases is the predominant method for endpoint detection of processes. Moreover, OES monitoring is useful for detecting other conditions such as starting point, system cleanliness, air and water leaks and system and process diagnostics. Often, it is necessary to simultaneously monitor two or more individual spectral wavelengths.

Although the above described OES monitoring system may be the predominate configuration, it is not without its shortcomings. Quantitative OES methods assume there are reproducible relationships between the OES signal and the number of one or more species in the gas, $n_a$ in Equation (1), from which the light was emitted. These OES methodologies require:

1. An efficiency of exciting each species in the gas to a fixed distribution of excited states that is constant or reproducible over time;

2. A distribution of relaxation pathways for each excited species, with at least one light emission relaxation pathway that is constant or reproducible over time; and 3. An efficiency of detecting the emitted light to produce the OES signal that is constant or reproducible over time.

For these OES methodologies to be successful, electron density, $n_e$, and electron temperature, $T_e$, must remain constant—or at least reproducible over time.

Some semiconductor processes produce conditions that create difficulties in meeting the above three requirements for reproducible OES detection schemes. Recently proposed semiconductor etch processes do not excite the gas mixture sufficiently (low $n_e$ or low $T_e$) to produce excited states from which the species of interest will relax and produce detectable light emission. In other processes, the plasma, that excites the reactive gas, is far enough away from the wafer surface that no emission occurs in the vicinity of the etching wafer. This is called a "dark" plasma or "upstream" plasma. In both cases there is little or no emitted light with which one can use OES to detect the species concentration changes in the gas above the wafer that occurs at endpoint. In other situations, the reaction chamber is a noisy environment which makes the endpoint detection for certain processes, such as low open-area etches, very difficult to detect. The source of the noise may be RF power noise, RF frequency change, power coupling, etc. Finally, plasma chambers do not have perfectly reproducible conditions. Such changes to the processing environment can result in spatially or temporally localized changes in $n_e$. More importantly, the electron speed distribution ($T_e$) can undergo subtle changes in the population of the more energetic electrons. As only the more energetic electrons, above ½ $m_e v^2_{min}$, are responsible for the optical emission in the discharge, such changes are difficult to detect and adjust for. Finally, as the electron speed distribution, $T_e$, varies, the electron density, $n_e$, also varies. Typically, a higher $T_e$ results in a higher $n_e$, with the values coupled in a complex fashion that is system dependent. This coupling make it impossible to alter $T_e$ without affecting $n_e$ and impossible to alter $n_e$ without affecting $T_e$.

One solution to this problem of exciting the gas to fluorescence is to locate a separate means of exciting the etch gas near or downstream of the etching wafer to produce detectable light signals with which to perform the desired OES analysis. This technique requires implementing a second plasma generator located downstream from the primary plasma generator at the reactor chamber to excite effluent gases from the reactor chamber. A plasma exciter-monitoring system for igniting effluent gases in an exhaust line into plasma state for detecting changes in an emission spectrum are described in Patent Laid-Open No. 58-84431, entitled "Plasma etching device," to Okabayashi and published May 20, 1983, which is incorporated herein by reference in its entirety. Okabayashi discloses several exhaust line plasma exciter embodiments as depicted in FIGS. 2A-2C. Exhaust plasma excitation apparatus 200, depicted in FIG. 2A, generally comprises reactor chamber 212 with one or more wafers 216 on support 214. A primary plasma is generated in first plasma region 220 of reactor chamber 212 by plasma electrodes 223 for performing semiconductor processing. Plasma electrodes 223 are electrically coupled to high frequency power source 224 to produce this plasma. Process gases are introduced into chamber 212 via process gas inlet 232 and effluent gases are expelled from the chamber through exhaust pipe 238. The effluent exhaust gases are drawn through exhaust pipe 238 and into quartz exhaust pipe 238a, using a vacuum pump, which is in line with exhaust pipe 238. While moving through quartz exhaust pipe 238a, the effluent gas is excited into discharge plasma 237. Discharge plasma 237 is separate and remote from first plasma region 220 of reactor chamber 212.

Light emissions from the excited effluent gases of discharge plasma 237 are detected at emission spectrum detection mechanism 233. and converted into electrical signals. The output signals from emission spectrum detection mechanism 233 may be used to control the process in reactor chamber 212. For instance, the output of the high-frequency power source 224 for the generation of discharge plasma in the first discharge region 220 may be regulated by the output signals from emission spectrum detection mechanism 233. Okabayashi discloses emission spectrum detection mechanism 233 for monitoring light emissions that is oriented at a view angle essentially perpendicular to the flow of effluent across second plasma region 236. To prevent discharge plasma, originating from second discharge region 236, from entering process chamber 212, shield plate with a wire mesh pattern 234 is disposed between second plasma region 236 and etching region 226 of chamber 212.

Okabayashi describes two different types of plasma generators for exciting the effluent in second plasma region 236, a capacitively coupled plasma generator as depicted in FIG. 2B and an inductively coupled plasma generator as shown in FIG. 2C, either of which may be used with exhaust plasma excitation apparatus 200 shown in FIG. 2A. The capacitively coupled plasma generator in FIG. 2B is configured with a pair of opposing capacitive electrode plates 239 on either side of quartz exhaust pipe 238a for inducing the effluent into discharge plasma 237 at second plasma region 236. High frequency power source 235 energizes capacitive electrode plates 239. Capacitive electrode plates 239 generally extend throughout the length of second plasma region 236. The inductive coupled plasma generator comprises quartz exhaust pipe 238a with induction coils 240 wrapped thereon and which are coupled to high frequency power source 235. The geometry of inductively coupled plasma generator in FIG. 2C is somewhat different from the capacitive coupled plasma generator as the downstream end of quartz exhaust pipe 238a is coupled to a right angle exhaust connection. A viewport window is disposed on the connection. From that position, emission spectrum detection mechanism 233 is oriented with its view angle coaxial with quartz exhaust pipe 238a, thereby enabling emission spectrum detection mechanism 233 to detect light emissions along the flow axis of quartz exhaust pipe 238a.

Figure 3B:
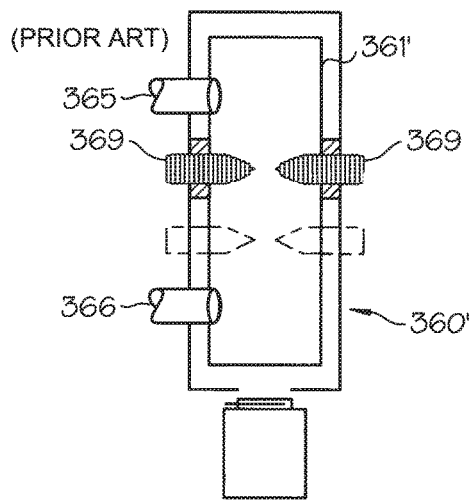
FIGS. 3A and 3B are diagrams of an exhaust line plasma exciter with a pressure regulated exhaust line as was known in the prior art.
Figure 3A:
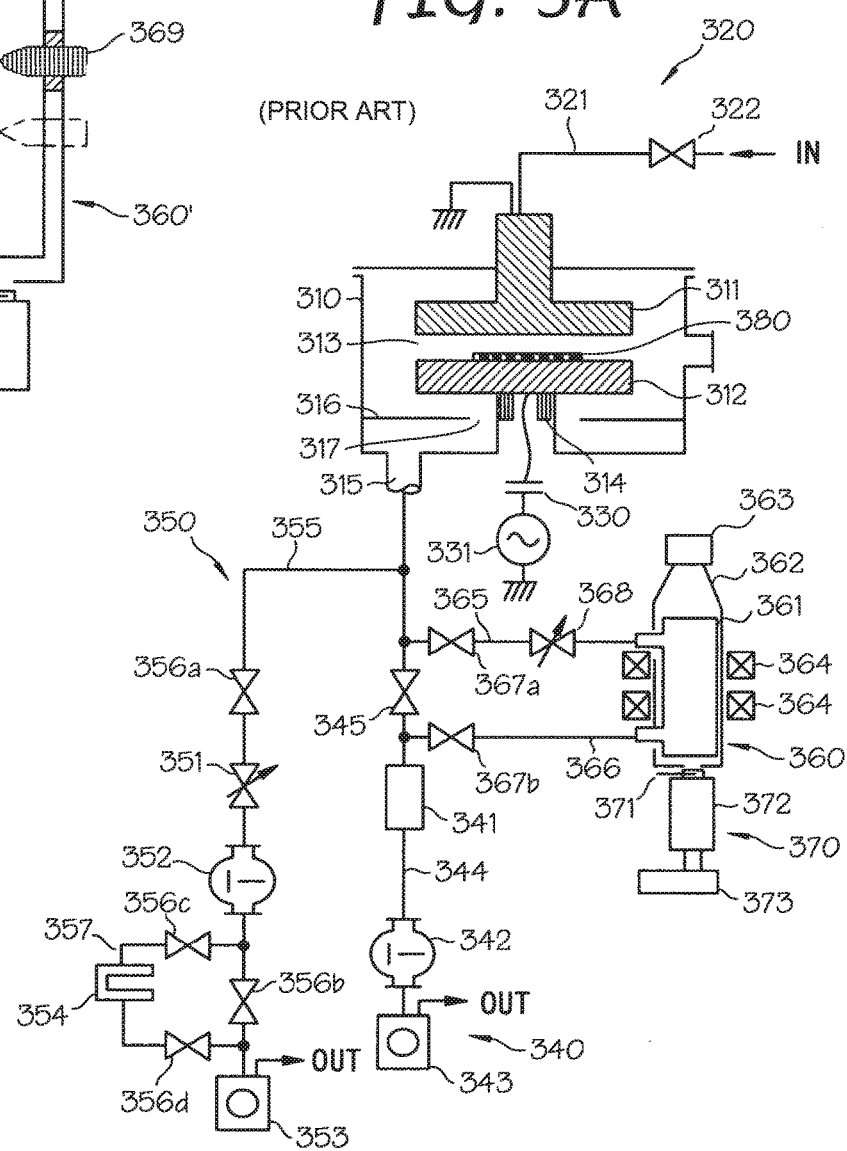

While the exhaust plasma excitation apparatus disclosed by Okabayashi overcomes many of the shortcomings of the single plasma technique, it suffers from the effects of unregulated gas pressure of the discharge portion that may result in ambiguous spectral lines for spectral regions that may be important for controlling a production process. U.S. Pat. No. 4,609,426 entitled "Method and Apparatus for Monitoring Etching," to Ogawa issued Sep. 2, 1986, which is incorporated herein by reference in its entirety, describes an exhaust line plasma exciter with regulated effluent pressure coupled to a conventional high vacuum exhaust system. In FIG. 3A, a primary plasma is generated in treating chamber 310 using an opposed electrode 311 and sample electrode 312 in parallel to define discharge space 313 there between. A gas passage and gas emission holes are formed on opposed electrode 311, and each gas emission hole opens to discharge space 313 and communicates with the gas passage. Opposed electrode 311 is connected to gas introduction pipe 321 of etching gas introduction system 320 in communication with the gas passage. The etching gas that flows through gas introduction pipe 321 is regulated by valve 322.

Sample electrode 312 is electrically isolated from treating chamber 310 by insulating material 314, and is connected to a power source such as radio frequency power source 331 located outside treating chamber 310 via matching box 330. Exhaust port 315 is defined on the bottom of treating chamber 310, with baffle 316 disposed inside treating chamber 310 between the back side of sample electrode 312 and bottom of the treating chamber 310. The outer periphery of baffle 316 extends to each side wall of the treating chamber 310, and gap 317 is defined between the inner periphery of baffle 316 and sample electrode 312 for receiving effluent flowing into the exhaust system.

High vacuum exhaust system 340 is used to evacuate effluent gases from treating chamber 310 consisting of turbo molecular pump 341, mechanical booster 342 and rotary pump 343. Exhaust port 315 of the treating chamber 310 is connected to the suction port of rotary pump 343 by exhaust pipe 344. Mechanical booster 342 is disposed upstream of rotary pump 343 in exhaust pipe 344, and turbo molecular pump 341 is disposed further upstream of booster 342. Valve 345 is disposed in exhaust pipe 344 upstream of turbo molecular pump 341.

Etching gas exhaust system 350 is essentially parallel to high vacuum exhaust system 340 which consists of variable orifice 351, mechanical booster 352, rotary pump 353 and trap 354 such as a nitrogen trap. Exhaust pipe 355, which is branched from the portion of exhaust pipe 344 upstream of the valve 345 is connected to the suction port of the rotary pump 353.

In one embodiment, Ogawa discloses a microwave plasma generator, plasma means 360, as a secondary plasma for exciting effluent gases and monitoring light emissions that consists of sub-chamber 361, waveguide 362, magnetron 363 and magnets 364. Gas introduction pipe 365 is coupled to exhaust pipe 344 between exhaust pipe 355 and valve 345, and communicates with the upper part of the sub-chamber 361. Gas discharge pipe 366 is connected between a gas discharge port disposed at the lower part of sub-chamber 361, and exhaust pipe 344 between valve 345 and turbo molecular pump 341. Valve 367a is disposed in gas introduction pipe 365, and variable orifice 368 for regulating the pressure to sub-chamber 361 is disposed between valve 367a and sub-chamber 361. Valve 367b is disposed in gas discharge pipe 366, on the discharge side of sub-chamber 361.

Sub-chamber 361 is incorporated in waveguide 362, and upper end portion of waveguide 362 is connected to magnetron 363. The magnets 364 are disposed outside waveguide 362 in such a manner as to correspond to the positions at which gas introduction pipe 365 and gas discharge pipe 366 are connected to sub-chamber 361, respectively. Spectrum detection means 370 comprising of slit 371, spectrometer 372, photo-multiplier 373, and the like, is disposed at the bottom of sub-chamber 361.

Sample 380, in treating chamber 310, is held by sample electrode 312 with an etch surface facing up. Valve 345 is opened and high vacuum exhaust system 340 is operated to evacuate the interior of treating chamber 310 prior to processing. The etching gas is introduced from the etching gas introduction system 320 into the treating chamber at a predetermined flow rate. While etching gas exhaust system 350 is being operated to discharge the gas from treating chamber 310, radio frequency power source 331 is operated to generate the plasma inside treating chamber 310 and to plasma-etch sample 380. A portion of the gas discharged from treating chamber 310 is routed to sub-chamber 361 for evacuation via valve 367a and through variable orifice 368.

The gas pressure in the sub-chamber 361 is regulated and is differentially discharged by variable orifice 368 to a pressure conducive to distinguishing a bright line spectrum. Magnetron 363 emits microwave energy and a microwave discharge is generated by magnets 364 inside sub-chamber 361. The regulated pressure gas that is introduced into sub-chamber 361 is ignited into a plasma by the microwave discharge. The spectrum detection means 370 detects the emission line spectrum clarified in the emission spectra, and the etching state of the sample 380 is monitored from changes of intensity in the emission line spectrum with time.

Ogawa also discloses a spark discharge type of plasma generator for exciting effluent gases in the secondary plasma. FIG. 3B shows second plasma means 360' comprising sub-chamber 361' a gas flow system and emission spectrum detection means identical to those used with the microwave plasma generator discussed above, and the gas pressure inside sub-chamber 361' is regulated in the same way as sub-chamber 361. When a high voltage is applied from the power source to projection members 369, spark discharge is generated between these members. The gas in sub-chamber 361' is excited into a plasma by this spark discharge.

The previously described exhaust line plasma exciters known in the prior art excite the effluent as it flows through the exhaust line and monitors light emissions from the plasma using Optical emission spectroscopy (OES) techniques. Plasma exciters utilizing other geometric configurations were known to the prior art as well as optical monitoring techniques. U.S. Pat. No. 4,857,136 entitled "Reactor Monitoring System and Method," to Zajac issued Aug. 15, 1989, which is incorporated herein by reference in its entirety, describes an exhaust line plasma exciter in which the effluent gases from the exhaust line diffuse into the excitation chamber of the secondary plasma generating device. There, the effluent is excited into a plasma and photodiodes are employed for detecting a target gas species in the excitation chamber.

Figure 4:
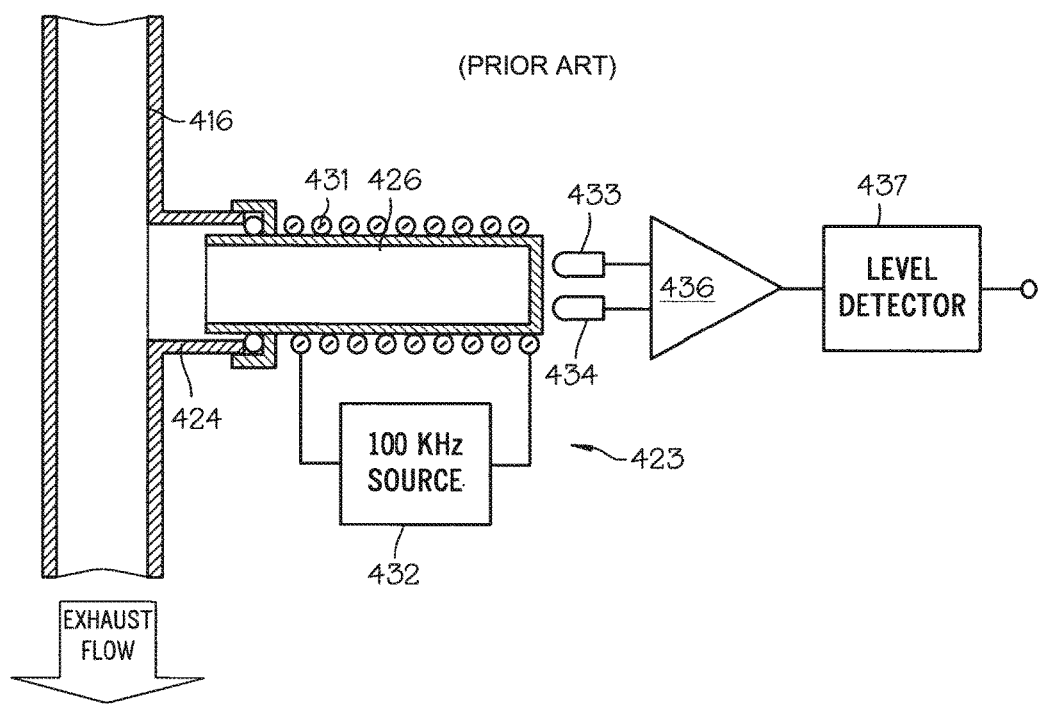
FIG. 4 is a diagram of an exhaust line plasma exciter as was known in the prior art.

More particularly with regard to FIG. 4, conditions within a reactor chamber are monitored remotely from the chamber monitoring system 423. Chamber monitoring system 423 generally comprises excitation chamber 426 which is fabricated of an electrically nonconductive material, such as quartz, and induction coil 431 which is wrapped coaxially about chamber 426 and connected to power source 432. One end of excitation chamber 426 is perpendicularly coupled to exhaust line 416 and a viewport window disposed on the opposite end with two or more photodiodes 433 and 434 are positioned for sensing light emitted from the excited effluent.

Unlike the previously described secondary plasma generators known in the prior art, chamber monitoring system 423 is not an inline plasma exciter, and therefore does not excite the effluent in exhaust line, but instead a portion of the effluent diffuses into chamber 426. There, the effluent is excited by the inductively coupled plasma generator describe above. One advantage of this system is that it can be easily connected to an existing port on exhaust line 416 without any modification of the existing exhaust vacuum system.

Another advantage of this system is that is utilizes less expensive photodiodes for detecting the excited spectral emission rather than spectroscopy. The photodiodes are selected to be responsive to specific wavelengths of light for the target gas to be detected, or can be provided with filters for selectively passing those wavelengths. The photodiodes produce electrical signals corresponding to the amounts of light of the respective wavelengths impinging thereon which may be connected to differential amplifier 436 which provides an output signal corresponding to the ratio of the signals from the photodiodes. That output is connected to level detector 437 which produces an output signal when the ratio of the photodiode signals reaches a predetermined level corresponding to some predetermined condition to be detected in the reactor.

Similar techniques were practiced by Verity Instruments, Inc., an assignee of the present application, in the 1980's as suggested Ramsey, et al. in the "Analysis of Dynamic Gas Conditions During Silicon Crystal Growth." These techniques utilized a dielectric plasma source for generating a low frequency plasma in a flow-through plasma chamber. However, unlike each of the prior art exhaust line secondary plasma generators described above that operates in a continuous-wave (CW) operation, the dielectric plasma source was pulsed, rather than generating a continuous plasma without interruption. Several different detection methodologies were employed for monitoring light emissions. Much of this technology was incorporated in the MS100 Ultra Trace Gas Analyzer that was available from Verity Instruments, Inc. in April 1985.

More recently, U.S. Pat. No. 6,643,014 entitled "Method and a System for Identifying Gaseous Effluents, and a Facility Provided with Such a System," to Chevalier issued Nov. 4, 2003, which is incorporated herein by reference in its entirety, describes both inline exhaust line plasma exciters and diffusion exhaust line plasma exciters that utilizes both an inductively coupled plasma generator and a microwave resonance plasma generator for exciting the effluent. In some inline plasma generator embodiments, the plasma generator is configured entirely within the exhaust line. An optical spectrometer is employed for analyzing variations of the radiation spectrum emitted by the plasma.

U.S. Pat. No. 6,975,393 entitled "Method and Apparatus for Implementing an Afterglow Emission Spectroscopy Monitor," to Mettes, and assigned to an assignee of the present application, issued Dec. 13, 2005, which is incorporated herein by reference in its entirety, discloses various embodiments of an inline exhaust line plasma exciter. Mettes discloses both RF inductively coupled, and DC discharge plasma generators for exciting effluent in the exhaust streams of multiple tools. Several of the embodiments are directed to configurations where the exhaust line plasma generator is remotely located from the detection device to avoid light emitted from short lifetime species. Shutters and other mechanical devices are also employed to protect the detector from the primary plasma emissions and view only afterglow emission. Mettes discloses different operating modes than were known previously in the prior art for detecting an afterglow from metastable species in the effluent, such as pulsing the plasma generator and then observing the excitation region for specie that fluoresce subsequent the excitation.

U.S. Pat. No. 6,538,734 entitled "Method and Device Utilizing Real-time Gas Sampling," to Powell issued Mar. 25, 2003, and its progeny (U.S. Pat. Nos. 6,757,061, 6,791,692, 6,867,859, 7,019,829 and 7,202,946) which are incorporated herein by reference in their entireties, describe various embodiments of an inductively coupled plasma generator configured with an excitation chamber in line with the flow of effluent gases from a reactor chamber, essentially as discussed above. Powell discloses using various analysis and monitoring techniques with the exhaust line inductively coupled plasma generator that were in widespread use for monitoring the primary plasma in a reactor chamber. Powell also discloses various display interfaces for analyzing and monitoring spectra of emitted radiation and for controlling such conditions as integration times, sensitivity of detectors, scaling factors and the like.

In stark contrast with the prior art, the present invention does not utilize a plasma generator to directly excite effluent gases into a plasma state for generating light emissions and, therefore, does not suffer from the shortcomings described above. Instead, the present invention utilizes an electron beam (E-beam) for delivering excitation energy to the effluent that does not employ a plasma generator for creating light emissions. The energy from the E-beam excites the atom species in the effluent for generating light emissions that are useful in process control and other applications. One aspect of using the present E-beam for exciting the species present in the effluent is that $n_{Ee}$ can be adjusted and regulated independently from the energy level of the electrons in the beam.

It is well known that changes in the concentration of a light emitting species contained in an effluent stream will result in a corresponding change in the brightness of the light emissions generated by that species. However, exhaust plasma exciters known in the prior art suffer from a myriad of shortcomings that may also produce changes in light intensity that are unrelated to the concentration of the species in the effluent. Previously, it was not possible to accurately regulate the excitation power delivered to the excitation chamber to generate a plasma with a specific concentration, other than by regulating the power delivered to the plasma generator (as is common in prior art plasma generators). Even with this level of control, plasma generators have been unable to repeatably reproduce both $T_e$ and $n_e$ at a level of fidelity required to maintain the required control over emission strength. Consequently, any change in the intensity of the light emissions that resulted from variations in the operation of a prior art plasma generator might be incorrectly attributed to changes in the effluent. Aside from stability problems, prior art plasma generators are also highly susceptible to pressure changes in the effluent. Small pressure changes in the exhaust line may be incorrectly interpreted as a change in concentration of the excited gas; pressure decreases might mask the presence of a species altogether. Furthermore, because small changes in the intensity of emissions might result from any of a number of factors, accurately accessing the concentration of a species by the emissions light intensity is problematic for prior art effluent excitation devices. The present E-beam exciter provides mechanisms for stabilizing the electron density of the beam, while simultaneously compensating for conditions that may produce unwanted changes in the intensity of the emissions. In general, the more electrons in the E-beam (the higher the electron density), the brighter the light emissions resulting from the interaction between the beam and effluent. Thus, $n_{Ee}$ of the E-beam of the present invention can be adjusted to optimize the signal-to-noise ratio of light at a particular spectral wavelength for identifying a specific species. Furthermore, $n_{Ee}$ can be directly monitored for drift and regulated to maintain an optimal electron density to produce a constant amount of light emitting electron collisions with gas particles in the effluent. Because the density of electrons in the E-beam is regulated at a optimal level, minute changes in light intensity can be more reliably ascertained as changes in the concentration of an excited species. With regard to still another advantage of the present E-beam exciter, because the electron density of the beam can be monitored and regulated, the electron density can be used to compensate for changes in emissions light intensities due to changes in the exhaust line pressure. By understanding the correlation between the emissions intensity and the exhaust line pressure for a species, and also the relationship between the exhaust line pressure and the electron density for the species, the electron density may be adjusted to compensate for exhaust pressure changes that would otherwise affect the emissions intensity. Thus, by adjusting the electron density with the changes in the exhaust pressure, the emissions light intensity for a particular concentration of a species can be held constant over a wide range of line pressures. Finally, because $n_{Ee}$ can be independently regulated and adjusted separately from $E_{Ee}$ of a beam, any of the advantages discussed above can be achieved without sacrificing the accuracy, range or advantages of the electron energy level of the E-beam.

Conversely, because the energy level of the electrons in the beam can be adjusted independently from the electron density, the energy level of the electrons can be changed without adversely affecting any of the operational advantages of the electron density that were discussed immediately above. It is well known to attempt to identify a species from a spectral profile or a pattern of spectral emission wavelengths, from light emitted from an excited species. The aim is to identify a spectral profile for the species that is unique from all other spectral profiles of other species that may be present in the effluent. If a unique spectral profile cannot be identified for the species, it cannot be detected in the effluent stream. However, since the spectral profile for the species changes with its level of excitation, i.e., different patterns of spectral emission wavelengths become visible at different excitation levels and it may be possible to find particular excitation level that produces a unique spectral profile for the species. Using the present E-beam exciter, a species may be excited to a particular excitation level by varying the electron energy in the E-beam to produce the unique spectral profile for the species. In so doing, it is possible to target a particular species that may be present in effluent of an exhaust line for detection by merely adjusting the electron energy of the E-beam to produce the unique spectral profile for the species. Furthermore, because the energy level of the electrons in the E-beam can be adjusted independent of the electron density of the beam, the E-beam energy level may be selectively adjusted to detect multiple species in the effluent from their unique spectral profiles in near real-time. It may not always be possible to identify a spectral profile for a species that is unique to the exclusion to all other species that may be present in the effluent, or more accuracy may be desired than a single spectral profile. Another advantage of the present E-beam exciter is that, it may be possible to identify a series of spectral profiles resolved at various excitation levels as a unique spectral signature for a species, the spectral signature consists of a plurality of spectral profiles, each individual spectral profile taken at a unique excitation level for the species.

Additionally, because the present effluent excitation device does not rely on a plasma generator that is directly coupled to the effluent, it is possible to operate the E-beam exciter in various operating modes that were heretofore unknown to the prior art and, in so doing, able to extract information from the effluent light emissions that was previously undetectable. The E-beam exciter may be operated in continuous operation (sometimes referred to as continuous-wave (CW) operation for plasmas). Because the electron density and electron energy level may be independently adjusted, an optimal electron energy for fluorescing a specific species may be selected and an optimal electron density for observing both bright and dim spectral emission bands may be independently selected for operating the beam. Additionally, multiple excited species may be simultaneously detected from their spectral profiles. Furthermore, because the excitation energy of the beam is precisely regulated and concentrated along narrow cross-section of the beam's axis and the beam may be directed across the flow of the effluent stream, excited species may be detected at different physical locations away from the beam and along the direction of the effluent flow. The precise location of a specie's fluorescence is based on a specie's fluorescence lifetime (the fluorescence lifetime is the delay time between the excitation of a gas particle and the time later when it relaxes and emits its photon). For instance, short lifetime species emit light that is detectable closest to the E-beam, the light emissions for medium lifetime species are detectable further from the beam than the short life species and long lifetime species emit light that is detectable at further distances downstream from the beam than either the medium or short lifetime species. Hence, using the present E-beam exciter, species with different fluorescence lifetimes are simultaneously detectable at different locations from the beam, as well as from their spectral profiles. Furthermore, because the E-beam exciter may be operated at very high electron concentrations, single gas particles are more likely to undergo multi-electron collisions into higher energy states, which may be observable as emissions from their complex relaxation paths. The emissions from these complex relaxation paths often result in longer fluorescence lifetimes.

The E-beam exciter may also be operated in a pulsed operating mode, but which is far different than merely pulsing a directly coupled plasma as is common in prior art effluent excitation devices. Pulsing the exciter has the advantage of decreasing the amount of contaminants generated from the interaction between the beam and effluent that will adhere to the viewport window and thereby decrease the frequency of downtime for window maintenance. Because the electron density in the E-beam is monitored and regulated at a optimal level, electron density drift between duty cycles is minimal and intensity observations are far more accurate. By monitoring the electron density in real-time, the electron density measurement may be used to adjust the electron density on the fly within the current duty cycle, either prior to an emissions measurement integration or during an integration. Alternatively, the electron density measurement may be used to adjust the electron density for a subsequent duty cycle. The system has the option of disregarding any emissions integration as being unreliable if the measured electron density falls outside a predetermined density window during the integration period. Furthermore, monitoring the electron density provides a mechanism for triggering a light integration immediately upon detecting that the electron density has stabilized within the desired density window. Hence, the duration of active portion of the duty cycle may be adaptively varied based on the electron density measurement. Adaptively varying the length of the duty cycle is an extremely efficient means for lowering the amount of depositions, while achieving highly accurate light measurements from an E-beam with a stable electron density. All of the advantages discussed above for the continuous operating mode are equally relevant and useful with the pulsed operating mode.

Another operating mode that was heretofore impossible using directly coupled plasma exciters of the prior art is a variable energy operating mode. Because the electron energy level of the E-beam can be adjusted using the present invention, these adjustments may be accomplished in combination within the continuous and pulsed operating modes described above. During operation, the electron energy of the E-beam may be stepped through a plurality of predetermined energy levels and light measurements performed for each level. Individual species may be detected from their unique spectral profiles at each energy level or from a unique spectral signature across a plurality of electron energy levels. Here again, because the electron density may be adjusted independently from the energy of the electrons with the present E-beam exciter, the electron density can be changed at a particular electron energy level for measuring two different spectral wavelengths. This feature is important in situations where accurate intensity measurements for two spectral wavelengths are important, but their intensities are beyond the dynamic range of the measurement device at a single electron density; the higher intensity wavelength is integrated at a lower electron density to prevent saturating the measurement device and the lower intensity wavelength is integrated at a higher electron density to increase the signal-to-noise ratio for the measurement.

A more complete understanding of the novel features, advantages and modes of the present invention will be best understood by reference to the description of a exemplary embodiments when read in conjunction with the accompanying figure drawings. In the following description, reference is made to the drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural, system and specific use changes may be made without departing from the spirit and scope of the present invention. The following description is, therefore, not to be taken in a limiting sense. For clarity of exposition, like features shown in the accompanying drawings are indicated with like reference numerals and similar features as shown in alternate embodiments in the drawings are indicated with similar reference numerals.

Figure 5:
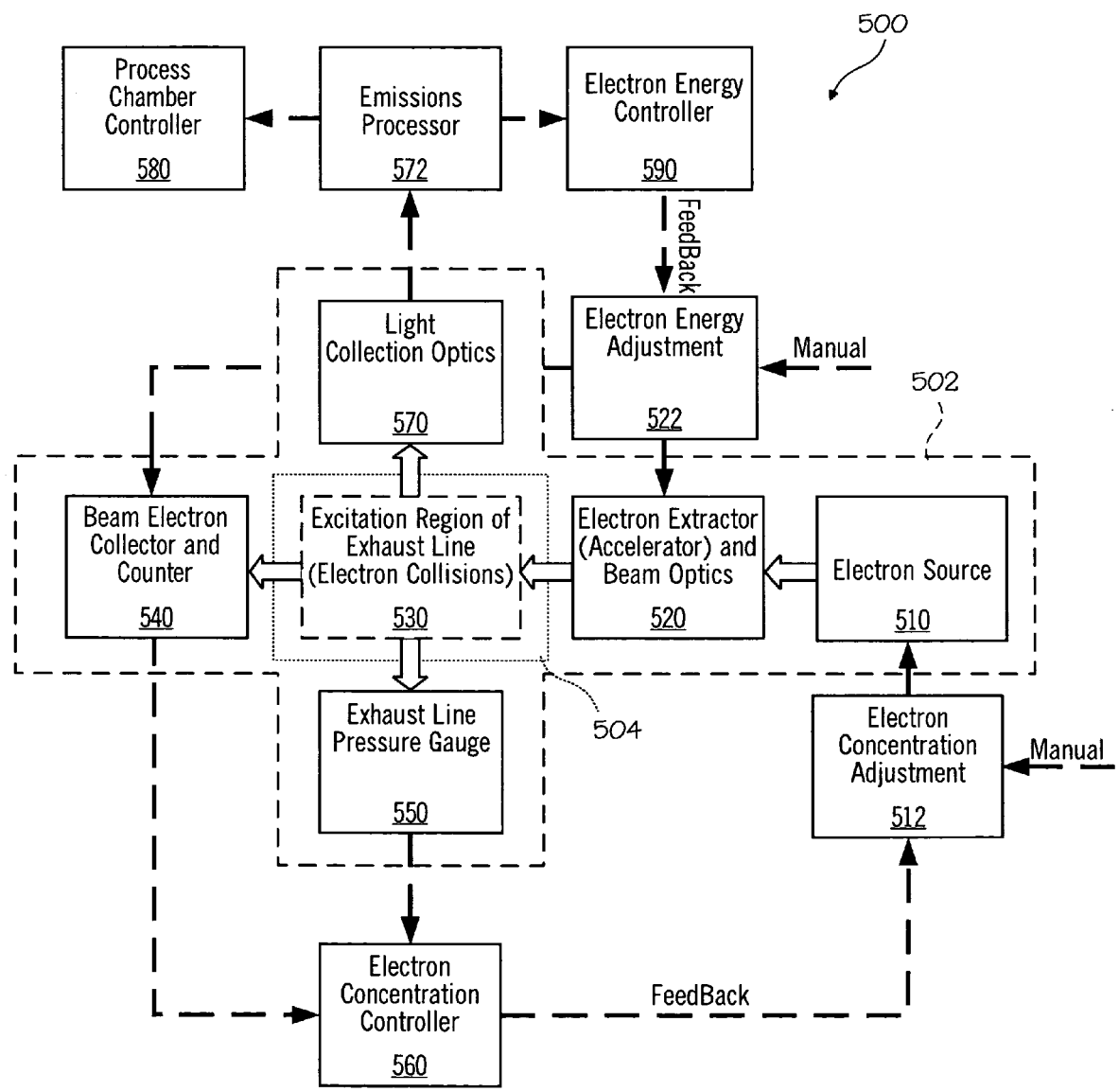
FIG. 5 is a diagram depicting the components of an electron beam exciter system for exciting and processing effluent gases in an exhaust line from, for instance, a reactor chamber in accordance with exemplary embodiments of the present invention.

FIG. 5 is a diagram depicting the components of an electron beam exciter system for exciting and processing effluent gases in a exhaust line from, for instance, a reactor chamber in accordance with exemplary embodiments of the present invention. Each of these components will be discussed in greater detail below with regard to specific exemplary embodiments for each, however the present invention may be practiced in a variety of variations and uses. The descriptions of the illustrations discussed below have been ordered to best explain the principles of the invention and the practical application, and to enable others of ordinary skill in the art to understand the invention for various embodiments with various modifications as are suited to the particular use contemplated. One purpose of the presently described electron beam exciter system 500 is to generate an electron beam (E-beam) having a sufficient electron energy level to produce light emitting electron collisions with gas particles in the effluent and with sufficient electron density that the light emissions are detectable. As such, the present E-beam exciter 502 generally comprises electron source 510 for providing a source of electrons to electron extractor (accelerator) 520. Electron source 510 generally comprises a source chamber, or "electron bottle" which generates a cloud of electrons that assume a reference potential. The electrons reach the reference potential by contacting a conductive surface at the chamber that is held at the reference potential, typically near ground electrical potential. Electron extractor 520, which is positioned between the extraction opening of the source chamber and the effluent stream, is set to a positive potential that is higher than the reference potential of the electrons in the source chamber. The potential difference between the positive extraction electrode and the reference plane in the electron source determines the electron beam energy. The shape of the extraction electrode has a significant effect on the size and shape of the electron beam produced.

Within electron source 510 is an electron emissive material that generates a gas of free electrons when excited. The composition of electron ($e^-$) emissive material varies depending on the type of electron source being employed, but may be a solid or gas or even the effluent gas diffused into the source chamber from exhaust line 504. Electron excitation methods vary with the source type; plasma and non-plasma electron generators exist and include, for instance, glow discharge, hollow cathode discharge, radio frequency inductively coupled plasma (RF ICP), RF capacitively coupled (CCP, parallel plate) plasma, microwave cavity discharge, heated electron emissive materials ($LaB_6$, Thoriated-tungstun, etc.), and forced electron emission techniques (x-rays on surfaces, etc.). A narrow electron energy distribution is desirable in the E-beam for preferentially exciting selected energy transitions which may be useful for determining the presence and/or concentration of specific species and absence of others in the gas stream. Since the method of generating the electrons will determine the electron energy distribution, an optimal electron source type will generate electrons in a narrow energy distribution for the resulting energy distribution of the electron beam to be correspondingly narrow. It may also allow one to control if and when molecular fragmentation results in the excitation region. Currently available electron sources generate electrons within a specific operational range of electron densities, $n_e$. For instance, typical capacitive coupled plasma (CCP) electron generators produce an electron density between $10^9$-$10^{10}$ $cm^{-3}$, typical inductively coupled plasma (ICP) electron generators between $10^{10}$-$10^{12}$ $cm^{-3}$, and typical DC glow electron generators produce electrons at a density between $10^8$-$10^9$ $cm^{-3}$ (the concentration of electrons, or electron density of the E-beam will be referred to as $n_{Ee}$ hereinafter) The specific concentration of electrons produced by any type of electron generator is controlled by electron concentration adjustment 512, which controls the electron density $n_{Ee}$ by adjusting the excitation level applied to the $e^-$ emissive material in the source chamber. Importantly, unlike the prior art exhaust line plasma exciters, the present electron source 510 does not excite the effluent into a plasma state for making light emission observations, instead, its purpose is to generate electrons that are available for extraction from the source chamber for the formation of an electron beam. The electron beam is the mechanism used by the present invention for exciting gas particles in the effluent stream into an excited state and observing the resulting light emissions.

As may be appreciated from Equations (1) and (2), the intensity of emission light increases with the concentration of particles at a particular energy state a, $n_a$, and with the concentration of electrons in the E-beam, $n_{Ee}$. Unless the energy level of the electrons in the E-beam remains constant, the source of any change in the emissions intensity will be ambiguous. To reliably detect a change in the concentration of a target species in the effluent, the $n_{Ee}$ should remain constant during intensity measurements. Any drift in the $n_{Ee}$ of the E-beam will distort the species concentration readings derived from the light intensity. One way to maintain a constant $n_{Ee}$ in the E-beam is to monitor $n_{Ee}$ during electron extraction using beam electron collector and counter 540 (electron collector 540). Electron collector 540 may be disposed on the opposite side of excitation region 530 of exhaust line 504 from electron extractor 520 for monitoring the number of electrons in the E-beam. To ensure that the electrons in the E-beam are attracted to, and contact electron collector 540, a slight positive charge, relative to the extractor, may be applied to the collector. Electrons in the E-beam interact with electron collector 540 and produce an electron current that is related to the number of electrons striking the collector. Electron concentration controller 560 uses the electron current from electron collector 540 for accessing the stability of $n_{Ee}$ in the E-beam and determining any power adjustments that might be necessary to electron source 510 to compensate for drift in $n_{Ee}$. Essentially, electron concentration controller 560 compares the electron current generated from electron collector 540 to a reference electron current in order to determine the amount of adjustment needed to correct any drift detected in $n_{Ee}$. Electron concentration controller 560 communicates the adjustment amount to electron concentration adjustment 512 for implementing changes to the excitation power of electron source 510, thereby correcting $n_{Ee}$. By maintaining a stable electron density, the intensity of the emissions light is a more accurate indicator of the concentration of the target species in the effluent. Finally, the bias voltage on the collector may be swept between negative and positive potentials so as to interrogate the precise distribution of electron energies in the E-beam.

It should be noted, however, that changes in the pressure of the effluent gases will also result in changes in the number of target species atoms in the effluent stream and therefore to the emissions light intensity. A higher effluent pressure results in more target atoms in excitation region 530 and more collisions with the energized electrons in the E-beam and, as a consequence, brighter emissions, even though the concentration of target species atoms in the effluent may remain constant. This type of intensity change is not indicative of the relative concentration of the target species, but of the total number of target species atoms that collide with the electron in the E-beam. Therefore, $n_{Ee}$ should be corrected for pressure changes prior to correcting drift in $n_{Ee}$. What the present electron beam exciter system 500 provides is a means for insulating the emissions light intensity from changes in the pressure of the effluent. That is, a mechanism to regulate the electron excitation power to electron source 510 in such a way that the emissions light intensity does not change unless the concentration of the target species in the effluent changes, regardless of any pressure changes in the effluent. This is accomplished by deriving a plurality of pressure-corrected reference electron currents at relevant effluent pressures for the exhaust line. Electron concentration controller 560 selects a pressure-corrected reference electron current for the exhaust line pressure and compares that reference current to the electron current generated by electron collector 540. Any difference noticed by electron concentration controller 560 is indicative of drift in $n_{Ee}$ and should be adjusted out. As depicted in the figure, electron concentration controller 560 receives temporal pressure information from exhaust line pressure gauge 550 simultaneously with an electron current from electron collector 540 and references the line pressure to a pressure-corrected reference electron current for the pressure. Any drift in the electron density $n_{Ee}$ is determined by comparing the electron current from electron collector 540 and the pressure-corrected reference electron current for the exhaust line pressure. Electron concentration controller 560 issues adjustment instructions, as needed, to electron concentration adjustment 512, which corrects $n_{Ee}$ by varying the excitation energy delivered to electron source 510.

Optimally, electron source 510 produces electrons within a very narrow energy range so that when extracted and accelerated by electron extractor (accelerator) 520 (toward the gas particles to be analyzed), the excitation energy distribution of the E-beam is also very narrow. By selecting an electron source that produces electrons within a very narrow energy range, it may also be possible to approximate the perfect conditions necessary for all of the excitation electrons in the E-beam to a near-identical energy. Utilizing an electron source with a narrow energy range allows for more precise control of the energy transitions that the E-beam electrons excite in the target gas at any given time. An ideal electron source will generate electrons at a single energy level, but as a practical matter, current real world electron sources all produce electrons within a range of energies, so an optimal electron source will generate electrons in a narrow range of energies.

The threshold consideration for selecting the type of electron source for use in a particular application is matching the operation parameters of the electron source with the observation conditions necessary to observe the target species. Merely reaching a particular set of operating parameters may not suffice, the source should be able to maintain an operational level throughout the extraction time period and between duty cycles in order to reliably detect a target species. The temporal stability of the concentration of the electrons in the electron chamber controls how many electrons can be extracted to produce the E-beam. Ideally, the concentration and energy characteristics of electrons are little perturbed during extraction, or returns to equilibrium quickly after a sample of electrons has been extracted. Therefore, in addition to selecting an electron source type based on the energy transitions of the species and the concentration of electrons, the observation conditions also include the length of an extraction period and/or duty cycle necessary for exciting a particular species to emit a detectable light emission. A suitable electron source type for a target species should be able to generate a beam of electrons at a desired concentration and energy level, for the extraction time necessary to detect the light emission from the target species. If the concentration or energy level from the electron source fades during the extraction period, beyond the level in which the target species is detectable, the particular electron source type is not a suitable candidate for the target species. In selecting an electron source type for critical observation conditions, such as for observing a species requiring a longer excitation period with a beam of electrons within a very narrow energy range, a hollow cathode type electron source may be an appropriate selection provided that the source could maintain a high enough concentration of electrons over the extraction period for detecting the target species. If the target species is not detectable using a hollow cathode electron source, then an induction coupled plasma (ICP) type of electron source might be substituted as it generates electrons at a higher density, but over a significantly wider range of energy levels. It should be mentioned that matching the operation parameters of the electron source with the observation conditions for the target species is only a threshold consideration, other possible considerations include the source's response to the operating pressure of exhaust line 504, contamination ejected from the source, and its reliability, sensitivity and the stability over the expected operating conditions.

The interior of the electron chamber of electron source 510 may be a conductive material and held constant at a "reference electrical potential" that allows the electrons to assume a potential near that of the conductive surface. As will be understood from the description further below, the reference surface potential may be set at virtually any potential, but as a practical matter is held near ground electrical potential in order that the voltage on electron extractor (accelerator) 520 electrode can be kept low for safety reasons, for instance between 10 VDC and 50 VDC. For example, if the energy of photons with wavelength in an observable fluorescence wavelength range is <10 eV, the excitation electron energy may need be only a few volts higher than 10 eV. If the electrons are near ground electrical potential, only a voltage of 10-50 VDC is needed for extraction and acceleration of the electrons from the source chamber.

The purpose of electron extractor 520 is to selectively increase the electron energy in the E-beam to a predetermined level and the purpose of electron collector 540 is to count electrons in the E-beam that strike the collector electrode. Electron counting can be optimized by applying a small bias voltage to the collector electrode, thereby attracting more E-beam electrons to the collector for counting then might otherwise strike the collector. The bias voltage should be sufficient to increase the potential at the collector above both the reference potential and the extractor potential. In accordance with some exemplary embodiments, the bias voltage applied to the collector electrode is just high enough to attract electrons to the collector without increasing the energy level of the E-beam. Thus, in accordance with those exemplary embodiments, in order to avoid any unwanted increase in the electron energy due to the attraction potential applied to electron collector 540, that increase in potential is usually small compared to voltage applied to electron extractor 520 for accelerating the electrons. For instance, if the potential applied to electron extractor 520 is 10 VDC, an additional 1 VDC may be applied to electron collector 540 (i.e., 11 VDC above the reference electrical potential). Alternatively, there may be cases where it is desirable to use the electron collector 540 as an accelerator. For those situations, the potential applied to electron collector 540 will be large in comparison to electron extractor 520. For instance, 1 VDC above the reference electrical potential applied to electron extractor 520 and 21 VDC applied to electron collector 540. The potentials alluded to above are merely exemplary for the purpose of describing various aspects of the present invention and are not intended to limit the scope of the present invention in any way. It should be appreciated that potential values will be determined by the particular application and operating conditions.

Once a sufficient electron concentration has been established within electron source 510, electrons are extracted from the source by electron extractor 520. Optimally, electron extractor 520 appears as a transparent wall of homogeneous positive charge with respect to the reference potential of the electrons within electron source 510. Electron extractor 520 is positioned along a line from the extraction opening of the source chamber and the effluent gas in the exhaust line, excitation region 530. The axis of the E-beam extends generally along that line from the opening to excitation region 530. Often, the source chamber of electron source 510 has a generally cylindrical shape that is coaxial with the E-beam axis. Ideally, electron extractor 520 should have no opacity to the electrons, at least proximate to the extraction opening of the source chamber. However, projecting a transparent wall of homogeneous positive charge in space is not readily obtainable. A substrate, usually metallic, must be provided for the charge to accumulate on. The exact configuration of the structure may vary depending on the type of electron source employed, the operating mode for extracting electrons from the source, process flow parameters in the exhaust line and/or the target species or the energy transitions the electrons are exciting in the target species.

Optimally, the E-beam produced by electron extractor 520 from electrons generated in electron source 510 is a narrow beam with a generally uniform cross-section. However, because the E-beam comprises a concentration of negatively charged electrons, the tendency is for the cross-sectional shape of the E-beam to increase with the distance from electron extractor 520. While a slight conically shaped E-beam may not be overly detrimental to the light observations, it should be remembered that the intensity of the light emission is proportional to the electron density $n_{Ee}$; and as $n_{Ee}$ is spread out over the wider area of the conical shape of the beam, the light emissions are also spread out across the cone. As the e-beam becomes more spread out, the light is more difficult to detect. Therefore, E-beam focusing optics should be employed to constrain the E-beam into narrow, cylindrical shape, wherein the emissions remain concentrated in a relatively narrow area and are easier to detect. One technique is to force the extracted electrons proximate to the E-beam axis by presenting them with an opaque wall outside the area proximate to the opening in the electron source, such as by configuring electron extractor 520 as a solid electrode with an opening aligned with the extraction opening in the electron chamber of electron source 510. Still another technique is to create a reference potential surface at electron source 510 that is parallel to and approximately coextensive with the opaque portion of the wall of electron extractor 520. The shape of electron extractor 520 may also assist in constraining the E-beam to a narrow area and reduce beam-spreading. One technique is to configure electron extractor 520 with a concave surface oriented toward excitation region 530. The electron extractor 520 may be configured with a conic or parabolic cross-sectional shape to form the concave surface. Aside from focusing the beam, another technique for increasing the light emissions from electron-particle collisions is by increasing the path of the electrons in the E-beam. A magnetic field with flux lines parallel to the beam axis is established by the placement of magnets along the beam axis. Electron cyclotron motion induced by the magnetic field will cause the electrons to circle around the magnetic flux lines in a helical path, thereby increasing the likelihood of an electron-particle collision. The magnetic field will force electrons to accumulate along the axial line from electron source 510 to electron collector 540 by magnetic field along and in the direction of the E-beam. In so doing, the electron gas in electron source 510 will align itself with the extraction opening of the source chamber and electron extractor 520. Upon extraction, the electrons will accelerate parallel to the E-beam axis toward and past electron extractor 520 to electron collector 540. The magnetic field will counteract the repelling force of the like-charge electrons in the E-beam.

Light emissions within excitation region 530 are observed along one or more view angles oriented at a right angle, or greater, to the direction of the E-beam by light collecting optics 570. The collected light is received from the optics at emissions processor 572 which monitors discrete wavelength regions for light emissions. The monitor results are used by electron energy controller 590 to, among other things, determining optimal electron energy levels for monitoring a particular species or to adjust an electron energy level for drift in near-real time. Additionally, the processed results from emissions processor 572 are used by process chamber controller 580 for controlling various production processes, fault detection and maintenance procedures within a reactor chamber.

From the diagram, it is apparent that the power applied to electron source 510, which is controlled by electron concentration adjustment 512, is independent from the electron energy that is controlled by electron energy adjustment 522. Consequently, the concentration of electrons in the E-beam from electron source 510 can be adjusted with little or no change in the mean energies of the electrons therein. Conversely, the electron energy, controlled by electron energy adjustment 522, is somewhat independent from power applied to electron source 510, controlled by electron concentration adjustment 512. This independence is heretofore unknown in prior art exhaust line exciters and allows for the independent control over the number of electrons in the beam and the mean and range of electron energies in the beam. Pragmatically however, the concentration of the electrons in the E-beam also may increase, somewhat, with an increase in the potential applied to electron extractor 520 because electron extractor 520 attracts the electrons residing in electron source 510; the greater the attraction, the greater the concentration of electrons that are extracted from electron source 510. To maintain a constant electron density $n_{Ee}$, it might be necessary to lower the driving power to electron source 510 whenever the potential to electron extractor 520 is increased.

The diagram depicted in FIG. 5 is meant as a logical representation of electron beam exciter system 500 and intended to illustrate the logical relationships between components. As such, much of the functionality attributed to separate components may be accomplished by a single device or the logical components may be combined in other ways. For instance, the functions of electron concentration controller 560 and electron energy controller 590 may be performed at a work station or PC computer. Moreover, the functions of emissions processor 572 may be accomplished by a general function spectrometer as is available from Verity Instrument, Inc., of Carrollton, Tex., USA. Furthermore, the functions of electron concentration controller 560, electron energy controller 590 and emissions processor 572 may be performed by a more advanced spectrograph with computational processing features, such as the SD512NIR spectrometer, which is also available from Verity Instrument, Inc.

Figure 6A:
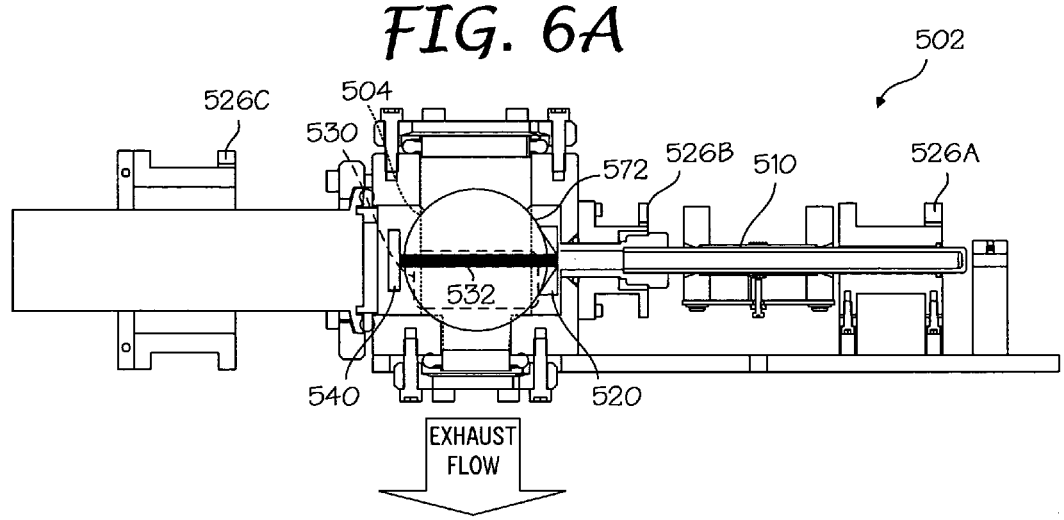
FIG. 6A is a cross-sectional view of E-beam exhaust line 502 and FIG. 6B is an orthogonal view of the present exciter in accordance with exemplary embodiments of the present invention.
Figure 6B:
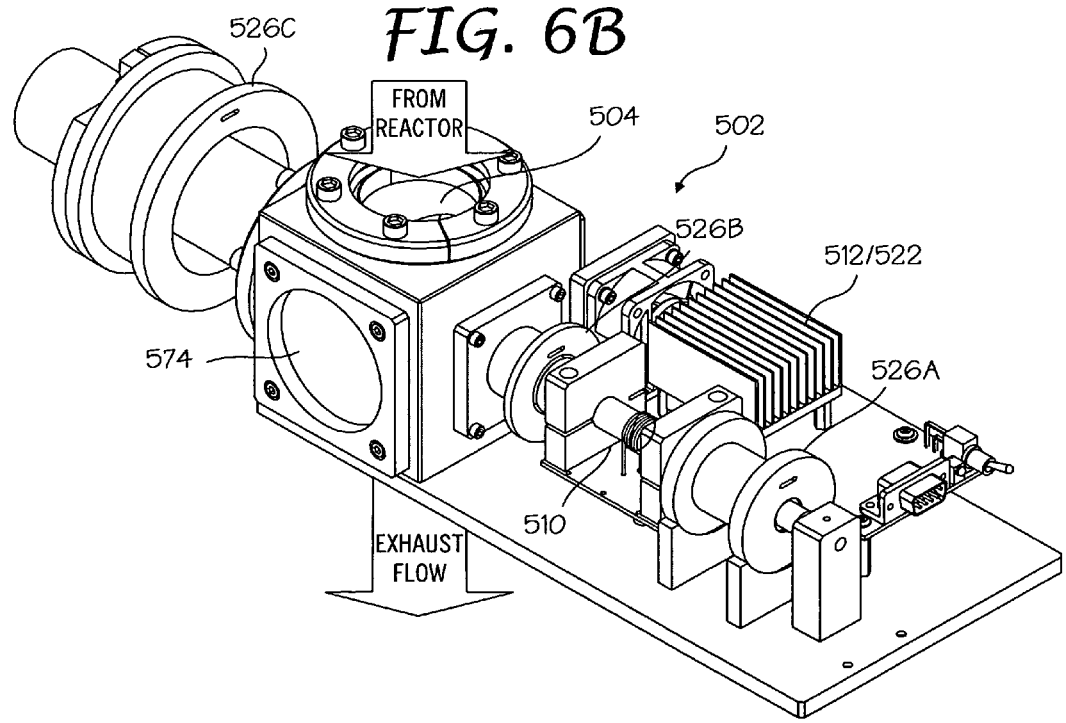

FIGS. 6A and 6B are diagrams of E-beam exhaust line exciter 502 in accordance with one exemplary embodiment of the present invention. FIG. 6A is a cross-sectional view of E-beam exhaust line 502 and FIG. 6B is an orthogonal view of the present exciter in accordance with exemplary embodiments of the present invention. E-beam exhaust line exciter 502 is positioned along an effluent exhaust line downstream of the reactor chamber and upstream of an exhaust line roughing pump. E-beam exhaust line exciter 502 generally comprises electron source 510 and electron extractor 520 for generating E-beam 532 across excitation region 530 for exhaust line 504. Electrons in E-beam 532 are received and counted at beam electron collector and counter 540 (referred to alternatively as the electron collector). Also shown are electronic adjustment components 512/522 for adjusting the power to electron source 510 and the potential at electron extractor 520 (and the collector bias at electron collector 540). Finally, depicted in the figures are ring magnets 526 that force the electrons in the E-beam to move in a helical path around magnetic flux lines and along the beam axis, thereby increasing the likelihood of more collisions with gas particles. This technique is especially useful in increasing the number of electrons that are available in certain types of electron source for extraction, such as an inductively coupled electron source. Electron source 510 and electron extractor 520 are depicted is accordance with one exemplary embodiment, however the present E-beam exhaust line 502 may be practiced in a variety of variations that will be apparent to those of ordinary skill in the art upon reading the present specification. An exhaust flow of effluent gas from a process occurring within a reactor chamber, or the like, flows in the direction of the arrow labeled "Exhaust Flow," in a generally downward direction to the orientation of the figure. In the present configuration of E-beam exhaust line 502, the beam axis of E-beam 532 is perpendicular to the flow of effluent gas with excitation region 530 extending below E-beam 532 in the direction of the gas flow. Excitation region 530 is an area having dynamic flow conditions with effluent moving across E-beam 532 at some discrete flow rate. As the gas particles in the effluent are excited into a higher energy state by the electrons in E-beam 532, the excited electrons transition back in their rest state at some predetermined time period as the effluent moves away from E-beam 532. Depending on a number of factors, the excited gas particles may emit light many millimeters from the beam axis of E-beam 532. This phenomenon will be discussed further below with regard to FIG. 27. Viewport window 574 is positioned in a generally perpendicular orientation to the direction of the effluent flow and E-beam 532, but has an aspect ratio sufficient for observing emission in the entire extent of excitation region 530.

FIGS. 7 through 9C are diagrams depicting an electron accelerator and extractor for extracting electrons from an electron source in accordance with embodiments of the present invention. The purpose of the electron extractor/accelerator is to extract electrons from a cloud of electrons residing in the electron chamber of an electron source and accelerate each of the electrons to a predetermined electron energy level as an electron beam. The electrons egress the electron chamber through an electron extraction hole in the chamber. The primary mechanism for accelerating the electrons into a higher electron energy is through attraction of lower electrical potential electrons to the higher electrical potential across the extractor. The electrons within the electron chamber touch a conductive material within the chamber and assume a known "reference electrical potential" of the conductive material and are then attracted to higher electrical potentials visible through the extraction hole. The reference electrical potential may be any value but is typically referenced at ground in order to avoid electrical perturbations in the reference potential that will result in unwanted fluctuations of the electron energy level in the E-beam. Attaining a constituently stable reference electrical potential is essential for attaining an E-beam of electrons at a constant energy level. The electron accelerator and extractor is a physical structure for holding the electrical potential that attracts the electrons in the source chamber at the reference electrical potential.

Figure 7:
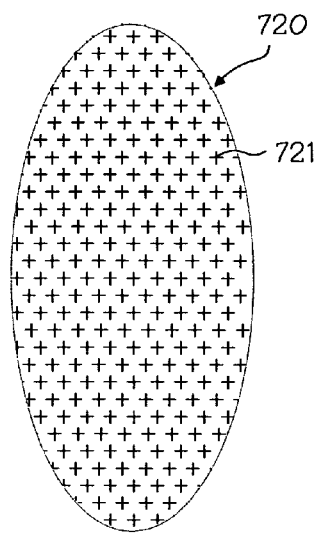
FIG. 7 is a conceptual view of the charge across an electron extractor.

Basically, as depicted in FIG. 7, electron accelerator and extractor 720 hold electrical potential 721 capable of attracting electrons at the reference electrical potential, and that are visible through the extraction hole, and extracting them from the electron chamber through the extraction hole. Ideally, electron accelerator and extractor 720 is a two-dimensional surface of elevated electrical potential that is transparent to the electrons, but that attracts electrons as an E-beam in a direction that is substantially perpendicular to the surface of electrical potential. Electron accelerator and extractor 720 is a variable energy electron accelerator that is capable of varying the energy level of electrons in the electron beam. The greater the difference between the electrical potential of the electron accelerator and extractor 720 and the reference electrical potential of the source chamber, the faster the electrons are accelerated and the higher the energy imparted to the electrons of the E-beam. While electron accelerator and extractor 720 depicts the ideal electron extractor and its fundamental operation, it does not address certain real world deficiencies of the ideal electron extractor, such as focusing the electron beam into a narrow cylindrically shaped beam for concentrating light emission into a compact area of the excitation region, for improved detection of light emissions.

Figure 8A:
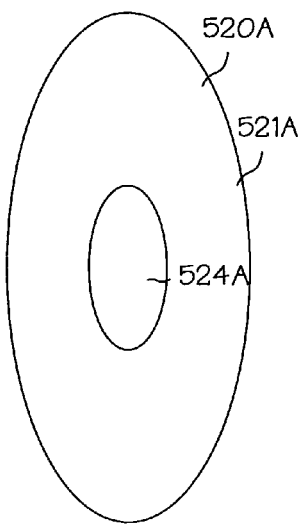
FIG. 8A is a diagram of an electron accelerator and extractor that incorporates electron beam optics for improved electron beam focusing in accordance with an exemplary embodiment of the present invention.

FIG. 8A is a diagram of an electron accelerator and extractor that incorporates electron beam optics for improved electron beam focusing in accordance with an exemplary embodiment of the present invention. Here, single opening electron extractor 520A generally comprises opaque portion of extractor 521A and single circular extraction opening 524A. Single opening electron extractor 520A is formed from a thin sheet of conductive material. Operationally, single opening electron extractor 520A is intended to approximate the two-dimensional surface of electrical potential described above for the ideal electron accelerator and extractor 720, however, single opening electron extractor 520A includes a relatively large opaque portion of extractor 521A and a relatively small single circular extraction opening 524A. Extracted electrons from the electron source cannot traverse the opaque portion of the extractor, but instead only traverse opening 524A. This extractor configuration is intended to concentrate the beam-forming electrons in a relatively narrow area proximate to the beam axis. However, the electric potential applied to opening electron extractor 520A will likely not extend across relative large opening 524A as a homogeneous potential, but instead will be more concentrated at the edge of opening 524A and lower in the center of the opening. Only the large opaque portion of extractor 521A will hold a homogenous surface of electrical potential but will not allow electrons through. Thus, some portion of the electrons extracted from the electron source may collide with the large opaque portion of extractor 521A instead of forming the electron beam.

Figure 8B:
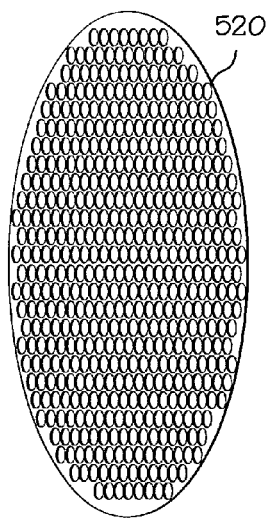
FIGS. 8B through 8D are diagrams of alternative electron accelerator and extractor structures that more properly approximate the two-dimensional surface of elevated electrical potential of the ideal extractor in accordance with exemplary embodiments of the present invention.
Figure 8C:
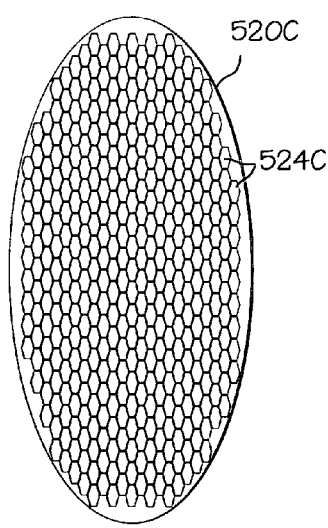
Figure 8D:
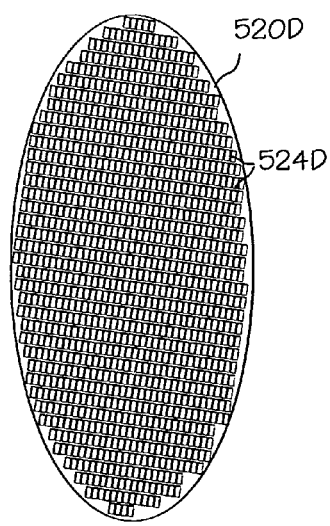

FIGS. 8B through 8D are diagrams of alternative electron accelerator and extractor structures that more properly approximate the two-dimensional surface of elevated electrical potential of the ideal extractor in accordance with exemplary embodiments of the present invention. These structures have no electron beam optics for narrowly focusing, or otherwise forming, the electron beam. Extractor 520B is formed from a thin sheet of conductive material that is opaque to the extracted electrons with a plurality of circular extraction openings 524B that are transparent to the extracted electrons. The open portion of extractor 520B is much larger than single circular extraction opening 524A of single opening electron extractor 520A and allows a greater percentage of the extracted electrons to form the beam. Furthermore, the small hole size allows the potential to form over the surface of extractor 520B more homogeneously, thereby attracting a greater percentage of the extracted electrons to the transparent areas (circular extraction openings 524A). Extractor 520C is similar in structure to extractor 520B as it is also formed from a thin sheet of conductive material that is opaque to the extracted electrons. Disposed within extractor 520C is a plurality of hexagonal extraction openings 524C that are transparent to the extracted electrons. One difference between circular openings 524B of extractor 520B and hexagonal openings 524C of extractor 520C is that the opaque portion of extractor 520C occupies less surface area of the extractor than the opaque portion of extractor 520B, hence it may be possible for more extracted electrons to traverse extractor 520C. Finally, extractor 520D is similar in structure to both extractors 520B and 520C as it is also formed from a thin sheet of conductive material that is opaque to the extracted electrons, however extractor 520D utilizes a screen mesh pattern of square openings 524D rather than circular or hexagonal. It is expected that although the electron transmission properties of each of extractors 520B, 520C and 520D may be similar, their operational performance may vary with the type of electron source selected for use with a particular application. Hence, it may be prudent to investigate the operations performance of each exciter structure with a test gas prior to use. Obviously, if the operation performance characteristics for competing extractor structures are indistinguishable for an application, the more economical extractor solution is preferred. It should also be recognized that certain types of electron sources will react with the gas particles in the effluent and that may result in deposits on the interior surfaces of the E-beam exciter, including the extractor. Furthermore, the E-beam is energetic enough to break the molecular bonds of particles in the effluent that surrounds the extractor which may recombine on the extractor. Therefore, in addition to investigating the typical operational properties of the various extractor structures, their susceptibility to the formation of depositions and etching should also be investigated. There may be cases where a particular extractor structure out performs other candidates, but its performance is rapidly degraded by contaminants from the electron source and/or effluent stream, making it a less desirable selection for a particular application.

The presently described extractor structures are not considered to be an exhaustive list of all possible embodiments. The forgoing discussion is meant only to illustrate exemplary structure embodiments for the presently described electron extractor. Those of ordinary skill in the art will readily understand that other geometric shaped openings may be substituted and that the opening may be arranged across the extractor in a variety of patterns. Furthermore, other geometric shapes of the extractor itself may be employed, such as a ring shape. Additionally, the forgoing discussion highlights the advantages of each structure and the desirability of combining the exemplary embodiments for achieving the benefits of each embodiment. For instance, by utilizing the extractor structure from one of extractors 520B, 520C and 520D within single opening 524A of extractor 520A (not shown) the benefits of a multi-opening extractor may be achieved in combination with the advantageous beam optics of the single opening extractor 520A.

FIGS. 9A-C are diagrams illustrating an extractor structure with beam optics in accordance with another exemplary embodiment of the present invention. FIG. 9A depicts a front view of the extractor, FIG. 9B shows a cross-sectional view of the extractor at line AA and FIG. C shows an orthogonal view of the extractor in accordance with an exemplary embodiment of the present invention. Here, extractor 520 comprises extractor beam focusing cone 528 surrounding cone opening 524. The diameter of opening 524 is shown $D_1$, the diameter of extractor 520 is represented as $D_2$, and the height of focusing cone 528 is $D_3$, where $D_2 > D_1$. Disposed within cone opening 524 is screen 524D with a plurality of square openings, for instance, and as such is essentially transparent to the extracted electrons. The purpose of focusing cone 528 is to force the electrons of the E-beam into a narrow area about E-beam axis 533. This increases the likelihood of electron-particle collisions in the narrow area about E-beam axis 533 and concentrates the light emissions in an area that can be efficiently collected. As depicted, focusing cone 528 may have a linearly shaped cone or may instead focusing cone 528 may have a parabolic shape. The structure of focusing cone 528 and cone opening 524 with screen 524D interacts with the electron source to produce a stable E-beam that achieves reproducible emissions intensities.

FIG. 10 illustrates the geometry of the electron extractor and electron source components of the E-beam exciter in accordance with an exemplary embodiment of the present invention. Focusing cone 528 is identical to that described above with regard to FIGS. 9A-9C. Focusing cone 528 is disposed along E-beam axis 533 at a distance $D_5$ from reference potential surface 516 of electron source 510. Cone opening 524 and electron chamber opening 514 are substantially coaxial with E-beam axis 533. The diameter of electron chamber opening 514 is shown as $D_4$. Preliminary testing indicates that certain E-Beam exciter geometries yield optimal E-beam results. The initial reference dimension is most probably the diameter of the electron source opening, $D_4$. Initially, diameter of extractor 520, $D_2$, should be approximately twice the size of electron source opening 514, $D_4$, ($D_2 \approx 2D_4$). Additionally, the diameter of extractor cone opening 524 should approximate or be slightly larger than electron chamber opening 514 ($D_1 \geq D_4$). Electron extraction from electron source 510 is degraded as the diameter of extractor cone opening 524 gets smaller than electron chamber opening 514 ($D_4 >> D_1$). Also, extractor 520 and electron source 510 should be separated by approximately the diameter of extractor cone opening 524 ($D_5 \approx D_1$). It should be realized that this aforementioned exciter geometry is exemplary and intended to achieve optimal E-beam formation results. There may be instances in which the exemplary exciter geometry achieves less than satisfactory results. For instance, it may be desirable to narrow the E-beam at the expense of electron extraction that might result in change to the exciter geometry inconsistent with the example above.

In accordance with one exemplary geometric configuration, source opening 514 is reduced to a size of approximately 0.10 inch ($D_4 \approx 0.10$ in.) for an ICP-type electron source (discussed below). In so doing, extractor opening 524 in extractor cone 528 can be maintained at approximately 0.2 inch ($D_1 \approx 0.20$ in.). Extractor opening 524 is covered by screen 524D, with a 100 mesh stainless steel screen (73% open). Screen 524D is pressed against the flat side of extractor cone 528 making electrical contact with the extractor electrode. The plane of the screen 524D is spaced 0.10 inch ($D_5 \approx 0.10$ in.) from the flat end of the ICP tube that is mounted flush with the vacuum chamber wall.

As discussed above, the present E-beam exciter provides a mechanism for exciting gas particles in an effluent stream without the use of a plasma generator for inducing the effluent into a plasma. As such, the present E-beam exciter has the advantage of independent control over the electron energy level and the concentration of electrons in the E-beam. Furthermore, the present E-beam exciter is uniquely adaptable for a variety of process applications. FIGS. 11-15 are diagrams depicting several geometric configurations of the present E-beam exciter in accordance with exemplary embodiments of the present invention. It should be appreciated that for many applications the E-beam excited is positioned such that the E-beam extends within the exhaust line. In so doing, it can be assure that the E-beam interacts with the exhaust gases as the E-beam is within the exhaust stream. However, with regard to exhaust environments with highly diffused exhaust gases, the E-beam excited may be positioned within a chamber that is open to the exhaust line and not in the stream of the exhaust. In that case, the highly diffused effluent gases migrate into the E-beam exciter and are excited by the E-beam.

Figure 11:
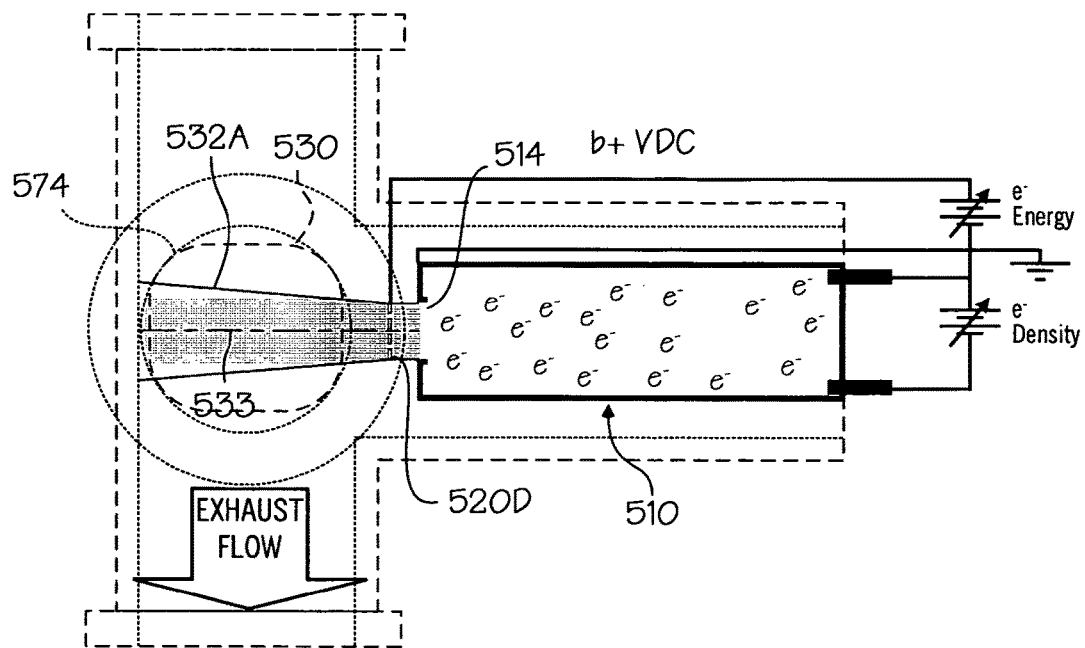
FIG. 11 shows the present exhaust line E-beam exciter configured for observing the emissions behind the electron exciter in accordance with an exemplary embodiment of the present invention.

FIG. 11 shows the present E-beam exciter configured for observing the emissions behind the electron exciter in accordance with an exemplary embodiment of the present invention. Here, E-beam exciter comprises electron source 510 with chamber opening 514 coaxially aligned with beam axis 533. The electron chamber of electron source 510 is referenced to a ground electrical potential. Electron source 510 is electrically coupled to a variable electron density excitation source for adjusting $n_{Ee}$ by adjusting the excitation power to electron source 510. Screen extractor 520D is also coaxially aligned with beam axis 533 and positioned between the gas flow and electron source 510. Screen extractor 520D is electrically coupled to a variable energy electron extractor potential for altering the energy level of the electron in the E-beam by adjusting the electrical potential of screen extractor 520D. With an electrical potential across screen extractor 520D, an E-beam with beam pattern 532A is generated along beam axis 533. It is expected that the electrons are at their maximum energy level as they traverse screen extractor 520D and lose energy as they travel across the gas stream. However, because screen extractor 520D is in close proximity to electron source 510, and the electrons contained therein, this geometric imparts significant energy to the electrons. Notice that beam pattern 532A is slightly conical due to the electrons in the E-beam dispersing somewhat behind in screen extractor 520D. Viewport window 574 exposes light collector optics (not shown) to excitation region 530 where the energized electrons of the E-beam interact with gas particles in the flow.

Figure 12:
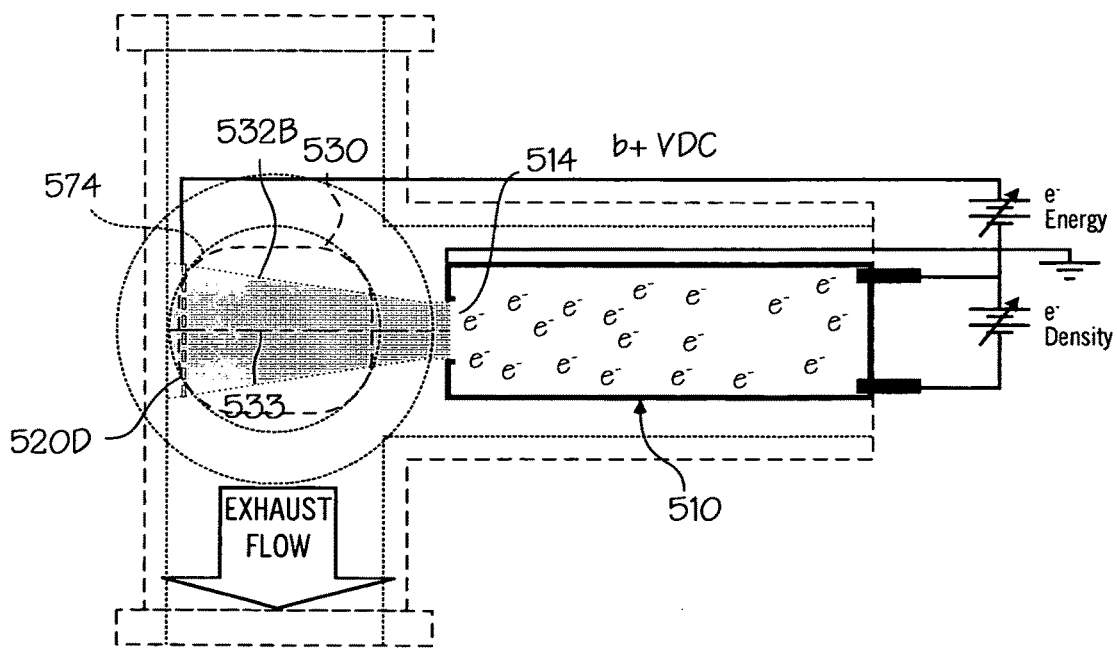
FIG. 12 shows the present exhaust line E-beam exciter configured for observing the emissions in front of the electron exciter in accordance with another exemplary embodiment of the present invention.

FIG. 12 shows the present E-beam exciter configured for observing the emissions in front of the electron exciter in accordance with another exemplary embodiment of the present invention. The geometry of the E-beam exciter is identical to that shown in FIG. 11 with the exception of the placement of screen extractor 520D, which is located opposite the gas stream from electron source 510. With this configuration, excitation region 530 is between screen extractor 520D and electron source 510. Notice that beam pattern 532B is somewhat more conical than beam pattern 532A, where the extractor is proximate to the electron source. This spreading is primarily due to the diameter of screen extractor 520D and longer distance between the extractor and electron source. It is doubtful that the energy level of the electrons in the E-beam can reach the level of the previously discussed embodiment because the electrons achieve their maximum energy level as they traverse screen extractor 520D. Since the extractor is behind excitation region 530, the energy level of the electrons in excitation region 530 will be lower. Furthermore, because the electrons are being accelerated across the width of excitation region 530, it is possible that different species in the gas may be excited at different lateral positions along the extent of beam axis 533. Thus, it may be possible to simultaneously detect species by the lateral position of the light emissions by spatially resolving sampling locations along the lateral extent of the E-beam. Since the lateral position of the light emission along beam axis 533 is dependent on the species and the energy levels of the electrons at lateral positions on the beam, the electrical potential seen by the electrons at screen extractor 520D, should be absolutely stable to prevent the light emissions from spatially migrating along the beam. This may be problematic because of the beam direction and the close proximity of screen extractor 520D to excitation region 530. It is expected that the E-beam will react with the gas particles and that some of the resultant reactants may deposit on screen extractor 520D, thereby lowering the electrical potential at screen extractor 520D that attracts the electrons.

Figure 13:
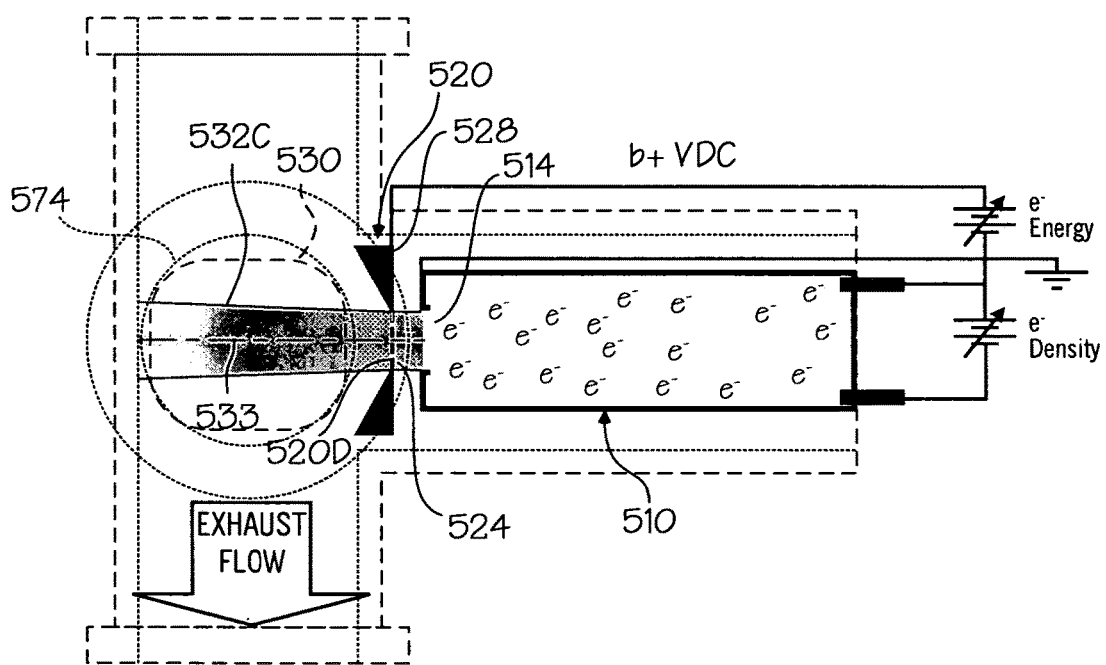
FIG. 13 depicts the present exhaust line E-beam exciter configured with a beam optics containing the E-beam in accordance with another exemplary embodiment of the present invention.

FIG. 13 depicts the present exhaust line E-beam exciter configured with a beam optics containing the E-beam in accordance with another exemplary embodiment of the present invention. The geometry of the E-beam exciter in FIG. 13 is identical to that shown in FIG. 11, with the inclusion of electron extractor/accelerator and beam optics 520. Here, electron extractor 520 is configured with beam focusing cone 528 and screen mesh 524, similarly to that discussed with regard to FIG. 10 above. The benefit of beam focusing cone 528 is seen diagrammatically with the narrowing of beam pattern 532C.

Figure 14:
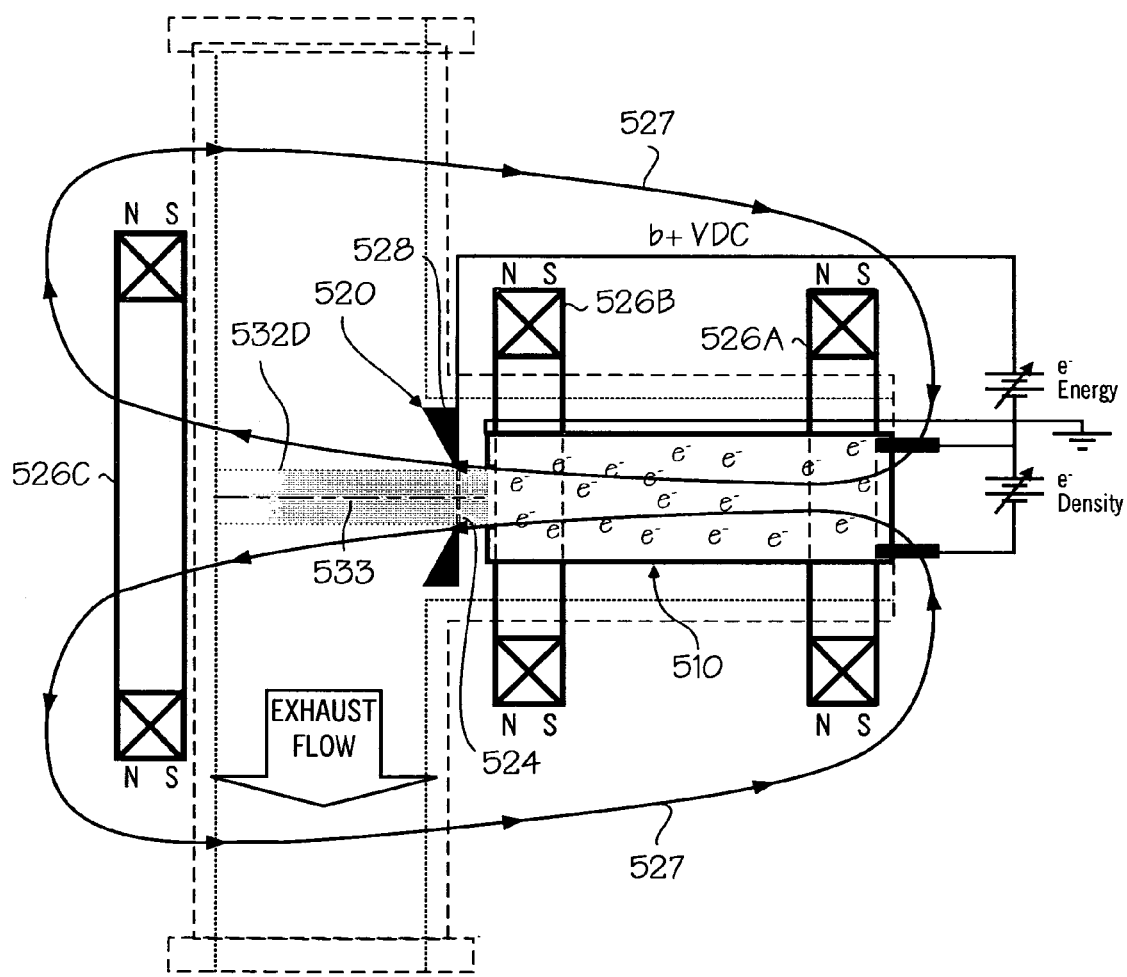
FIG. 14 depicts the present exhaust line exciter with ring magnets for focusing the E-beam in accordance with another exemplary embodiment of the present invention.

Aside from constraining the electrons into a narrower E-beam pattern for concentrating light emission from collisions, establishing a magnetic field with flux lines parallel to the beam axis may increase the number of electron-particle collisions proximate to the beam axis, thereby concentrating the light emissions proximate to the beam. The coaxial placement of magnets along beam axis 533 is shown in FIG. 14. There, ring magnets 526A, 526B and 526C are disposed along beam axis 533; end magnet 526A adjacent to electron source 510, extractor magnet 526B proximate to extractor 520, but on the opposite side of electron source 510 from end magnet 526A and finally collector magnet 526C is located on the opposite side of the gas line from the other two magnets. Magnetic flux lines 527 result from the placement that are nearly parallel down the length of electron source 510. Electron resonance with the magnetic field will cause the electrons to circle around the magnetic flux lines in a helical path, thereby increasing the likelihood of an electron-particle collision.

Figure 15:
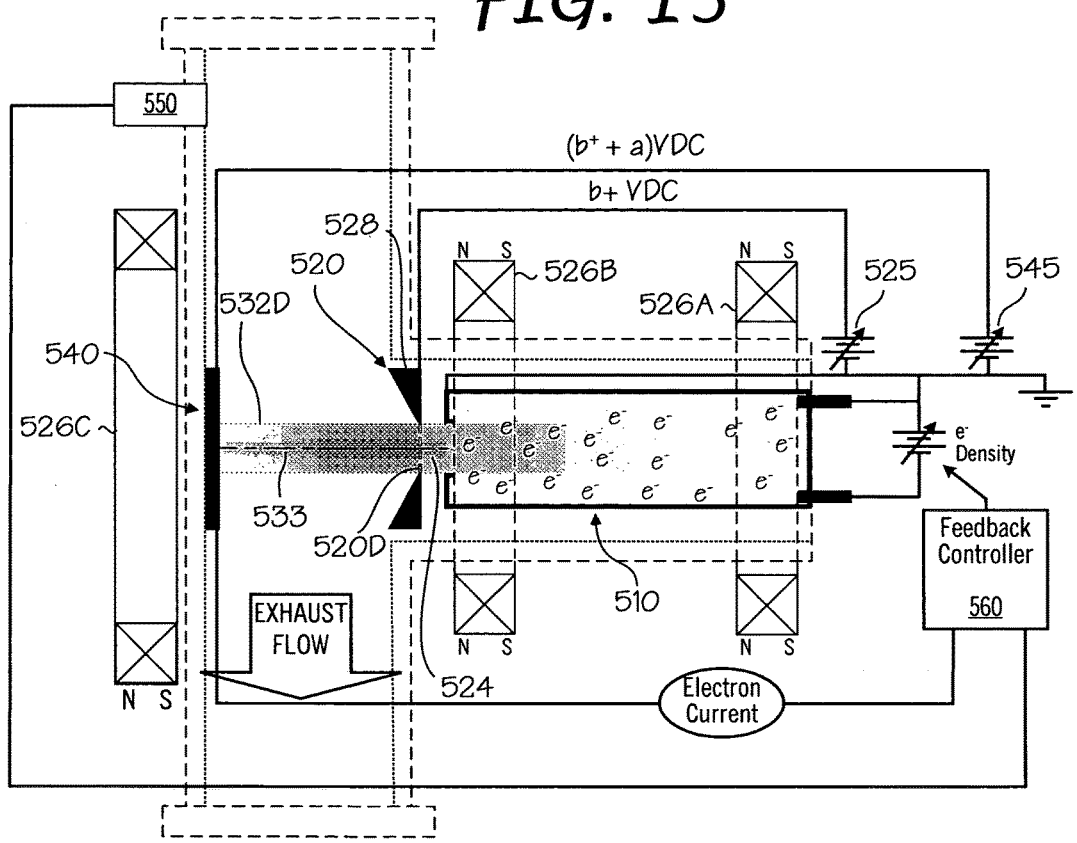
FIG. 15 depicts the present exhaust line exciter with the addition of a beam electron collector and counter for measuring the concentration of electrons in the E-beam and a feedback controller for receiving concentration information from the beam electron collector and making exciter power adjustments to the electron source in accordance with another exemplary embodiment of the present invention.

FIG. 15 depicts the present exciter with the addition of a beam electron collector and counter for measuring the concentration of electrons in the E-beam and a feedback controller for receiving concentration information from the beam electron collector and making exciter power adjustments to the electron source in accordance with another exemplary embodiment of the present invention. This embodiment provides a mechanism for measuring the concentration of electrons in the E-beam, and the measurement is independent of excitation power delivered to the electron source. Therefore, and in contrast with prior art exhaust line exciters, it is possible to measure the $n_{Ee}$ reaching the electron collector and counter electrode and not merely measuring the excitation power used for exciting the effluent. Here, E-beam exciter comprises electron source 510 with chamber opening 514 coaxially aligned with beam axis 533. The electron chamber of electron source 510, or some other part that the electrons can contact, is referenced to a ground electrical potential. Electron source 510 is electrically coupled to a variable electron density excitation source for adjusting the concentrations of electrons in the E-beam by adjusting the excitation power to electron source 510. Screen extractor 520D is also coaxially aligned with beam axis 533 and positioned between the flow of the effluent in the gas line and electron source 510 along beam axis 533. Screen extractor 520D is electrically coupled to variable extractor potential source 525 for altering the energy level of the electron in the E-beam by adjusting the electrical potential of screen extractor 520D. With an electrical potential across screen extractor 520D, an E-beam with beam pattern 532A is generated along beam axis 533. Notice from the diagram, and as discussed above with regard to FIG. 11, the energy electron extractor potential can be varied independently from the electron generation excitation power. It is expected that the electrons are at their maximum energy level just subsequent to traversing screen extractor 520D and probably lose energy as they travel across the gas stream. However, because of screen extractor's 520D close proximity to electron source 510, and the electrons contained therein, this geometric imparts significant energy to the electrons in the E-beam.

In addition to the foregoing, the present E-beam gas line exciter comprises beam electron collector and counter 540 for measuring the concentration of electrons in the E-beam reaching the electron collector electrode. Beam electron collector and counter 540 (electron collector 540) is a Faraday cup electrode that generates an electron current (e⁻ current) proportional to the number of electrons colliding with the electrode. While other geometries for the electron collector are possible, in accordance with one exemplary embodiment, electron collector 540 is a disk positioned along beam axis 533 on the opposite side of, at least a portion, of the effluent stream. The e⁻ current may be monitored for verifying the $n_{Ee}$ in the E-beam. If the density drifts, the operator can take immediate action to correct the drift. More particularly, the e⁻ current may be used as feedback for automatically adjusting the excitation power allied to electron source 510, without intervention. Here, feedback controller 560 receives an e⁻ current from electron collector 540 that is proportional to the density of the electron in the E-beam at electron collector 540. Using the electron current, feedback controller 560 adjusts the excitation power to electron source 510 to maintain the electron current within some operational range for the particular application. If the current drops below a reference electron current range, feedback controller 560 increases the excitation power to electron source 510. If it rises above the reference electron current range, feedback controller 560 decreases the excitation power to bring the measured electron current within the reference electron current range. In either case, electron collector 540, in combination with feedback controller 560, provides a means for alerting the operator of any condition that is outside an operating range of electron densities regardless of whether or not the condition is corrected automatically by feedback controller 560. Hence, using electron collector 540 and feedback controller 560, in combination with other components of the E-beam exciter system, enable the formation of an E-beam with a precise electron density, for the excitation of effluent gases, and furthermore enable an accurately controlled electron density during operation.

It should be understood that although the electron collector/feedback controller improvement to the present invention has been described with regard to maintaining an E-beam with a stable and constant $n_{Ee}$, the ability to independently monitor $n_{Ee}$ enables $n_{Ee}$ adjustments to accommodate changing operating conditions in real-time. The ability to adjust $n_{Ee}$ in order to maintain constant emissions light intensity across a range of operating conditions has been heretofore unknown. Prior art exhaust light emissions intensity measurements were highly susceptible to changes in operating conditions that also affected the magnitude of the light emissions. These features will be discussed in greater detail below with regard to the exemplary operating modes for the present gas line E-beam exciter.

With further regard to the geometry of the E-beam exciter and more particularly the positioning of the electron collector 540, in accordance with some exemplary embodiments of the present invention (for instance, those described with regard to the geometry of FIG. 11), electron extractor 520 may be positioned approximately one centimeter from electron source 510 and electron collector 540 positioned approximately three centimeters from electron collector 540 (four centimeters from electron source 510). However, it is expected that the optimum separation between the two electrodes for this geometry will be a function of operating pressure in the exhaust line. Alternatively, both electron extractor 520 and electron collector 540 may be positioned opposite the gas flow from electron source 510 (for instance, those described with regard to the geometry of FIG. 12). In that case, electron collector 540 will be positioned much closer to electron extractor 520, perhaps within only a few millimeters, and electron extractor 520 positioned two or more centimeters from electron source 510.

Typically, electron collector 540 will be somewhat larger than electron extractor 520, for instance the diameter of the collector electrode may be twice that of the extractor electrode in order to present an appropriately large target for the electrons in the E-beam. It should be appreciated, however, that the size of electron collector 540 is dependent on the spacing between electron extractor 520 and electron collector 540. As the spacing increases, the diameter of electron collector 540 should also increase for an identical proportion of E-beam electrons to strike the collector electrode. Also, while the structure of electron collector 540 has not been discussed in any great detail, it may be configured in various shapes other than a plane in order to accommodate the E-beam and other factors. These geometric shapes include, for instance, cups, cones, cylinders and combinations of the above.

In some situations, the electron current generated at electron collector 540 may slightly differ from the number of electrons delivered by the E-beam. That difference is a function of: the number of electrons lost through scattering with atoms or molecules, the number of electrons combining with ions in the scattering region; and the number of electrons deflected by an electron space charge. A more accurate electron count may be achieved by drawing the electrons toward the collector electrode.

Therefore, in accordance with still another exemplary embodiment of the present invention, an optional bias voltage is applied to electron collector 540 by a variable bias collector source. The bias voltage creates an electrical potential difference between electron collector 540 and electron extractor 520 that energizes the electrons from E-beam 532 in the direction of electron collector 540. Establishing an electrical potential across electron collector 540 has at least two advantages over using an electron collector without a potential. First, the increased electrical potential tends to pull the electrons from the region between the extractor electron toward the collector electrode, i.e., the electrical potential attracts more electrons toward the electron collector for counting, resulting in a more accurate $n_{Ee}$ measurement of the E-beam at electron collector 540; and second, the increased electrical potential at the collector electrode tends to constrain the electrons along the beam axis 533, the result is fewer electrons lost through deflections and scattering, and more electron-particle collisions near the beam axis and brighter, or more concentrated, light emissions near the beam axis that are easier to detect. Additionally, in some cases where the energy of the electrons has diminished below where they might excite a target species, the increased electrical potential at the collector re-energizes the electrons to a level necessary for exciting the species and reduces the number of low energy electrons that are available to combine with neutrals or ions.

Figure 16:
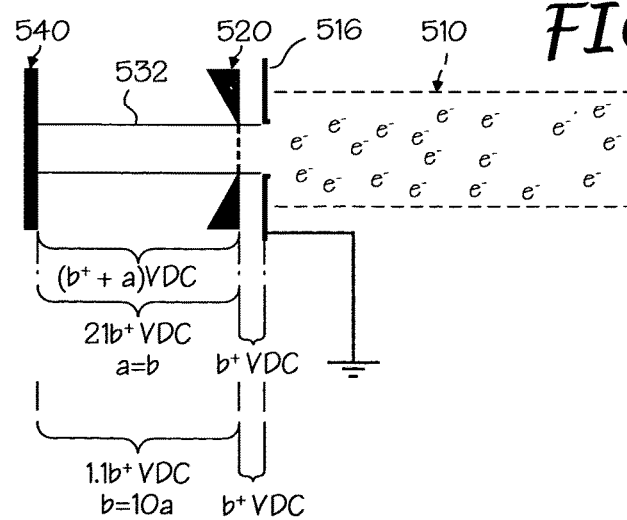
FIG. 16 is a cross-section view of an E-beam exciter with a collector electrode for monitoring electron concentration of the E-beam in accordance with one exemplary embodiment of the present invention.

The precise voltage necessary to accomplish electron collection for density measurements is a function of the particular application in which the collector is employed and the operating parameters for the application. Conceptually however, and as depicted in FIG. 16, electrons are extracted from the electron source by forming an electrical potential across electron extractor 520. Recall that electrons generated in electron source 510 assume a reference electrical potential near ground voltage, and this reference potential may be applied across reference potential surface 516 that is proximate to the extraction opening of source 510 and is approximately parallel with (and sometimes coextensive to) the planer back surface of the extraction electrode (for instance electron extractor 520). The difference between the reference potential and electrical potential across electron extractor 520 determines the electron energy of E-beam 532 (the electron energy of the E-beam will be referred to $E_{Ee}$ hereinafter). More correctly, $E_{Ee}$ of the E-beam is a mean electron energy for the beam. As will be discussed below, an electron source generates electrons within a range of energies (the electron energy distribution for the source) and the extractor accelerates that range of energies to another energy state, the mean of which is $E_E$. The extractor electrical potential may be created by applying a voltage ($b^+$VDC) to the extractor electrode, electron extractor 520 (the magnitude of the extraction electrode voltage normally is kept low, usually in a range between 10 VDC and 50 VDC, for safety reasons, but may be several hundred volts). In order for the electrons that traverse the extractor's electrical potential to be drawn toward the collector electrode, the bias voltage applied to the collector electrode is usually higher than the extractor voltage. Hence, the bias voltage applied to the collector electrode is usually greater than b+VDC, for instance ($b^+$+a VDC). Note also that the collector bias voltage '$b^+$+a VDC' may be swept from positive to negative potentials such that the precise energy distribution of the electrons can be ascertained.

The magnitude of the electrical potentials at the different electrodes and the difference between the electrical potentials of the electrodes is a function of the geometry for the E-beam exciter and the operating parameters for the particular application. For instance, in situations where electron extractor 520 is the primary acceleration source for energizing the electrons in the E-beam, the electrical potential at electron collector 540 will be only slightly greater than the potential at electron extractor 520 ($b^+ \approx 10a)b^+ + a$ VDC≈$1.1b^+$VDC. Alternatively, if more control over the electron beam is desired after it traverses electron extractor 520, or if it is desirable to increase the energy or re-energize the electrons in the E-beam from electron extractor 520, the bias voltage applied to electron collector 540 may be substantially higher than that applied to electron extractor 520 (e.g., ($b^+$+a) VDC≈$21b^+$VDC, a≈$20b^+$). It is expected that the E-beam electrons will achieve their maximum energy level as they traverse electron extractor 520 and lose energy as they travel across the gas stream. The loss of $E_{Ee}$ as a function of the distance from the extractor electrode is more pronounced in systems operating at higher gas pressures; the mean free path of the electron shortens as pressure rises. At very high pressures, it is necessary to substantially increase the collector bias voltage to create an electric potential that will re-energize the electrons after collisions with gas particles. The positive voltage tends to pull the electrons across the expanse between the extractor electrode and the collector electrode. The collector bias voltage may be increased tens or hundreds of volts to achieve this result.

As mentioned above, a ($b^+$+a) DC voltage is applied to electron collector 520 to create an electrical potential across the collector and attract electrons to the collector. The electrical potential is the force that influences the movement of the electrons in the E-beam and should remain constant over time to ensure accurate and reproducible density measurements (which are needed to ensure light intensity observations are reproducible). However, the electrical potential at the electrode is not measured directly. Instead, the electrical potential at the electrode is presumed to be constant if a constant voltage is applied to the electrode over time. Typically, there is no feedback from the electrode to verify that the magnitude of electrical potential at the electrode or its stability. One mechanism to overcome the lack of a measurement is to calibrate the energy of the electrons with the potential to the collector electrode. It is possible to sweep the extractor voltage and the collector bias voltage in such a manner as allow the direct measure of electron energy distribution in the E-beam.

As discussed immediately above and throughout, a linear correlation exists between the measured Faraday cup current ($e^-$ current) at electron collector 520 and the intensity of the OES spectra (see for instance the correlation between $e^-$ current in light intensities between time $t_5$ and $t_9$ in FIG. 36 where the E-beam energy is constant. Hence, the Faraday cup current can be used as feedback to make coarse adjustments to the RF power delivered to the electron generator, there changing the electron concentration at the pin hole electrode of reference potential surface 1916, which brings the Faraday cup current back to target and restores the original OES signal intensity. Limited by the resolution of the RF power adjustment, it is sometimes difficult to precisely control the Faraday cup current target value. Any small error in the Faraday cup current also affects the OES signal intensity. In accordance with another exemplary embodiment of the present invention, one solution to this perceived error in the OES signal is to normalize the OES signal with the measured Faraday cup current, we were able to correct the OES intensity to its target value. When applied in real time, normalizing the OES signal with the Faraday cup current significantly reduces noise in the OES signal.

Figure 17:
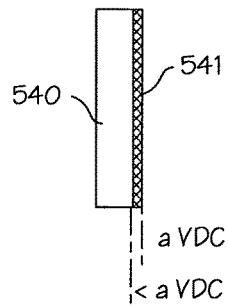
FIG. 17 is a cross-section view of a collector electrode depicting the accumulation of residue on its surface.

One problem associated with maintaining a constant electrical potential across electron collector 540 is that, due to the proximity of electron collector 540 to the collisions between electrons and complex gases, as well as the direction of the E-beam, a residue from the molecular fragments and atoms may be attracted to and recombine on the surface of electron collector 540, see FIG. 17. The accumulation of residue 541 across surface of electron collector 540 will tend to reduce the magnitude of the electrical potential at the collector electrode without having any noticeable affect on the bias voltage applied to the electrode. Any change in the electrical potential at the collector electrode will result in a corresponding change in the number of electrons that are drawn toward the electrode of electron collector 540 and that will change the electron current generated used for density measurement. On the other hand, the bias electrical potential at electron collector 540 constrains the E-beam close to the beam axis, and/or to increase the energy of the electrons in the E-beam. The accumulation of depositions 541 across electron collector 540 will adversely affect the beam optical character of the electrical potential as well it ability to energize electrons because a reduced electrical potential will have a correspondingly lower influence on the electrons.

Figure 18C:
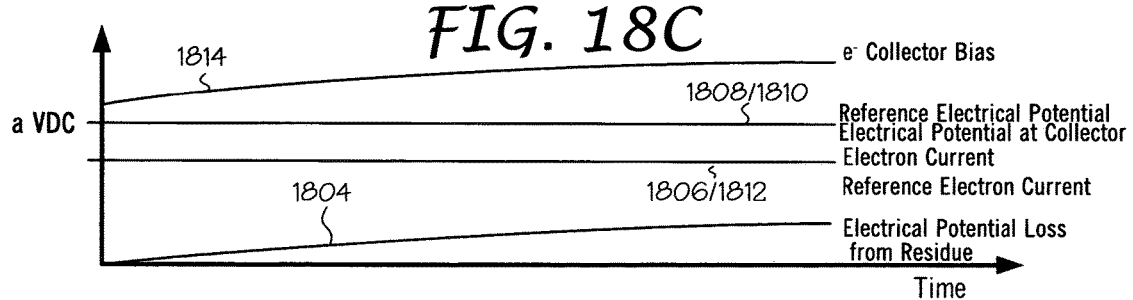
FIGS. 18A through 18C show the result of the accumulation of residue on the collector electrode.
Figure 18B:
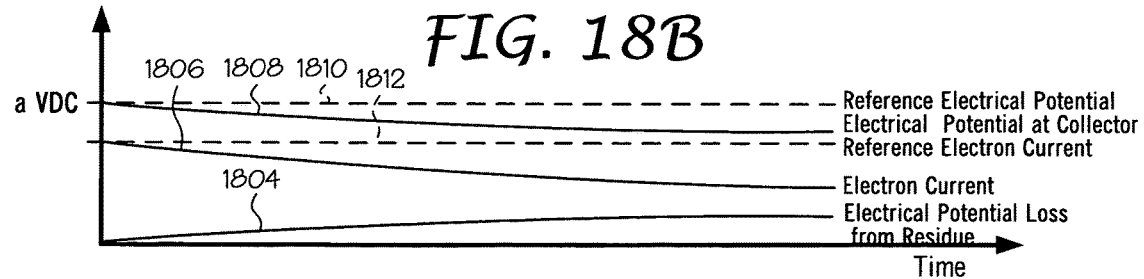
Figure 18A:
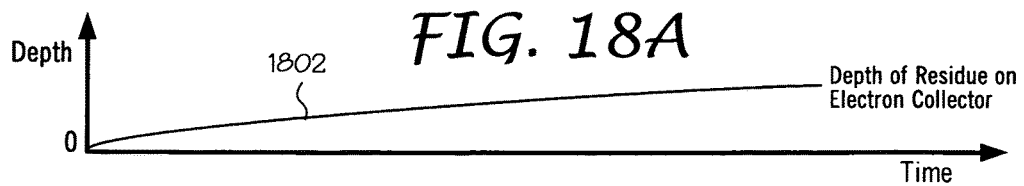

FIGS. 18A-18C diagrammatically represent the affects of residue on the present electron collector. FIG. 18A shows accumulation depth 1802 of residue 541 over time. Obviously, the longer electron collector 540 is exposed to the depositional environment of the excitation region of the exhaust line, the deeper the deposition of residue 541 will accumulate on electron collector 540. The diagram depicts a clear relationship between time (more particularly the time that the electrode is exposed to the deposition forming contaminants) and the depth of residue across collector 540.

Optimally, the electrical potential 1808 at the collector electrode should remain constant at some reference electrical potential 1810 for the bias voltage applied to the collector electrode (as shown in FIG. 18C). Similarly, electron current 1810 generated by electron collector 540 should remain constant at some reference electron current 1812 for a specific $n_{Ee}$. Maintaining these two relationships help ensure that the emissions measurements are accurate and reproducible. FIG. 18B demonstrates how residue 541 forming across collector 540 affects the electron current. The accumulation of residue 541 on the collector electrode decreases collector electrical potential 1808 with respect to reference electrical potential 1810. The magnitude of the reduction in collector electrical potential 1808 is shown separately as electrical potential loss 1804. This results in fewer electrons being drawn to and counted by electron collector 540, resulting in a deviation in electron current 1806 from reference current 1812. Any deviation in electron current 1806 is understood by the electron current feedback components (electron collector/controller/adjustment 540/560/512) as a decrease in the $n_{Ee}$ and is compensated by increasing the excitation power to electron source 510. However, in this case, the reduction in the electron current is due to deposits forming on the collector electrode and not to a change in the electron density.

The reduction in collector electrical potential 1808 is a result of a decrease in electrical potential 1804 due to residue 541. This ensures that the electron current generated by the collector electron is not influenced by changes in the electrical potential and hence, with a constant electron density, electron current 1806 tracks reference current 1812 (shown in FIG. 18C). These conditions should be verified during a calibrations run. Such calibration runs could make use of the applied potentials on the extractor and collector such to allow the measure of the electron energy. However, from FIG. 18B it is apparent that, for at least one possible case, the reduction in electrical potential 1804 from the residue is proportional, or otherwise related to the depth of residue 541 even though the bias voltage applied to electron collector 540 is held constant.

The relationship between accumulation depth 1802 of residue 541 and bias voltage 1814 applied to electron collector 540, with respect to reference electron current 1812, should be determined in a test run for the application. The aim of the calibration run is to ascertain a correction for the collector bias voltage that offsets the weakening in the electrical potential of the collector caused by the accumulation of residue 541. During the calibration run, all operating conditions are held constant, with the exception of residue 541 accumulating on the surface of collector electrode 540. Any adjustments to $n_{Ee}$ are determined from light intensity measurements, that should remain constant, rather than the electron current. After that, any change in the electron current is attributable solely to the accumulation of residue that changes the electrical potential of the collector electrode. The drift in electron current is corrected back to a reference electron current by adjusting the collector bias voltage. These corrections to the collector bias voltage are recorded with respect to operating time in order to produce a time-based collector bias voltage correction algorithm. The resultant collector bias voltage (a VDC) will be in a form similar to bias voltage 1814 in FIG. 18C. This technique, and the resulting time-base collector bias voltage correction algorithm makes four assumptions: 1. $n_{Ee}$ remains constant during the calibration run; 2. changes in the intensity of the light emission during calibration are due entirely to the residue masking the electrical potential to the electrons in the E-beam; 3. The electron current accurately represents that number of electrons that strike the collector, i.e., all electrons penetrate the residue into the collector electrode; and 4. depositions on the collector are of the same composition and accumulate at an identical rate in a production run as in the calibration run.

As may be appreciated from the forgoing, depositions forming on electron collector 540 are problematic. One solution is to use the time-based collector bias voltage correction algorithm discussed above. Clearly, however, this algorithm makes many assumptions that ultimately may not hold true for a production run. Therefore, a more desirable solution is to protect electron collector 540 from residue accumulation, however because electron collector 540 should be located proximate to the source of the deposition, relocating the collector is not practical. Alternatively, the depositions on electron collector 540 may be periodically cleaned before the accumulation degrades the performance of the E-beam exciter. Removing a light accumulation of depositions from the surface of the electrode may be possible by reversing the bias voltage applied to electron collector 540 between duty cycles (or in the de-energized portion of the duty cycle) or during system clean cycles in the main system. Reversing the bias voltage on the collector electrode creates a potential difference with the reference potential surface. Depositions on the collector are sputtered back, or otherwise returned into the gas stream. The availability of the reverse bias voltage solution for a particular application depends on a number of factors including the susceptibility of the process to contaminates from the gas stream, the location of the E-beam exciter on the exhaust system (proximity to the reactor chamber) and the operating parameters (e.g., flow and pressure ranges). Operation of an E-beam clean cycle during the main system clean cycle allows the addition of appropriate chemistries that assist the removal of the deposited layer. Furthermore, this solution also presumes that the collector bias voltage is an accurate indication of the electrical potential across the collector that influences electrons in the E-beam.

Therefore, one alternative is to monitor the magnitude of the electrical potential across electron collector 540 (in a similar fashion as using the electron collector to measure electron density independently from the excitation power, discussed above). It may be difficult to monitor the collector electrical potential directly, however the electrical potential establishes an electric field and it is the electric field that influences the movement of electrons. The electrical potential may be monitored independently from the bias voltage applied to the collector electrode. Furthermore, the intensity of this electric field may be monitored directly. By placing a field measurement electrode (not shown) proximate to and upstream of electron collector 540, a real-time intensity of the electric field may be monitored that corresponds to the magnitude of the collector electrical potential that influences the movement of electrons in the E-beam. Hence, the bias voltage applied to electron collector 540 can be adjusted by using feedback from the field measurement electrode to regulate the intensity electric field within an operational range for a particular application (similar to using the collector feedback loop for correcting the density of the electrons in the E-beam). Using the field measurement electrode may produce a more accurate correction for the bias voltage than the time-based bias voltage correction algorithm, that makes many assumptions, or than assuming that the collector bias voltage is always an accurate indication of the electrical potential across the collector.

The application of field measurement electrodes for monitoring electric fields associated with the present E-beam exciter may also be applied to monitoring the electric field that results from the electrical potential across electron extractor 520. As discussed above, the energy level of the electrons extracted from electron source 510 is dependent on the difference in the electrical potential at electron extractor 520 and a reference potential at electron source 510. The operational range of the voltage applied to electron extractor 520 that is necessary to excite a particular species may be determined forehand in a calibration run with the species. It is assumed that the relationship between the electrical potential across electron extractor 520 and the operational range of the voltage applied to electron extractor 520 (needed to generate the potential) will not change during the production run. It is, however, possible that some of the same factors that cause depositions to form on electron collector 540 are present within electron source 510, depending on the type of source selected for use with the application, resulting in a depositional layer forming over, for instance, the extractor screen. If that occurs, the potential across electron extractor 520 may be diminished and the extracted electrons may not attain their expected energy levels. This situation may be rectified by monitoring the electric field at electron extractor 520, directly, rather than using the potential applied to the extractor as the metric for determining $E_E$.

The range of electron densities, as is the electron energy distribution, is functions of the type of excitation method used to generate electrons for E-beam exciter. One particularly common type of excitation method known in the prior art is by using a plasma (in accordance with exemplary embodiments of the present invention, plasma methodologies are used to generate electrons and not to excite the effluent gases for producing light emissions). By their nature, plasma based excitation methods will produce a wide range of electron energies. The Maxwell-Boltzmann distribution is often applied as an approximation of the energy range. The collision of higher energy electrons with the gas species is the primary mechanism by which particles (molecules, molecular fragments and atoms) are excited to fluorescence. Because a small number of electrons are in the high-energy tail of the electron energy distribution, small changes in the electron energy distribution can cause large changes in the amount of light produced by electron collisions with the other plasma species, most commonly gas molecules. The more energetic electrons have sufficient energies to break molecular bonds. If the resulting molecular fragment then collides with another high energy electron, even smaller molecular fragments and atoms can be generated. That is the reason that continuous (CW) excitation methods produce higher emission from atomic and smaller molecular fragments (for example C, F, CF, and SiF in a fluorinated etch chemistry) and relatively lower emission from the parent molecules ($CF_4$ and $SiF_4$ in the example fluorinated etch chemistry) making them hard to detect. In addition, the molecular fragments may coalesce and contaminate the surfaces of prior art exciter systems, including the system electrical ground and the optical detection window. The low gas flow in a downstream prior art exciter plasma exciter, that is located in a blind-end vacuum tube attached to the side of the main vacuum system, promotes polymer deposition in all directions equally. Contaminated surfaces will change the amount of light detected. A contaminated electrode can change the electrical impedance to ground which in turn will lower the electron energy distribution function (EEDF) and thus change emission. Contamination coating the excitation tube for an RF ICP will change the RF energy transfer to the gas changing the excitation efficiency. A contaminated optical window will reduce the amount of emitted light transmitted to the detector. These multiple causes for change in prior art RF ICP sensor performance make it very difficult to maintain low fluorescence signal variance over time. Emission instabilities caused by the exciter will appear as noise in the OES endpoint trace or fault detection signal.

By contrast, the present E-beam exciter generates the electrons in a separate electron source. The electron gas in the electron source contacts a conductive surface held at reference potential and the electrons assume a set potential relative to the reference potential. Electrons are extracted from the source using an electron extractor set at a higher potential extractor than the reference. As may be appreciated, the basic requirements of an electron source for use with the present E-beam exciter are extremely manageable. Plasma and non-plasma methods exist that may be used to generate the electrons in the electron source. These include, but are not limited to, radio frequency inductively coupled plasma (RF ICP), RF capacitively coupled plasma (RF CCP), microwave cavity discharge, heated electron emissive materials ($LaB_6$, Thoriated-tungsten, etc.), and forced electron emission techniques (x-rays on surfaces, etc.).

Optimally, an electron source generates a high density of electrons in such a way as to minimize the energy distribution of the electrons. By starting with a narrow energy distribution, the resulting energy distribution of the E-beam will also be correspondingly narrow. A narrow electron energy distribution is extremely useful in exciting only selected species in the gas to selected energy states and may allow for control of it if and when molecular fragmentation results in the excitation region. A hollow cathode is an ideal method for generating electrons at reasonably low energies and with a narrow distribution of energies. However, the hollow cathode method suffers from other shortcomings that make it undesirable for certain applications. Another type of plasma electron source is a Radio Frequency Inductively Coupled Plasma (RF ICP). The energy distribution of electrons generated by the ICP is slightly wider than that of a hollow cathode. Therefore, it may be appreciated that the type of electron source selected for a particular application depends on matching the operational parameters of the source with the operational conditions for the particular application. In short, no one type of electron source may be perfect for every possible application and, therefore, the unique advantages and shortcomings of each type of electron source should be considered for a particular application. Below is a discussion of several exemplary types of electron exciters that may be useful for use with the presently described E-beam exciter. This discussion is not meant as an exhaustive discussion of every possible type of electron source, but instead is meant to serve as a template for use in accessing one type for exciter from another for a particular application.

Figure 19A:
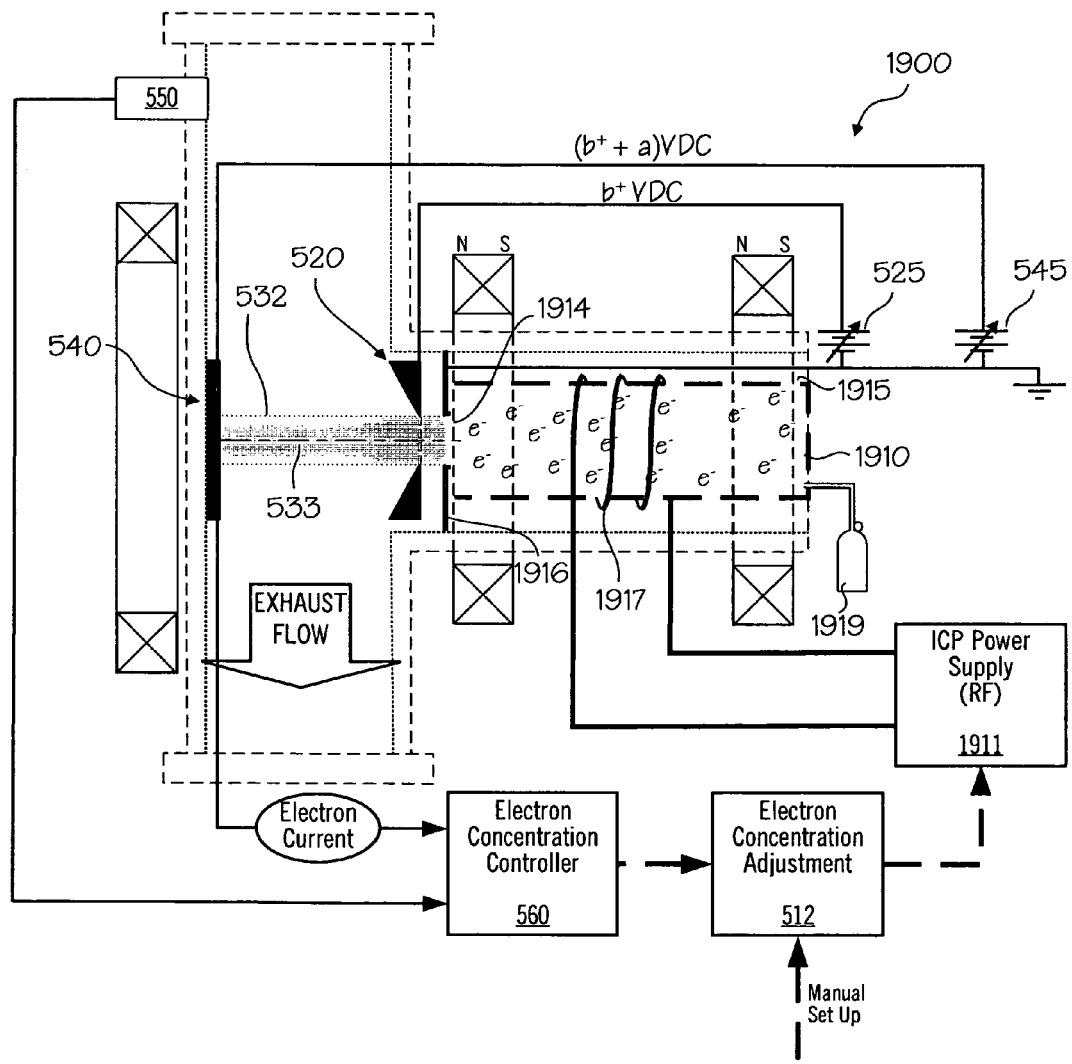
FIG. 19A is diagram of an E-beam exciter for exciting gases in an exhaust line which utilizes a separate inductively coupled plasma for generating electrons in accordance with one exemplary embodiment of the present invention.

FIG. 19A is diagram of an E-beam exciter for exciting gases in an exhaust line which utilizes a separate inductively coupled plasma for generating electrons in accordance with one exemplary embodiment of the present invention. As discussed elsewhere above, E-beam exciter 1900 generally comprises an electron source, electron extractor 520 for extracting electrons from the electron chamber of the electron source for generating E-beam 532 and electron collector 540 for monitoring the number of electrons striking the collector electrode and generating an electron current based on the number of electron strikes. Electron extractor 520 and electron collector 540 are provided voltage potentials of $b^+$ VDC from variable extractor potential source 525 and collector bias voltage of a VDC from variable bias collector source 545 respectively, for energizing and attracting the electrons of E-beam 532. The electron current generated by electron collector 540 is received by electron concentration controller (feedback controller) 560, along with pressure information from pressure gauge 550, and is converted to an electron density for E-beam 532 based on the electron count for the operating pressure of the exhaust line. The measured electron concentration of E-beam 532 is compared to a reference density (alternatively, the measured electron current is compared to a reference electron current) to determine if the density is within an operational range. That information is used by electron concentration adjustment 512 to adjust the excitation power of the particular type of electron source being employed, if an adjustment is necessary. E-beam optics may also be employed for constraining the geometry of E-beam 532, such as cone-shaped opaque extractor electrode and ring magnets disposed coaxially along the beam axis (magnets are particularly effective for use with an ICP type source for increasing the number of collisions that may result in freeing an electron).

ICP electron source 1910 operates on the same basic principle of the ICP exhaust line exciters known in the prior art, but does not excite the effluent gases for creating light emissions. Instead, ICP electron source 1910 generates a plasma for making free electrons available for electron extractor 520. As such, ICP electron source 1910 generally comprises an electron chamber 1915, or bottle, as a quartz tube (or sapphire) or some other non-conductive material capable of inducing a plasma through, with induction coils 1917 wrapped about the tube. At the exhaust line end of tube 1915, which is connected to the process tool, is reference potential surface 1916 with extraction opening 1914. Reference potential surface 1916 is set to a near-ground reference potential and coupled directly to tube 1915, or in some other configuration, but optimally provides a reference potential surface that is parallel to a rear surface of electron extractor 520 and a reference potential surface for electrons to contact. Effluent gases that diffuse into electron chamber 1915 extraction opening 1914 are excited by energy from induction coils 1917, which is provided by variable RF power supply 1911. Purge gas 1919 may also be vented into the source chamber to clean the interior of the chamber and decrease or eliminate the rate of electron source contamination build-up.

The electron density of E-beam 532 is variably controlled by feedback from electron collector 540, via electron concentration controller 560 and electron concentration adjustment 512, for increasing and decreasing the electron density for detecting a particular emission wavelength. As discussed elsewhere above, in an application where the detection of a target species in the effluent gas is necessary (or the concentration of the target species in the effluent gas), the ability to generate E-beam 532 with a narrow electron energy distribution is desirable for exciting only the target species. Hence, variable extractor potential source 525 is used to increase the electron density, in the electron energy distribution produced by ICP electron source 1910, narrowly across only the excitation window for the target species. If the light emitted from the excited gas particles is faint, the signal-to-noise ratio for the particular wavelength(s) being monitored can be increased by adjusting the RF excitation power with variable RF power supply 1911. Conversely, if the light emitted from the excited gas particles at the particular wavelength(s) being observed is extremely bright, it may be difficult to detect changes in the intensity indicative of changes in the concentration of the gas in the effluent. For that case, the relative intensity of the light for the particular wavelength(s) being monitored may be decreased to an optimal operational range of the detector being used to monitor the light intensity.

More particularly, the ICP type of electron source is a well behaved source with an extremely high operational electron density range and narrow electron energy distribution. However, the ICP type of electron source, similar to other type of electron sources, uses the effluent gases as the electron emitting material which may, over time, form deposits on the interior of electron chamber 1911 or the electron extractor screen grid. Inductively coupled exciters are in widespread prior art use, so their operational characteristics are well documented, which may be helpful in evaluating an ICP type electron source for use with a particular application.

In addition to residue accumulation in the source chamber 1911, and as discussed above with regard to FIGS. 17 and 18A-18C, the residue from the effluent (and other sources) may accumulate of on the surface of electron collector 540 which reduces the efficiency of the exciter by lowering the electrical potential available for attracting electrons toward the electrode of electron collector 540. The reduction in electrons attracted to that electrode will result in a corresponding change in the electron current generated that is used for density measurement. It should be mentioned, however, that the electrode of electron collector 540 and source chamber are not the only locations on the E-beam exciter that may be susceptible to the affects of deposits. Deposition may occur on any or all of source chamber 1911, electron collector 540, electron extractor 520 and reference potential surface 1916. Generally, the type of depositions, the deposition rate, the cumulative amount of depositions that will occur and the affect on the exciter electrons, and stability of the E-beam, are all related to the chemistry in which the E-beam exciter is operating.

For instance, it is well known that $CF_4$ process gases for example will deposit CF polymers on surfaces in the chamber. The deposition rate is a function of the surface material and temperature. Optimally, chambers designed for operation with $CF_4$ process gases are fabricated from deposition-resistant materials because the operating temperature is process-dependent and, therefore, cannot be altered to lower the occurrence of deposition on surfaces in the chamber. Consequently, it is recognized that fluorine based etch processes are one of the more challenging environments in which the E-beam system will be expected to operate. With regard to one exemplary chemistry, an E-beam exciter utilizing 304 stainless steel electrodes was operated in a 25% $CF_4$ in Ar gas mixture. Within one hour of operation, the electrodes of the exciter were coated with a CF-type electrically insulating polymer that decreased the Faraday cup current by 90%. Clearly, to have significant commercial value the frequency of the maintenance cycle should be greater than an hour. Discussed directly below is an improved E-beam exciter for reducing the rate of accumulation of depositions on the electrodes of the exciter.

Figure 19B:
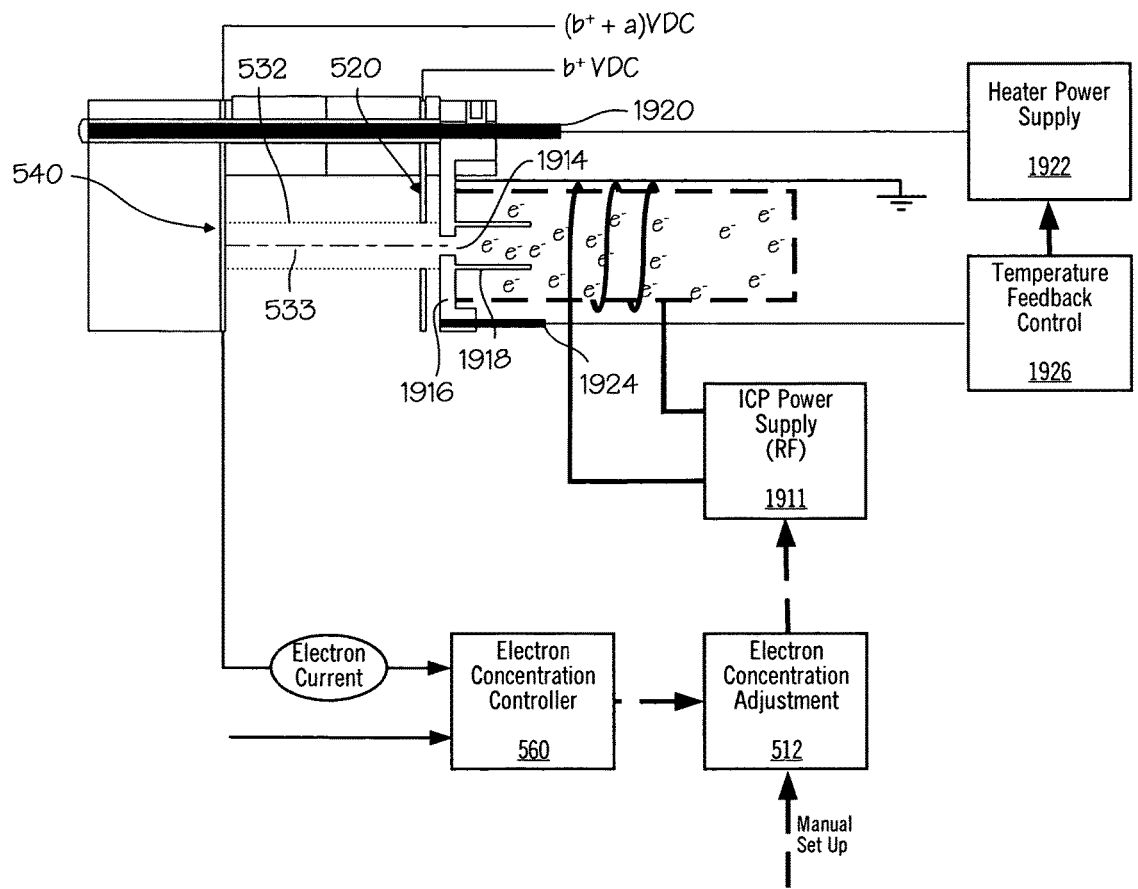
FIG. 19B is diagram of an improved E-beam exciter for reducing the occurrence of deposits on the electrodes of the exciter in accordance with one exemplary embodiment of the present invention.

FIG. 19B is diagram of an improved E-beam exciter that is resistant to deposits of contaminants from the downstream environment of the exhaust in accordance with one exemplary embodiment of the present invention. E-beam exciter 1900A is identical to E-beam exciter 1900 discussed above, with the exception of several improvements designed to improve the amount of electrons produced and increase the interval between maintenance events due to deposition. As such, E-beam exciter 1900A is represented in the figure as a simplified version of E-beam exciter 1900. Additionally, while E-beam exciter 1900A is represented as having an ICP electron source for generating a cloud of electrons for extraction, the improvements discussed below are equally advantageous in conjunction with other types of electron sources discussed and suggested herein. The following exemplary embodiments are discussed with regard to an $C_xF_y$ environment and are not meant to limit the scope of the improvements in any way. Furthermore, those of ordinary skill in the technological art will understand that applicability of these improvements to other chemistries and readily recognize an optimal application of the improvements to a specific environment without undue experimentation.

As mentioned above, operating the present E-beam exciter with 304 stainless steel electrodes in a fluorine based etch process environment at room temperature will result in significant degradation within an hour. The depositions are not isolated to electron collector 540, but occur on the surfaces of electron extractor 520 and reference potential surface 1916 of the electron source at a similar rate. It is expected that the rate of depositions on the electrodes may be lowered or effectively eliminated by a combination of temperature and materials selections. Initially, the E-beam exciter utilizing 304 stainless steel electrodes was operated in a 25% $CF_4$ in Ar gas mixture as before, but at a significantly higher temperature, 250° C. After four hours of operation, the surfaces of the 304 stainless steel electrode were visibly coated with a dark corrosion film. Energy Dispersive X-ray (EDX) surface elemental analysis of the film showed high concentrations of Fe and F, likely $FeF_3$, as verified by reports in the literature. In subsequent test runs, the temperature of the E-beam excited was adjusted and the presence of CF-type electrically insulating polymer and/or the $FeF_3$ corrosive film noted at temperature increments. Empirical results from the testing in the $C_xF_y$ environment suggest that 150° C. is an optimal temperature for the 304 stainless steel electrode surfaces. Below 150° C., the rate of accumulation of CF-type electrically insulating polymer increases dramatically and above 150° C. the rate of accumulation of the $FeF_3$ corrosive film increases. It is expected that in operation the electrode temperature may operate within a temperature range above some threshold temperature, perhaps 5° C.-15° C. above the threshold. The literature reports the $FeF_3$ corrosion rate grows parabolicly with increasing temperature. One option that may reduce the $FeF_3$ corrosion, and thereby allow for higher operating temperatures, is the use of electro-polished 316L stainless steel. Reports suggest that polished 316L stainless steel is less susceptible than 304 stainless steel to high temperature corrosion in $CF_4$. Alternatively, aluminum, for instance 6061 aluminum, is reported to be quite stable in $CF_4$ process gas after its surface reacts with the gas to form a coating of a mixture of aluminum fluorides and oxides. However, the electrical insulating properties of the passivated aluminum on the surface of E-beam exciter electrodes has not been fully investigated.

As may be appreciated from the foregoing, optimizing the exposed electrode surfaces of the E-beam exciter electrodes to a particular chemistry requires some minimal investigation into at least an optimal operating temperature and electrode material selection. In some cases, such as an E-beam exciter utilizing 304 stainless steel electrodes in a 25% $CF_4$ in Ar gas mixture, temperature regulation is important to the longevity of the device. In others, it may be enough to validate a threshold temperature, above which depositions are significantly reduced. As a practical matter, operating the E-beam exciter in a specific chemistry may require several successive test runs at various temperatures to validate the operational life of a particular electrode material in the specific chemistry. A threshold temperature (or an operating range) is selected for the electrode material to achieve the maximum operating time without failure due depositions or corrosion. If that operation life is not acceptably, new electrode materials are tested until one is identified with an acceptable operational life for the chemistry.

With further regard to E-beam exciter 1900A depicted in FIG. 19B, E-beam exciter 1900A generally comprises an electron source, electron extractor 520 for extracting electrons from the electron chamber of the electron source for generating E-beam 532 and electron collector 540 for monitoring the number of electrons striking the collector electrode and generating an electron current based on the number of electron strikes. Deposed at the open end of the electron source chamber is reference potential surface 1916 for setting the potential of the elections therein. Optimally, a cylindrically shaped reference potential surface extension 1918 may be coupled to reference potential surface 1916 in order to increase the surface area of the electrode to increase the probability of electron contact.

With specific regard to reduction of depositions of the electrodes, E-beam exciter 1900A is fitted with heater 1920, which may be any commercially available electrically resistance heater, such as a cartridge heater. In accordance with one exemplary embodiment of the present invention regulated electrical power for heater 1920 is provided by power supply 1922. Temperature feedback control 1926 controls the amount of power delivered to heater 1920 based on temperature readings obtained from temperature sensor 1924, which may also be an off-the-shelf thermocouple. Alternatively, in some applications a temperature feedback need not be implemented (not shown). There, the E-beam exciter is brought up to an optimal operating temperature and no further temperature corrections made. Furthermore, because in certain environments temperature regulation is important, it may be advantageous to increase the mass of the electrode where possible, to create a heat sink affect at the electrodes (compare, for instance, the cross-sectional shapes of electron extractor 520 and electron collector 540 in FIGS. 19A and 19B). Notice the electrodes depicted in FIG. 19B have substantially more mass and therefore are less likely to change temperature erratically. It should also be appreciated the electrodes with substantially less mass may be subject to excessive heat loss and may, therefore, operate at a somewhat lower temperature. Notice from the figure that the cross-sectional area for electron extractor 520 is significantly less than either electron collector 540 or reference potential surface 1916, consequently electron extractor 520 may not obtain the temperatures of either electron collector 540 or reference potential surface 1916.

Figure 20:
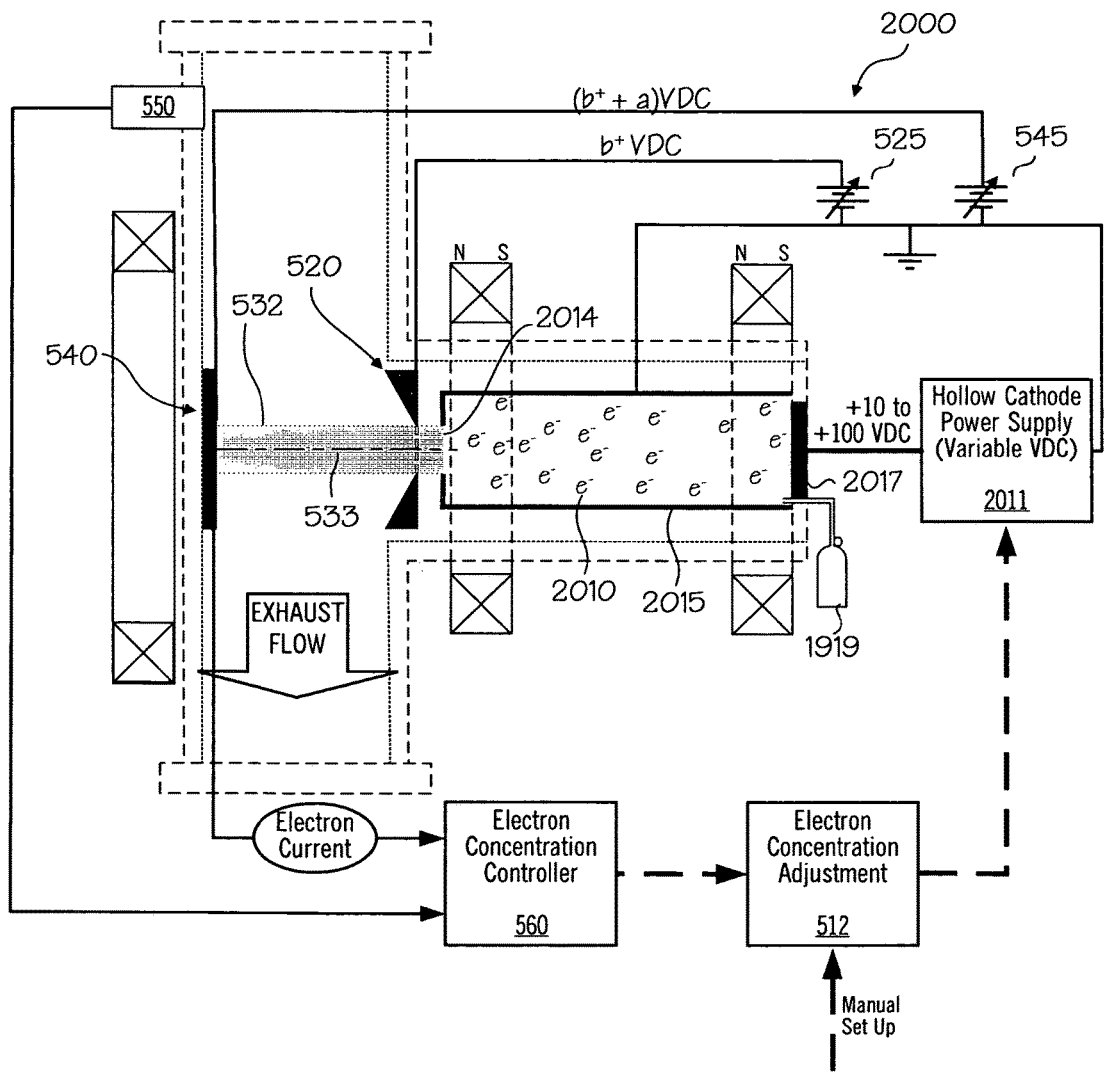
FIG. 20 is diagram of an E-beam exciter for exciting gases in an exhaust line which utilizes a hollow cathode for generating electrons in accordance with another exemplary embodiment of the present invention.

FIG. 20 is diagram of an E-beam exciter for exciting gases in an exhaust line which utilizes a hollow cathode for generating electrons in accordance with another exemplary embodiment of the present invention. E-beam exciter 2000 is identical to E-beam exciter 1900 discussed above, except with regard to the type of electron source employed for generating electrons. As such, only the differences between the two exciters will be described.

Hollow cathode electron source 2010 of E-beam exciter 2000 generally comprises hollow cathode 2015 which forms extractor opening 2014 at process tool end of the electron source and anode 2017, which is electrically isolated from hollow cathode 2015 by some distance at the opposite end of the source. Free electrons populating the source chamber assume a reference potential of hollow cathode 2015 and are extracted through extractor opening 2014 by the application of extraction electrode voltage of a 10 VDC-50 VDC (above reference potential) on electron extractor 520. As with the ICP electron source 1910, hollow cathode electron source 2010 uses process gas diffused into the source chamber as the electron emitting material and the hollow cathode type of electron source will break-down any type of process gas to form the glow discharge that generates the electrons. The electron emitting material is excited by tuning variable DC voltage power supply 2011, which is electrically coupled to anode 2017. As in the example discussed above, the electron density of E-beam 532 is regulated with an electron current feedback provided through the electron collector/controller/adjustment (540/560/512) feedback loop to hollow cathode power supply 2011. Hollow cathode power supply 2011 variably supplies between 10 VDC and 100 VDC to anode 2017. In operation, the voltage necessary for initiating electron production from hollow cathode electron source 2010 may be reduced slightly once the glow discharge has been established.

The hollow cathode type electron source generates a high density of slow moving electrons with a very narrow range of energies, more so than the ICP type of electron source discussed above. One drawback to using the hollow cathode type of electron source is the positive ions, attracted to the outer walls of the hollow cathode, sputter material in the form of neutral atoms off the walls of the cathode tube. Those sputtered materials can migrate out of the hollow cathode and contaminate other areas. This drawback should be considered in applications that may require the E-beam exciter be placed close to the production chamber in the exhaust line. However, because of the superior operational characteristics of hollow cathode type electron sources, an E-beam exciter utilizing a hollow cathode source may achieve acceptable results even when positioned further away from the reactor chamber (where the effluent may become more diluted with nitrogen and other pump gases).

Furthermore, the hollow cathode type electron source may be configured for a variety of operating conditions without altering any other component in the E-beam exciter. For instance, decreasing the distance of 2017 anode from end of hollow cathode 2015 lowers the minimum voltage at which the hollow cathode will establish the glow discharge and begin producing free electrons in the hollow cathode. Increasing the diameter of hollow cathode 2015, lowers the minimum pressure at which hollow cathode source 2010 will establish the glow discharge which produces the free electrons in hollow cathode 2015. While the above relationships are understood, they are not completely linear and, therefore, some tests may be necessary to establish the tolerance for specific operating conditions.

Figure 21:
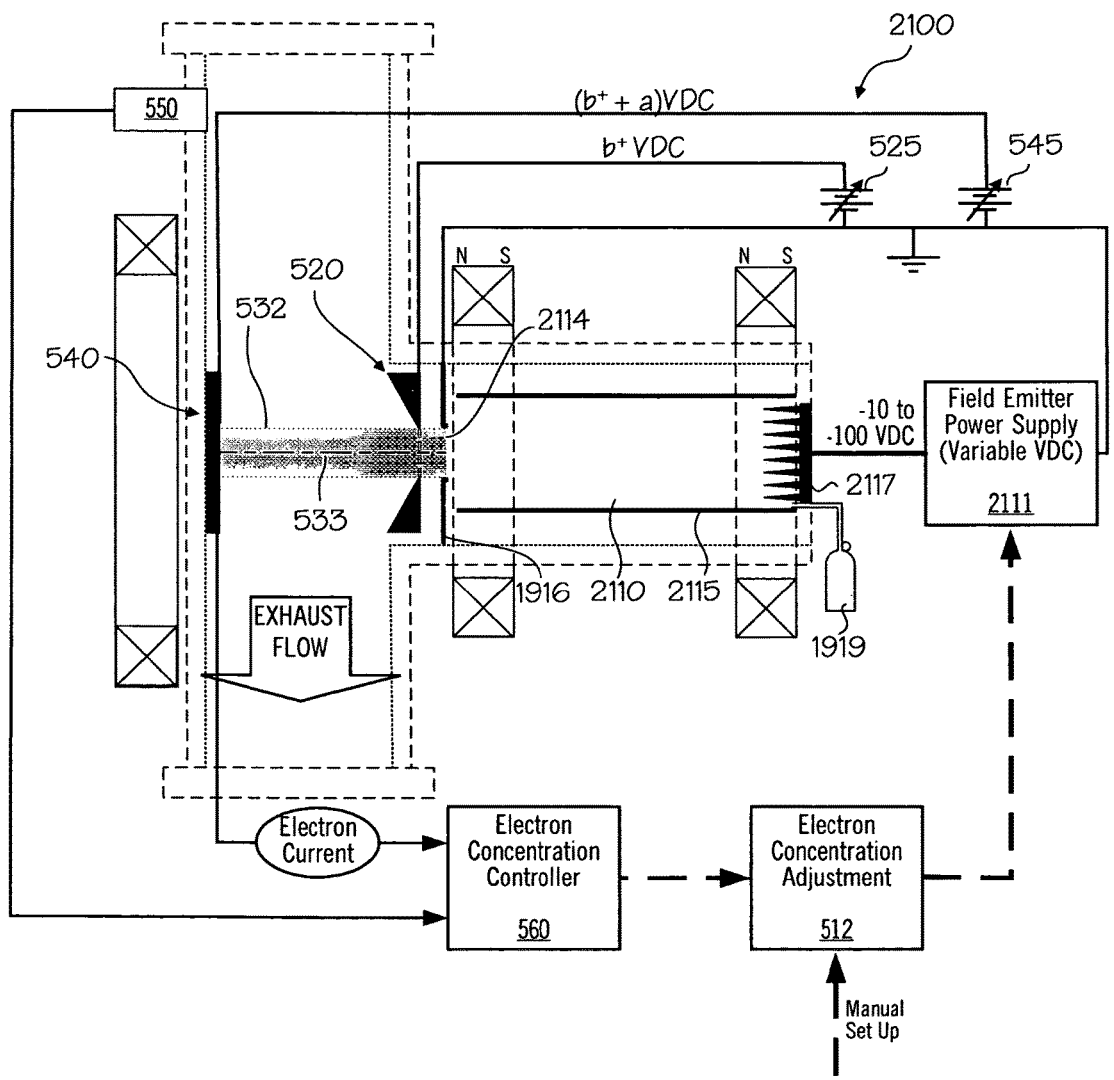
FIG. 21 is diagram of an E-beam exciter for exciting gases in an exhaust line by extracting electrons from a field emitter array electron source type in accordance with still another exemplary embodiment of the present invention.

FIG. 21 is diagram of an E-beam exciter for exciting gases in an exhaust line by extracting electrons from a field emitter array electron source type in accordance with still another exemplary embodiment of the present invention. The field emitter array type of electron source utilizes "Spendt tip" technology for creating a corona discharge, which is described in U.S. Pat. No. 3,755,704, issued Aug. 28, 1973 to Charles A. Spendt, which is incorporated by reference herein in its entirety. Field emitter array electron source 2110 generally comprises field emitter array 2117 which produces electrons in electron source chamber 2115. At the exhaust line end of electron source chamber 2115, which is connected to the process tool, is reference potential surface 1916 with extraction opening 2114. Reference potential surface 1916 is set to a near-ground reference potential and mechanically coupled with electron source chamber 2115, which optimally provides a reference potential surface that is parallel to a rear surface of electron extractor 520 and a reference potential surface for electrons to contact. Disposed on a single surface of field emitter array 2117 are micron-sized tips built with microelectronics fabrication techniques. With the arrangement of the tips, it is possible to generate a high electric field with the application of a relatively low DC voltage to field emitter array 2117, supplied by field emitter power supply 2111. The electron concentration of E-beam 532 is variable by adjusting a negative DC voltage from field emitter power supply 2111 and may be regulated with a feedback from electron collector 540 as described above.

Unlike the previous electron source types discussed above, electrons are produced directly from field emitter array 2117 of field emitter array electron source 2110. Thus, for this type of electron source, the electron emitting material is the field emitter array itself and not the effluent gas. The concentration of electrons from field emitter array 2117 may be increased by coating field emitter array 2117 with lanthanam hexaboride (LaB$_6$—very low 2.3 eV work function). Additionally, and in contrast with the electron source types described above, field emitter array electron source 2110 does not generate a cloud of free electrons in the source chamber to be extracted by electron extractor 520. Instead, electrons may be extracted directly from field emitter array 2117. It may, therefore, be possible to apply a negative voltage pulse to the field emitter and a positive voltage to the acceleration electrode at the same time to form E-beam 532, or otherwise create a potential between the field emitter array 2117 and another structure in or near the field emitter array electron source 2110 to accelerate the electrons into a higher electron energy state. Hence, this method simplifies the electron generation methodology, since the electron beam is produced directly, and nearly instantaneous, from the field emitter array. Undesirable contamination or chemical etch of emitter is possible under certain conditions.

Additionally, the emitter array electrode need not be configured as a Spendt tip described above. The aim is for the electrons for the E-beam to originate from a small point, or points, at the end of the emitter array electrode and are then accelerated by electron extractor 520 or other electrode. The point may be the end of a narrow gauge wire or wires. Thus, as still another alternative to the Spendt tip, the electrode may be configured as one or more or wires, with a small radius can be used as an electrode, instead of the end of a wire. Furthermore, the electrons for exciting the gases in the exhaust line may be obtained from a negative or a positive corona discharge. For an positive corona discharge, the polarities described above can be reversed to produce a positive corona discharge used to accelerate positive ions.

Figure 22:
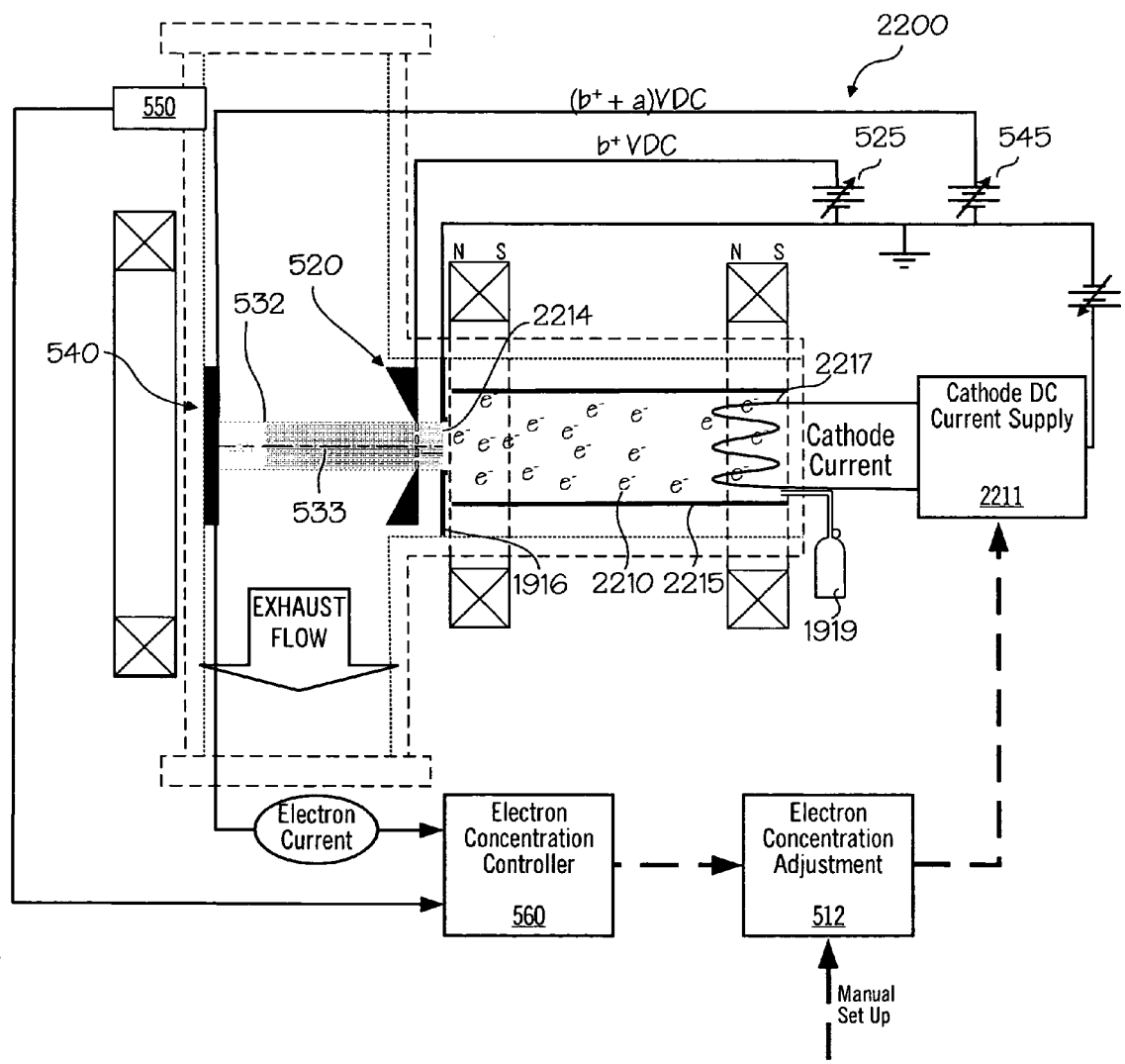
FIG. 22 is diagram of an E-beam exciter for exciting gases in an exhaust line by extracting electrons from a hot cathode electron source type in accordance with still another exemplary embodiment of the present invention.

FIG. 22 is diagram of an E-beam exciter for exciting gases in an exhaust line by extracting electrons from a hot cathode electron source type in accordance with still another exemplary embodiment of the present invention. Hot cathode electron source 2210 generally comprises cathode 2217 which thermally produces electrons in electron source chamber 2215 in response to a cathode current from cathode DC supply 2211. Electron source chamber 2215 is configured similarly to those discussed above, with the exhaust line end of electron source chamber 2215 connected to the process tool at reference potential surface 1916 with extraction opening 2214. Reference potential surface 1916 is set to a near-ground reference potential and mechanically coupled with electron source chamber 2215, which optimally provides a reference potential surface that is parallel to a rear surface of electron extractor 520 and a reference potential surface for electrons to contact. The electron concentration of the E-beam is controlled with the temperature of the cathode (current delivered to the cathode). Cathode 2217 may be coated with lanthanam hexaboride ($LaB_6$—very low 2.3 eV work function) or made from materials such as thoriated-tungsten to increase its electron emission rate. While FIG. 22 shows cathode 2217 producing electrons into source chamber 2215 for extraction into a higher electron energy state by electron extractor 520, the cathode may also be in direct contact with the extractor as discussed above with regard to the field emitter array electron source in FIG. 21. As mentioned there, the potential difference between cathode 2217 and electron extractor (or some other component of the electron source) may accelerate the electron directly from cathode 2217. Undesirable contamination or chemical etch of emitter is possible under certain conditions.

FIG. 23 is diagram of an E-beam exciter for exciting gases in an exhaust line by extracting electrons from a laser electron source type in accordance with still another exemplary embodiment of the present invention. Laser electron source 2310 differs from the other electron sources discussed in that laser photons are used to excite the effluent gases to produce free electrons for extraction. The laser power is variable for variably regulating the concentration of free electrons in source chamber 2315 with electron current feedback provided through the electron collector/controller/adjustment (540/560/512) feedback loop to laser electron source 2410.

FIG. 24 is diagram of an E-beam exciter for exciting gases in an exhaust line by extracting electrons from microwave electron source type in accordance with still another exemplary embodiment of the present invention. Microwave electron source 2410 generates free electrons by exciting effluent diffused into quartz chamber 2415 with microwave energy. Quartz chamber 2415 is disposed within tuned microwave cavity 2417 in which microwave energy resonates. The concentration of free electrons in E-beam 532 is regulated using an electron current feedback provided through the electron collector/controller/adjustment (540/560/512) feedback loop to microwave electron source 2410.

Microwave electron source 2410 is more susceptible to changes in operating pressure than most other electrons source types, especially at low pressure. Therefore, microwave electron source 2410 should be considered for environments that operate at higher, relatively stable exhaust line pressures.

With regard to any of the exemplary embodiments discussed above, the presently described gas line E-beam exciter may operate in one or more operating modes. The type operating mode for an application is selected based on, for instance, the type of observations being made and a particular advantage that is perceived for the mode. Each of the operating modes is represented diagrammatically in FIGS. 25A-25C as the power applied to the electron source, trace 2502, and the voltage applied to the electron extractor electrode, trace 2504.

Figure 25A:
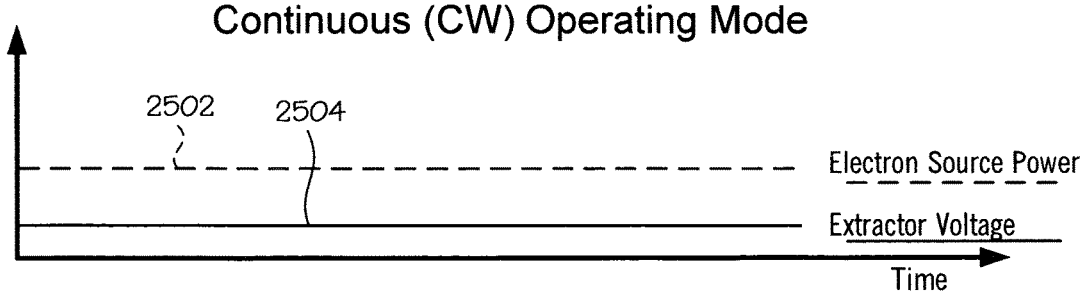
FIGS. 25A through 25C are timing diagrams that illustrate various operation modes of E-beam exciter in accordance with exemplary embodiments of the present invention.

The continuous (CW) operating mode is depicted in timing diagram depicted in FIG. 25A. As mentioned, the present gas line E-beam exciter system allows for the independent control and regulation of the density and power level of the electrons in the E-beam. Here, electron source power 2502 and extractor voltage 2504 are depicted in a steady-state, continuous operating mode. Light emission observations are integrated at time periods that are unrelated to the operation of the E-beam exciter. This type of operating mode is particularly useful for identifying a spectral profile of an individual target species based on patterns of spectral emission wavelengths which become visible at a particular energy level. The gas is excited by an E-beam with a narrow energy range energy that matches the energy transitions that excite the target species to fluorescence.

Figure 25B:
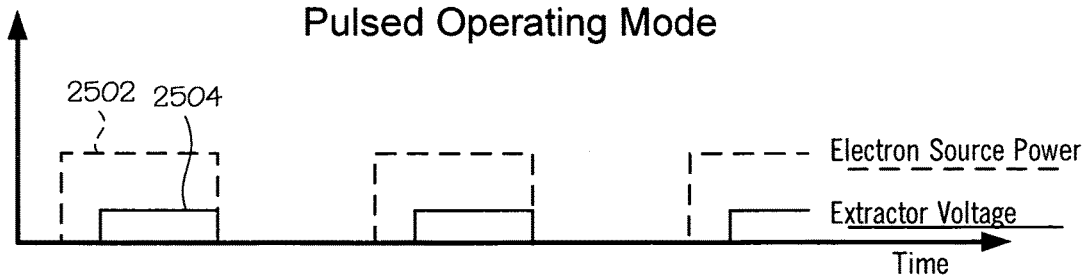

The pulsed operating mode is depicted in timing diagram depicted in FIG. 25B. Ultimately, the objective is to pulse the electron source to generate electrons only when the E-beam is needed for gas analysis. Here, electron source power 2502 and extractor voltage 2504 are pulsed in intervals. The duration of these intervals defines the duty cycle and its duration depends on several factors including the number and duration of integrations, the target specie's fluorescence lifetime and contamination of the electron source, electron collector and viewport window. Pulsing the electron source decreases the contamination rate when the electron source is turned off. A pulsed system will reduce the rate of contamination on the viewport window and other components because the plasma that produces the contaminants may be off more than it is active. Additionally, the electron source may be pulse only when an observation is desired, i.e., when an OES signal is needed to evaluate the state of the process. The longer it takes for the exciter components to become contaminated, the more time between service and service frequency is reduced. Furthermore, pulsing the electron source provides an inactive period while the E-beam is off for measuring background conditions for deriving an active background correction for subsequent intensity measurements to improve the signal-to-noise ratios.

Figure 25C:
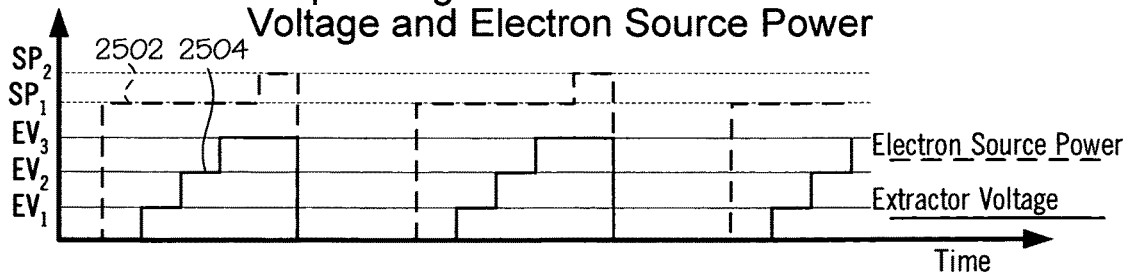

FIG. 25C is a diagram that depicts another operating mode, or more particularly a sub-mode, for the presently described E-beam exciter. The present E-beam excitation system not only provides for the independent control of the electron density and the energy of the electrons, but also allows for independent variable control of each. The concentration of electrons in the E-beam can be changed without changing the energy of the E-beam and, conversely, the energy of the E-beam can be changed without changing $n_{Ee}$.

As can be understood from the diagram, electron source power 2502 remains constant at $SP_1$ of excitation power applied to the electron source, while extractor voltage 2504 is variably adjusted between extractor voltages $VP_1$, $VP_2$ and $VP_3$. As a result, $n_{Ee}$ is constant while the energy of the electrons in the beam increases in response to the change in extractor voltage from $VP_1$ to $VP_3$. This type of operation mode is particularly useful in identifying multiple spectral profiles for individual species based on patterns of spectral emission wavelengths which become visible at different excitation levels. Adjusting $E_{Ee}$ also provides a more accurate means for detecting the presence of a species. Many gas species have multiple transition levels that fluoresce with different levels of excitation energy. It may be possible to identify a series of spectral profiles resolved at various excitation energy levels that defines a unique spectral signature for a target species. Then, the potentially active wavelengths are observed at the fluorescence energy level and the fluorescing patterns are matched to the spectral signature for a target.

Figure 26:
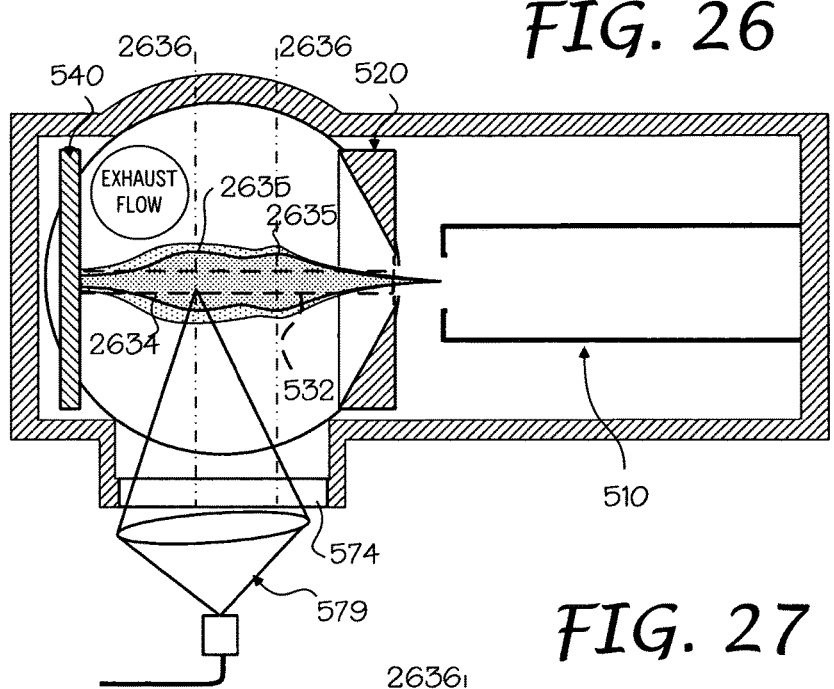
FIG. 26 is a top cross-sectional view of an exhaust line E-beam exciter which further illustrates the excitation region of the exhaust line in accordance with exemplary embodiments of the present invention.

The present E-beam exciter excites the gases along a relatively narrow excitation region surrounding the beam axis, however, the emission's intensity is not uniform across the length of the beam. FIG. 26 is a top cross-sectional view of an exhaust line E-beam exciter which further illustrates the excitation region of the exhaust line in accordance with exemplary embodiments of the present invention. The E-beam exciter generally comprises electron source 510, electron extractor 520 and electron collector 540 aligned along the axis of E-beam 532. Also depicted is light collection optics with optical fiber 579 that is optically coupled to viewport window 574 for receiving emissions light. The opposite end of the optical fiber is coupled to a light emissions processor, such as the SD512NIR spectrometer, available from Verity Instrument, Inc. of Carrolton, Tex., for analyzing the spectral emissions of the effluent. Typically, viewport window 574 is perpendicular (or greater) to the direction of the E-beam and also to the direction of the effluent flow in the exhaust line (into the figure), thereby exposing the lateral extent of E-beam 532 to window 574. The intent is to keep the optical surfaces as far away from E-beam 532 as possible.

The energy of the E-beam will be greatest nearer electron extractor 520 and lose energy across its length toward electron collector 540. This variance in electron energy across the E-beam may result in different excited states being populated at the various locations along beam 532. As such, under certain conditions, bright line spots 2635 will appear at difference spatial locations across E-beam 532. Sampling locations 2636 for bright line spots 2635 should be spatially resolved prior to a production run. However, since $E_{Ee}$ is controlled by the voltage applied to extractor 520, any deviation in the extractor voltage has the potential for moving the spatial location of bright line spots 2635. Therefore, the variable potential extractor source should be very stable to prevent the spatial location of bright line spots 2635 from wandering after sampling locations 2636 have been resolved. Furthermore, in a dynamic flow environment, the bright line spots suitable as sampling locations may occur downstream from the excitation region at the e-beam axis rather than along it.

Figure 27:
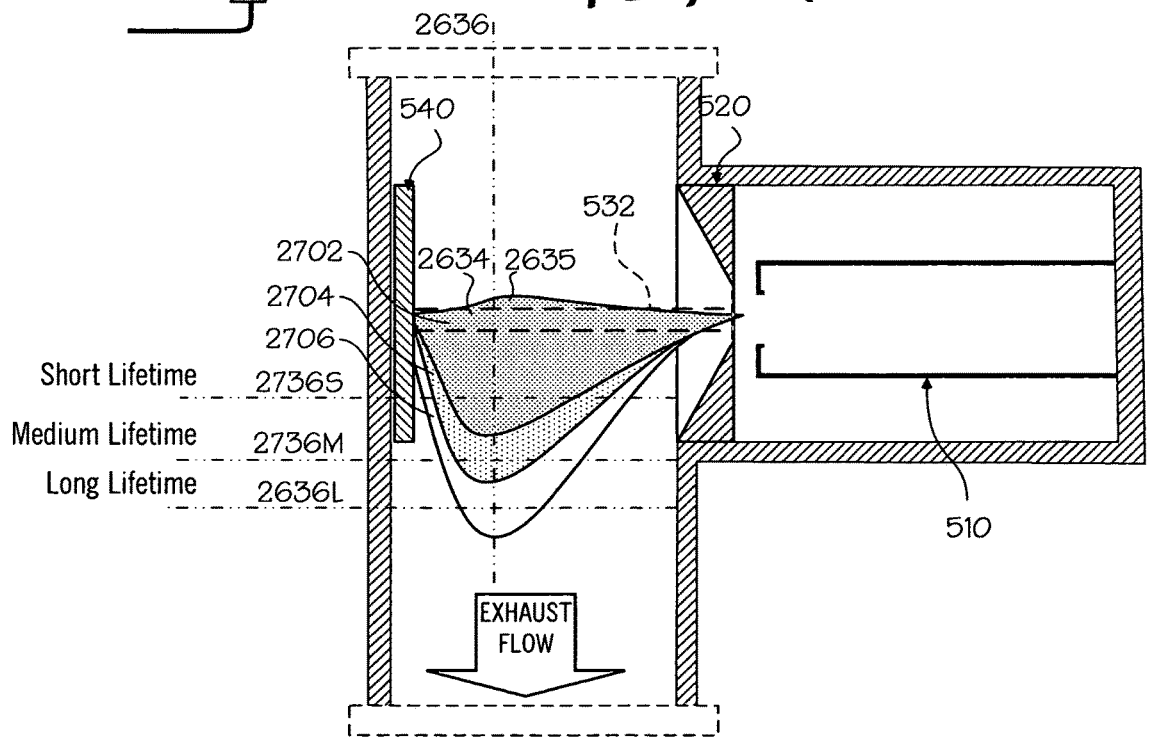
FIG. 27 is a side cross-sectional view of an exhaust line E-beam exciter which illustrates the side view of the excitation region of the exhaust line in accordance with exemplary embodiments of the present invention.

FIG. 27 is a side cross-sectional view of an exhaust line E-beam exciter which illustrates the side view of the excitation region of the exhaust line in accordance with exemplary embodiments of the present invention. The delay between the excitation of the gas particle and the time it will relax and emits its photon is the fluorescence lifetime of the particle. In a dynamic flow environment, the effluent moving past E-beam 532 is excited, however the emissions light plume 2634 is carried in the direction of the effluent movement and beneath E-beam 532. The effluent flow will displace the gas from the location as it is excited by the E-beam. With the effluent flowing perpendicular to E-beam 532, it is possible for the different emissions to be separated in space and time. The aspect ratio of the viewport window should accommodate excitation plumes that extend well downstream of the beam.

As shown in the figure, bright line spot 2635 is resolved along E-beam 532 at sampling location 2636. However, some species may fluoresce some distance downstream from E-beam 532. That distance is a function of the fluorescence lifetime of the species and the velocity of the effluent in the exhaust line. Therefore, in addition to resolving the sampling location for energy level across the beam, the sampling location is further resolved in the direction of the effluent flow for the fluorescence lifetime of the species and the velocity of the effluent. The character of this phenomenon is represented diagrammatically in the illustration. There, for short lifetime species 2702 that fluoresces relatively quickly, short lifetime sampling location 2736S is resolved close to E-beam 532. For medium lifetime species 2704, with a longer delay between excitation and fluorescence than short lifetime species 2702, medium lifetime sampling location 2736M is resolved farther downstream from the beam. Finally, for long lifetime species 2706, with the longest delay of the species depicted, long lifetime sampling location 2736L is resolved farthest downstream from E-beam 532. This phenomenon may be most prominent with fast gas flows and in pulsed electron beam operation.

It is not likely that all bright line spots for species with different lifetimes will lie along a vertical line as depicted in the figure. A species with a longer lifetime may be excited by energy levels at a different spatial location along the E-beam than one having shorter lifetimes. Furthermore, species with long lifetimes can also relax through non-emission collisions with other particles that excite other particles and those may relax to a lower state through an emission process. The time needed for this kind of secondary excitation and emission process will cause the emission to be seen downstream from the excitation region. As such, it is important that the light collection optics is highly configurable for making observations at different positions along E-beam 532 and downstream from the beam. Another solution is to employ an array of optical collectors across the viewport window. During evaluations, all of the collectors may be monitored for emissions, or only those at specific sampling locations. If the optical collectors are directed toward specific sampling locations, care should be taken so that the E-beam exciter operating parameters do not drift during or between runs. Any change in the character of the E-beam, i.e., the energy of the electrons or the electron density might shift the sampling locations and require the optics to be recalibrated for the new operating parameters.

Figure 28A:
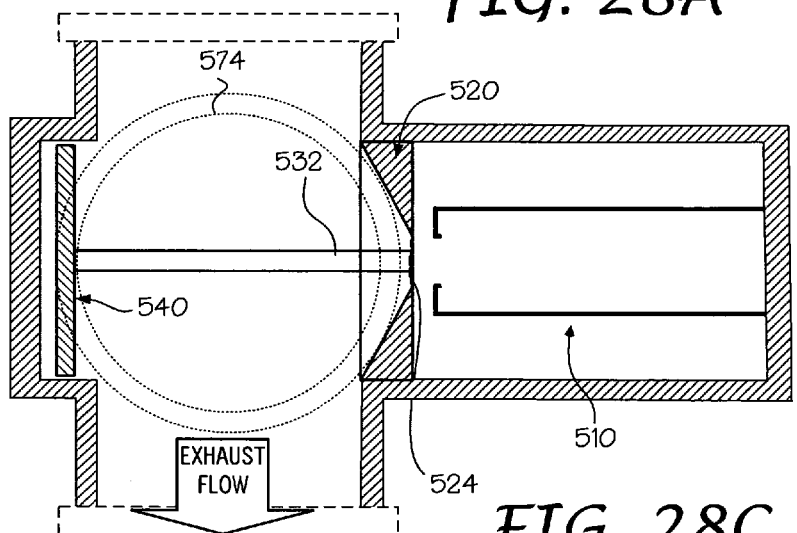
FIGS. 28A through 28E depict an E-beam exciter configured in various geometries in accordance with several exemplary embodiments of the present invention.

One reason for the large emissions light plume region to be monitored for potential light emissions is due to the geometric configuration of the exhaust line E-beam exciter presently described. The basic geometry of that configuration is depicted in the cross-sectional view of the exciter presented in FIG. 28A. In that geometry, E-beam 532 is oriented substantially perpendicular to the direction of effluent flow. Electron source 510 is coaxially aligned with electron extractor 520, each positioned on one side of the exhaust line and electron collector 540 located at the opposite wall of the exhaust line. E-beam 532 is generated at electron extractor 520 which is directed laterally across the direction of the effluent flow in the exhaust line within view of viewport window 574. It should be mentioned that the precise locations of the exciter components for this geometry will depend on the application, for instance, electron collector 540 may be located closer to electron extractor 520 and within the exhaust line or vise versa. In any case, from this diagram it is clear that the lateral extent of E-beam 532 between electron extractor 520 and electron collector 540 greatly increases the size of the excitation region where electron-particle collisions might occur. Furthermore, and as discussed immediately above, emissions from the resulting light plume will be carried downstream with the exhaust flow, which further enlarges the size of the area to be monitored for potential light emissions. The size of the area to be monitored can be reduced, somewhat, by reorienting the E-beam to the viewport window. This is possible either by reconfiguring the geometry of the E-beam exciter, or reorienting the view angle of the viewport window.

Figure 28B:
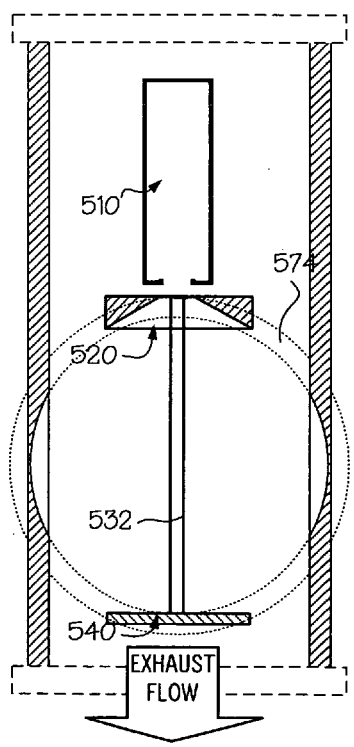
Figure 28C:
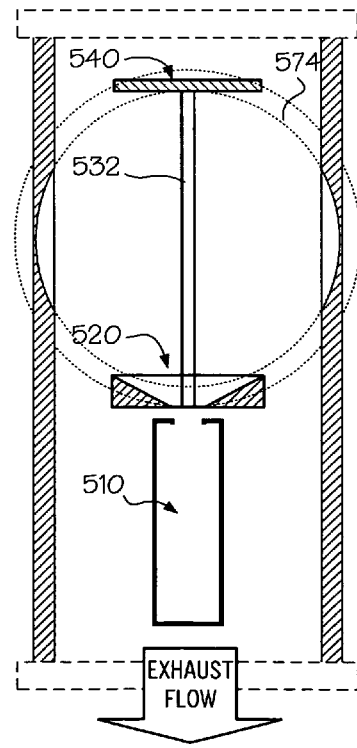

With regard to reconfiguring the geometry of the E-beam exciter, FIGS. 28B-28E illustrate several geometries that may reduce the area to be monitored for potential light emissions. FIGS. 28B and 28C depict E-beam exciter configured with an inline geometric configuration wherein E-beam 532 is parallel to the flow of effluent in accordance with several exemplary embodiments of the present invention. FIG. 28B shows a geometry with the direction of electrons in the E-beam oriented in the flow direction, while FIG. 28C depicts the exciter components in a reverse geometry, with the orientation of the E-beam in the opposite direction of the flow. It will be necessary to monitor the extent of E-beam 532 between electron extractor 520 and electron collector 540 as before, however, the excitation region is constrained laterally to a narrow area on either side of E-beam 532. It may be necessary to extend viewport window 574 vertically to observe the area downstream of the E-beam. Alternatively, and as will be discussed below, the view angle of viewport window 574 with respect to the direction of flow might be increased to capture more of the area downstream of the beam. Each of these embodiments requires many of the components to be configured in the interior of the exhaust line.

Figure 28D:
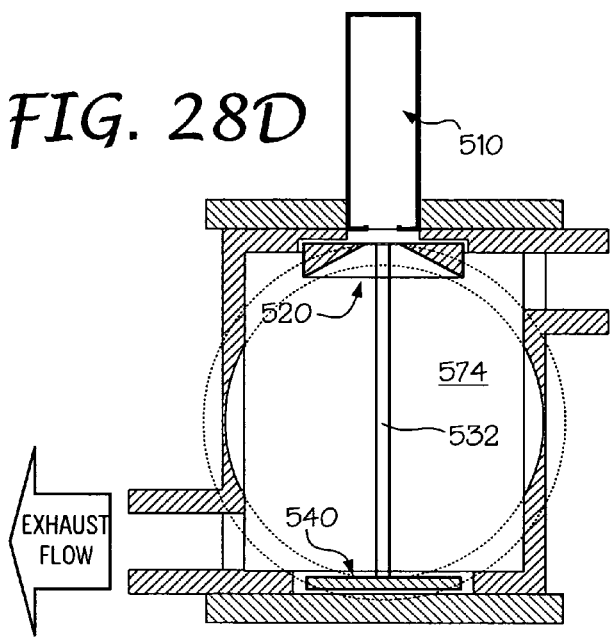
Figure 28E:
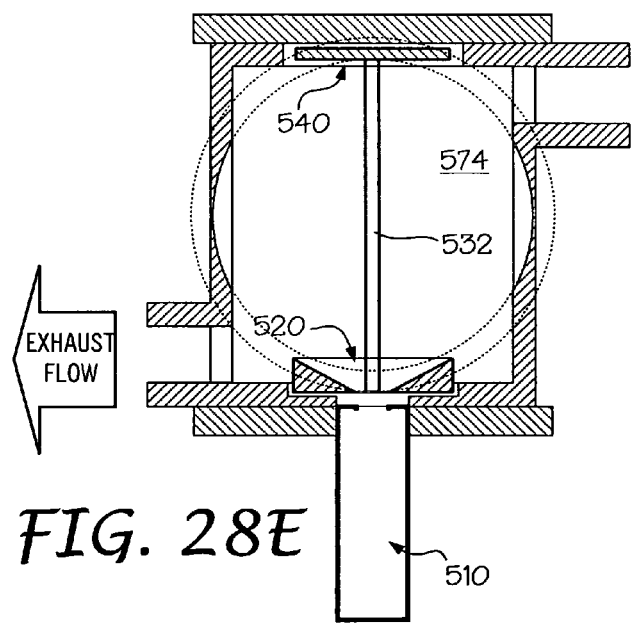

FIGS. 28D and 28E depict E-beam exciter configured with a modified inline geometric configuration wherein E-beam 532 is substantially parallel to the flow of effluent in accordance with other exemplary embodiments of the present invention. With regard to this exemplary geometry, the exhaust line is configured within "S" or "U" (not shown), with the components positioned on the exterior of the exhaust line.

Typically, the viewport window is oriented perpendicular (or greater) to the direction of the E-beam and also to the direction of the gas flow in the exhaust line, to keep the optical surfaces as far away from the E-beam as possible. Window clouding is a serious concern with the present exhaust line E-beam exciter because of the close proximity of the window to the source of the contamination. The window itself might be protected with a grate or a multichannel array that is disposed between the viewport window and the interior of the exhaust line. Because the window is exposed to the gas line, it is an exceptional candidate for using a multichannel array as disclosed in U.S. patent application Ser. No. 11/726,958 to Harvey entitled, "Multichannel Array as Window Protection", which is assigned to the assignee of the present invention and is incorporated by reference herein in its entirety. For instance, a window chamber is formed between the viewport window and the multichannel array, which is pressurized with, for example, the effluent or an inert gas. The quantity of channels and the individual dimensions of the channels are designed such that the process gas flows into the exhaust line at an extremely low rate, thereby sweeping any contaminants produced in the excitation region back into the exhaust line before they reach the viewport window, but without interfering with the exhaust flow.

The window should also be located as far from the excitation region as practical and away from the flow of contaminants in the gas stream and from the fast moving electrons in the E-beam. Optimally, the window should be upstream of the E-beam and on the side of the gas line with the electron source, i.e., perpendicular (or greater) to the direction of the E-beam and perpendicular (or greater) to the direction of the effluent flow.

Figure 29A:
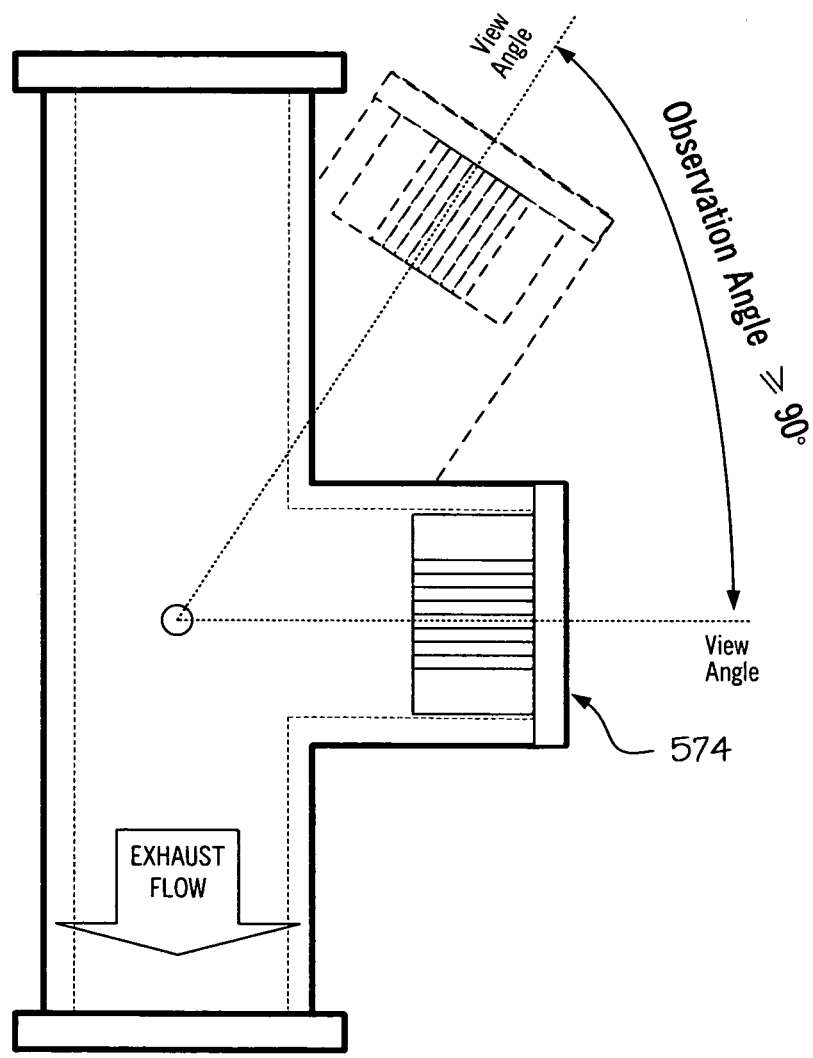

FIG. 29A is a diagram depicting the range of window observation angles for the present E-beam exciter configured with the perpendicular beam geometry in accordance with one exemplary embodiment of the present invention. Window 574 is depicted with an observation angle greater than perpendicular to the exhaust flow. In this orientation, window 574 is upstream of the E-beam. Additionally, the window orientation may be rotated around the axis of the exhaust line in the direction of the electron source (not shown). In that orientation, window 574 is upstream of the E-beam and behind the electron flow from the electron source.

Figure 29D:
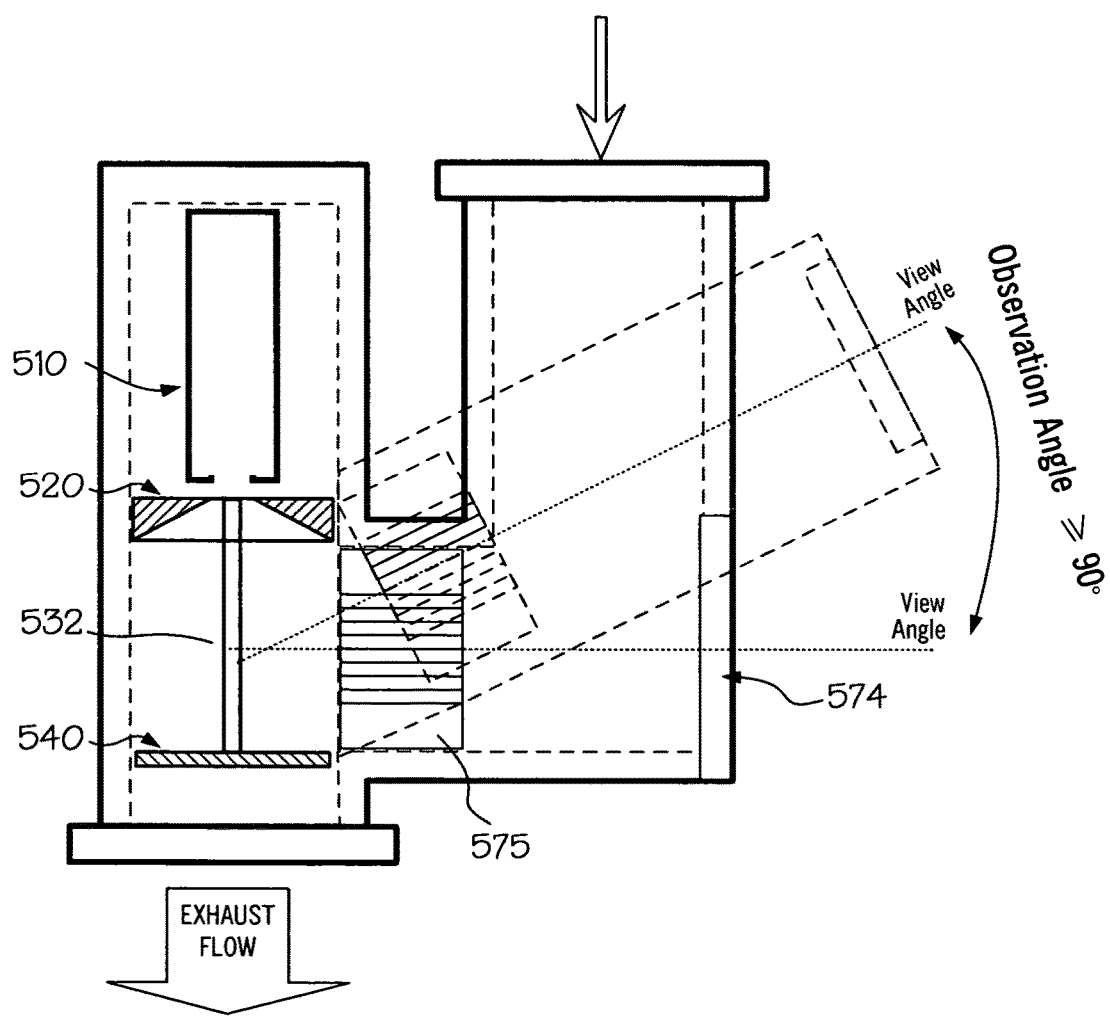

FIG. 29B is a diagram depicting the range of window observation angles for the present E-beam exciter configured with the inline beam geometry in accordance with another exemplary embodiment of the present invention. Here, the effluent flow and electron movement in the E-beam are essentially coaxial. Thus, window 574 is depicted with an observation angle greater than perpendicular to both the exhaust flow and to the direction of the electrons. Cases where the flows are opposite are more problematic, such as depicted in FIG. 29C. There, the view angle is oriented perpendicular to both the exhaust flow and to the direction of the electrons. If it is determined that a substantial portion of the contaminates are a product of either the exhaust flow or electron flow, the view angle of window 574 may be reoriented to lessen that effect, but at the expense of increased contamination from the other. FIG. 29D is a diagram depicting the range of window observation angles for the present E-beam exciter configured in a hybrid geometry in accordance with another exemplary embodiment of the present invention. The geometry of the E-beam exciter is similar in the figure to that depicted in FIG. 29B with the exception of upstream flow. Here, the aim is to divert the flow of effluent away from viewport window 574 and in so doing, contaminates are swept away from the window, thereby lessening the accumulation of residue on the window. As such the upstream flow is routed past window 574 and across multi-channel array 575 toward E-beam 532. A similar modification could be made to the E-beam geometry depicted in FIG. 29C.

Figure 30:
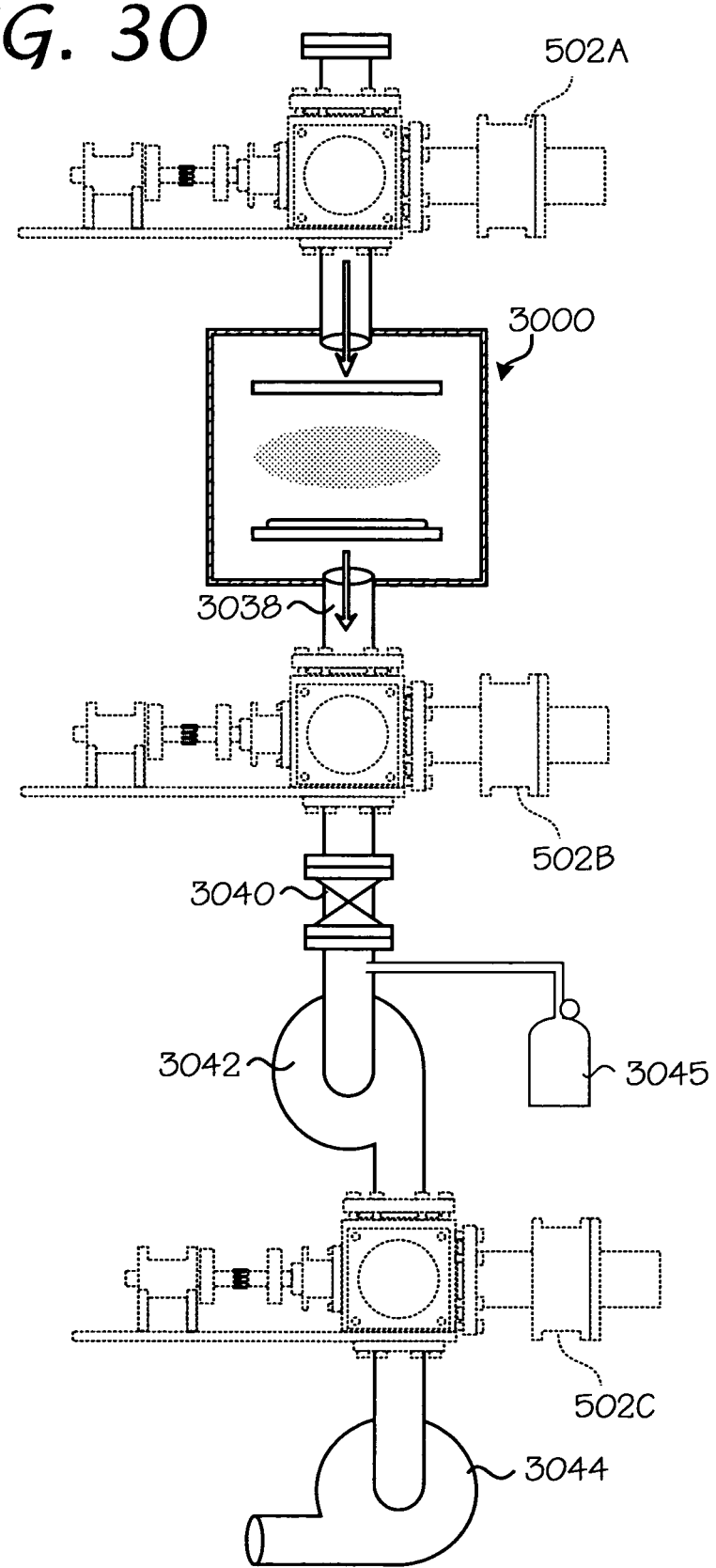
FIG. 30 is a diagram depicting a typical reactor exhaust system as is known in the prior art showing potential positions of locating the present E-beam exciter in accordance with exemplary embodiments of the present invention.

One advantage of the present exhaust line E-beam exciter is that it has a number of possible structural configurations to suit particular operating environments. In combination with the ability to independently control the energy of the E-beam and the concentration of the electrons in the beam, the present exciter can be positioned at various locations along the exhaust line without sacrificing operability. FIG. 30 is a diagram depicting a typical reactor exhaust system as is known in the prior art showing potential positions of locating the present E-beam exciter in accordance with exemplary embodiments of the present invention. Reactor chamber 3000 is usually fitted with a process gas inlet and exhaust line 3038 for extracting the reactant gases and reaction gas products from chamber 3000. The vacuum force is usually provided by a pair of pumps, turbo molecular pump 3042 and further downstream, roughing pump 3044. Throttle valve 3040 is positioned above turbo pump 3042 in exhaust line 3038 to regulate the pressure in chamber 3000 with the pumps active. Nitrogen purge gas 3045 is routinely added at turbo pump 3042 to swiftly move corrosive gases away from turbo pump 3042, however the diluted gas mixture often hides small changes in the concentration of the effluent which occur at an end point. This influx of gas is particularly problematic for prior art exhaust line plasma exciters and so these devices are almost always located upstream of turbo pump 3042.

Selecting where to locate E-beam exciter 502 on the process tool for a particular application is always an engineering compromise. Usually, some experimentation is needed to verify operability. One option might be to position E-beam exciter 502C between turbo pump 3042 and the roughing pump 3044. In evaluating that option, only the E-beam exciter structures with the best fit to the operating environment, for the particular application, should be considered as possible candidates. As repeated above, an optimal exciter structure should generate an E-beam with a narrow energy range but capable of attaining a high electron concentration, the higher the better, up to a point. Two possible candidates employ either an ICP electron source and hollow cathode electron source. The hollow cathode type electron source generates electrons in a very narrow energy range and is capable of achieving high electron concentrations. The ICP type generates electrons in a somewhat wider energy range, but is capable of attaining higher concentrations of electrons than the hollow cathode. At first blush, a better choice for the nitrogen diluted effluent below turbo pump 3042 might be the ICP type because of the higher emissions intensity attainable from the higher concentration of electrons in the E-beam from the ICP source. However, the extremely narrow electron energy range of the hollow cathode might make the target species easier to detect, such as for endpoint detection. In this environment, the hollow cathode electron source is probably the best selection for E-beam exciter 502. The ability to independently control the E-beam density and energy is crucial in this environment, so the E-beam exciter structure should be configured with the electron collector with a bias voltage. Pressure fluctuations in the vacuum environment downstream of turbo pump 3042 are problematic and might mask an intensity change of interest. With the present E-beam exciter, however, it is possible to normalize emission intensities to pressure using pressure-corrected reference electron current. In so doing, changes in emission intensity that might otherwise be ambiguous, are detectable. Therefore, the E-beam exciter structure should also include exhaust line pressure sensor for indexing a pressure-corrected reference electron current for the pressure.

If the preferred candidate E-beam exciter structure is not operable in the location, for instance if an endpoint cannot be detected, the candidate E-beam exciter structure with the next best fit to the operating environment should be analyzed in view of the most likely reasons for the failure, for instance pressure fluctuations and nitrogen dilution. Before abandoning the exhaust line location, the next best candidate E-beam exciter structure might be evaluated. If no E-beam exciter structure can be identified that is operable at the location, the E-beam exciter should be relocated to a better position within the process tool or pump system.

Placing E-beam exciter 502B in the vacuum environment between reactor chamber 3000 and throttle valve 3040 takes advantage of the better vacuum pressure control in that region and the fact that the gas mixture is little changed as it flows from the wafer past the sensor before exiting reactor chamber 3000. Here again, only the E-beam exciter structures with the best fit to the operating environment should be considered for the location. The hollow cathode type of E-beam exciter is probably a better choice for this environment than the ICP type of E-beam exciter for the same reasons given above. However, the hollow cathode type source sputters material that might cause contamination in reactor chamber 3000. If that is the case, then E-beam exciter 502 should employ the ICP electron source.

Furthermore, E-beam exciter 502A may also be placed in the process gas inlet line or on the side of the reaction chamber for analyzing the process gases in the same manner as described herein for effluent. Alternatively, E-beam exciter 502A may be located in the process gas line or reaction chamber and one of E-beam exciter 502B or 502C placed in the exhaust line for a comprehensive chemical analysis of the processing system. Other combinations are possible.

Regardless of the location of E-beam exciter 502 in exhaust line 3038, its operation is similar. With E-beam exciter 502 in place, the e-beam stimulated emission spectra of each pure gas component in the process chemistry should be captured over a range of excitation energies. The onset of emission from different gas species will occur at different e-beam excitation energies. The excitation e-beam energy that produces each fluorescence emission line in the spectra adds to the emission "signature" of that species. For example, suppose 1) for one of the gases, low excitation energy produced emission at wavelength A and 2) medium excitation energy produced emission at both wavelengths A and B, and 3) high excitation energy produced emission at wavelengths B and C, but weak emission at A. The spectral signature of that gas is the combination of spectra at each excitation energy. Because of energy transfer between different gas particles at various energy states, the interaction of e-beam excitation energy and the resulting spectra for mixtures can be very complex and very sensitive to small changes in the mixture.

Figure 31A:
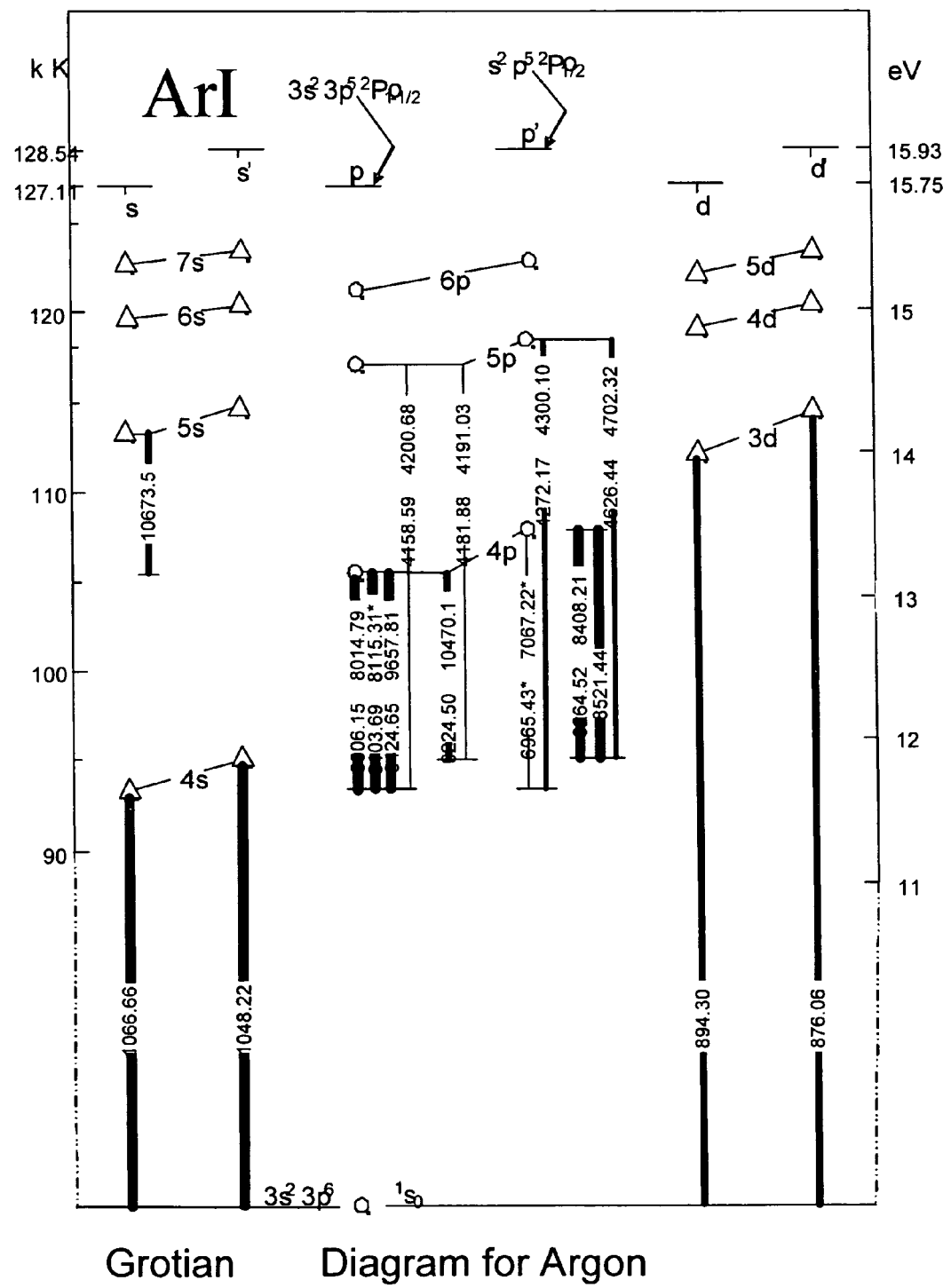
FIGS. 31A and 31B are a Grotian diagram and cross section electron energy diagrams, respectively.

The usefulness of independently controlling the energy of the electron beam may be better understood with reference to a discussion using the Grotian diagram for a species as shown in FIG. 31A. The energy state that an atom or a molecule is in will depend on a number of items. In many situations, the vast majority of the particles are in the ground state. In this diagram, the ground state is at the bottom. The electrons need to have sufficient energy to raise the energy state of the particle from the ground state and into an excited state from which it can then radiate a photon. Such systems can often decay through a number of intermediate excited states, often back down to the ground state. The energy (e.g., wavelength) of the radiated photons is equal to the energy difference between each particle energy state. Thus, the fluorescence photon energy must be less than the energy of the impacting electron. In addition, to reach certain energy states in the particle, and thus certain wavelengths (colors, frequencies, energies) of photons, require that the impacting energy must have energies above that amount. This means that photon emission is directly dependent on the energy states of the particles excited in the electron beam.

Figure 31B:
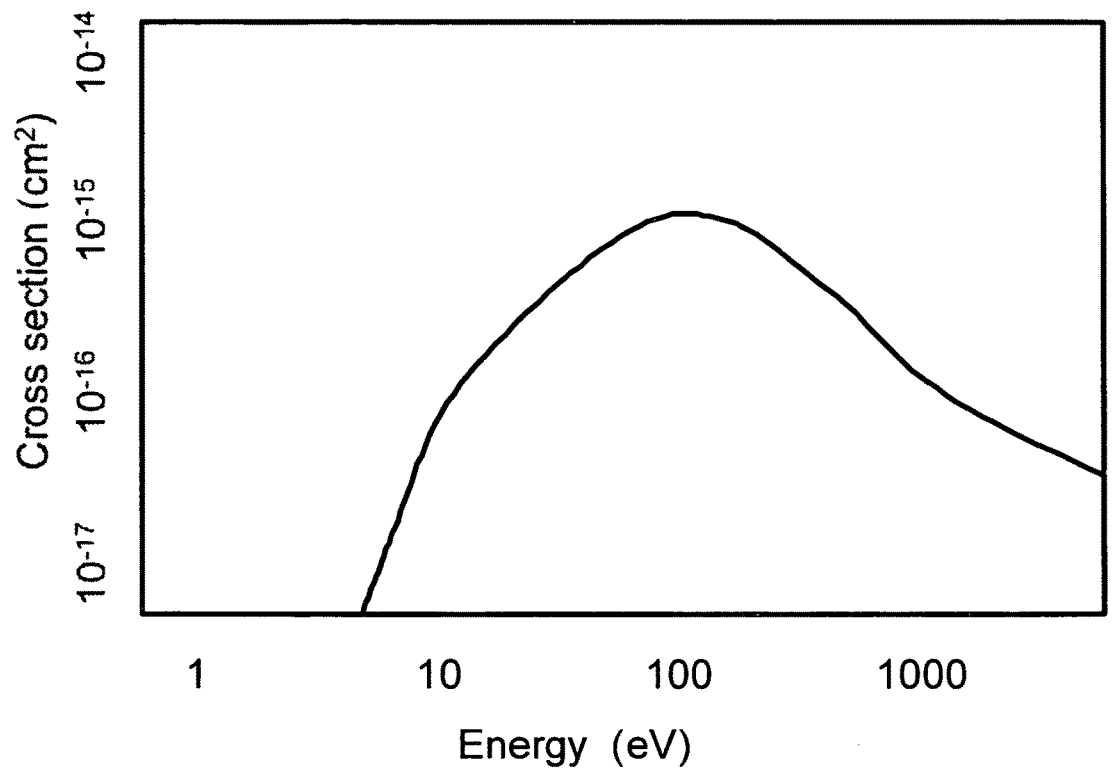

The 'cross section' for an electron hitting a particle and pushing it into an excited state is a function of quantum mechanics. Cross sections have minimum energies below which the excitation can not occur. Often, for excitation levels of interest, this minimum is near 10 eV but it does vary, see FIG. 31B. The cross section often increases until it reaches a maximum near 50 to 100 eV energy. This cross section is important in setting the number of particles that will be pushed from a lower state into a desired excited energy state from which it can radiate a given wavelength (energy, color, frequency) of light.

A more complete understanding of the present exhaust line E-beam exciter may be achieved with reference to the description of the timing sequence for the exciter depicted in FIG. 32. Three excitation series out of a long series of samplings is shown. The top section of the diagram is E-beam energy 3202 that represents the energy in the E-beam. The vertical height corresponds to electron beam energy delivered to the gas being analyzed. In the next section down, electron source power 3204 represents the excitation power applied to the electron source. On the third level is electron current 3206 that is produced by the electron collector in response to electrons striking the collector and reference electron current 3208. The second excitation series uses reference electron current 3218, which is higher than reference electron current 3208 and the third uses reference electron current 3228 which is higher still. Second from the bottom is depicted extractor voltage 3210 that is applied to the extractor electrode to regulate the energy of the E-beam and collector bias voltage 3212 is shown on the lowest section. One duty cycle extends from $t_1$ to $t_1$.

Prior to $t_1$, the exciter is essentially off with no inputs on the electron source, the electron extractor or the electron collector; electron source power 3204, extractor voltage 3210 and collector bias voltage 3212 all at their respective nulls. In response, E-beam energy 3202 is off and no electrons are striking the electron collector, electron current 3206 is at zero. Each energy level is subdivided into two parts, the stabilization interval occurs first and the collection interval occurs subsequently after the E-beam has stabilized. In the stabilization interval, the electron concentration controller reads the collector electrode and makes fine feedback adjustments to the electron source power to produce the reference electron current. These adjustments effectively change the concentration of electrons in the electron source which controls the electron beam current. After the beam current is stable and on target, spectra is collected. At $t_1$, the electron source receives excitation power and electron source power 3204 stabilizes in the interval between $t_1$ and $t_2$. At $t_2$ voltages are applied to the extractor electrode and the electron collector, both extractor voltage 3210 and collector bias voltage 3212 increase. With excitation power applied to the electron generator and a voltage to the extractor, an E-beam is generated at E-beam energy 3202. With the formation of the E-beam, electrons strike the collector electrode and electron current 3206 increases, but does not equal reference electron current 3208. The time period between $t_1$ and $t_2$ is the stabilization interval for the E-beam exciter to produce a beam having stable electron energy at a set level with a predetermined electron concentration. The concentration is achieved when electron current 3206 is equivalent to reference electron current 3208. In response to the low electron current 3206, electron source power 3204 is increased until electron current 3206 is equivalent to reference electron current 3208. In this state, E-beam energy 3202 is at its first energy level and the collection interval begins at $t_3$ and continues until $t_4$. During the collection interval, the electron concentration controller may continue to collect electron current information and continually adjusts electron source power 3204.

The sequence repeats itself at between $t_4$ and $t_6$, but here extractor voltage 3210 is increased (along with collector bias voltage 3212), resulting in higher E-beam energy 3202. Notice electron current 3206 exceeds reference electron current 3208 just after $t_4$, where the electron concentration controller reduces electron source power 3204 until electron current 3206 matches reference electron current 3208. An increase in the electron current is to be expected each time $E_{Ee}$ is increased. As the voltage applied to the extractor electrode is increased, its electrical potential increases which attracts more electrons from the source chamber of the electron source, hence the electron concentration of the E-beam is increased. The change in the density is reflected in the electron current, which is used by the electron concentration controller for adjusting the density of the E-beam back to its precious electron concentration.

This particular duty cycle has four E-beam energy levels. At $t_{10}$ the E-beam is switched off and E-beam energy 3202 returns to zero. Notice that in the time period between $t_{10}$ and $t_1$ a negative bias voltage is applied to the collector electrode. This voltage cleans depositions from the surface of the electrode by repelling the contaminates that were attracted to the positive bias voltage. Recall also, that the electron extractor is a mesh screen or similar structure. During the off period, contaminants in the electron source chamber may drift out into the exhaust stream. This can be abated somewhat by maintaining a very low voltage on the extractor during the off portion of the duty cycle.

The second excitation series is identical to the first, with the exception of the reference electron current 3218 being higher. The electron concentration controller adjusts electron source power 3204 until electron current 3206 matches reference electron current 3218, resulting in the E-beam having a higher concentration of electrons. Reference electron current 3228 is even higher in the third excitation series. The electron concentration controller again adjusts electron source power 3204, this time until electron current 3206 matches reference electron current 3228, resulting in the E-beam having even a higher concentration of electrons.

The time needed by electron concentration controller to stabilize the E-beam current with the feedback from the electron current is on the order of 10-20 milliseconds. As a result, the entire set of four stepped measurements can be completed in less than a second. So the entire designed experiment of four electron energies at three different electron currents could be accomplished in less than three seconds. Sampling every three seconds is too slow for some endpoint applications but not too slow for process monitoring. However, this is a rather complex sampling sequence that collects an enormous amount of information in a short time. There is no evidence that this complexity is needed for endpoint detection. Partial least squares (PLS) modeling appears to be a good candidate for analysis method for the rich multidimensional spectral data this e-beam sensor can generate. It is reasonably straightforward to build a PLS model that will describe the interrelationships of electron energy and beam current on the spectra produced.

Four possible integration patterns are depicted in FIG. 33 that correspond to the excitation series in FIG. 32. For integration pattern 3304, intensity data are collected during each collection interval, $t_3$-$t_4$, $t_5$-$t_6$, $t_7$-$t_8$ and $t_9$-$t_{10}$. Intensity data might also be collected across the entire energy period as shown for integration pattern 3306, i.e., $t_2$-$t_4$, $t_4$-$t_6$, $t_6$-$t_8$ and $t_8$-$t_{10}$. Alternatively, intensity data might integrate across the entire excitation series as further depicted by integration pattern 3308, i.e., $t_2$-$t_{10}$. In addition, intensity data may be collected between the excitation series as shown in integration pattern 3310. This data is useful for assessing background noise condition or for monitoring long lifetime species or the afterglow from metastable species.

With regard to the E-beam exciter, the intensity of the light emitted by an excited species undergoing emission relaxation from an energy state to a lower energy state is a function of the electron density and $E_{Ee}$ of the E-beam that excites it. The optimal technique for detecting a target species is to emit an E-beam with a high concentration of electrons with a narrow distribution of electron energies at a mean electron energy slightly above what is necessary for exciting the target species into that higher energy state. The voltage applied to the extractor electrode determines the charge and hence the mean electron energy of the E-beam. Finding a range of voltages that will excite the target species into a specific energy state that, during relaxation, will emit a narrow wavelength of light is sometimes difficult. The amount of voltage necessary varies with a number of factors and it is, therefore, device and application specific, i.e., the extractor voltage should be determined for a specific exciter for each application. A calibration run is necessary to define a range of extractor voltages for a particular application.

The intent of the calibration run is two-fold: identify a spectral profile of emission wavelengths for a species, particularly the target species, and define an optimal extractor voltage for exciting a species to emit a specific wavelength. This process can be repeated to identify a unique spectral signature for the species consisting of a plurality of spectral profiles, each excited at a unique extractor voltage.

FIG. 34 is a timing diagram that represents one calibration excitation series for defining an optimal extractor voltage ($b^+_{sp1}$) for producing a light emission in accordance with an exemplary embodiment of the present invention. E-beam energy 3402 is shown in the top section, extractor voltage 3404 in the next section, OES integration intervals 3410 in the next lower section and the intensity of light emitted at wavelength, $\lambda_1$ on the bottom, $I_{\lambda 1}$ 3412. Initially, it should be appreciated that the concentration of electrons in the E-beam should be high enough that the light is easily detected by the detection apparatus, and held constant at that concentration throughout the calibration run, and also that the integration time should be selected to detect the light for the concentration of elections in the beam. A shorter integration time is usually more desirable so more measurement can be made over a time period, so an E-beam with a high electron density is usually preferred.

During calibration, an excitation series consisting of varying E-beam energies 3402, either ascending or descending, is generated by correspondingly varying extractor voltage 3404, as depicted between $t_1$ and $t_{15}$. In response, $I_{\lambda 1}$ 3412 will change as the excitation energy needed to excite the species to produce wavelength $\lambda_1$ is traversed. Typically, $I_{\lambda 1}$ 3412 increases from zero with increases in extractor voltage 3404 and then decreases back to zero. A linear maximum of intensity values can usually be identified for the species where increases in extractor voltage 3404 do not result in a substantial change in the intensity, as shown in the interval between $t_5$ and $t_9$. The optimal extractor voltage $b^+_{sp1}$ for generating an E-beam with an electron energy for exciting the specie to produce an emission at wavelength $\lambda_1$ is the midway point on linear maximum of intensity values. The optimal extractor voltage may be set slightly higher than the midway point to compensate for reduced efficiency of the extractor electrode that is expected to occur over time. E-beam energy 3414 represents the optimal $E_E$, for the E-beam produced from optimal extractor voltage 3416, for exciting the target species to produce wavelength $\lambda_1$ for detection, see interval between $t_{21}$ and $t_{22}$. Optimal collector bias voltage 3418 ($b^+_{si1}$+a) simultaneously may also be applied to the collector electrode.

Ideally, the energy distribution in the E-beam should be narrow enough to excite only the target species into the energy state necessary to undergoing emission relaxation at wavelength $\lambda_1$. If it is assumed that optimal extractor voltage 3416 produces an E-beam at a mean electron energy, it follows that the ideal energy distribution for the electron source in the E-beam should be no wider than what would produce intensities across the linear maximum of intensity values. Any wider energy distribution would be wasted energy.

With further regard to $E_{Ee}$, it should be appreciated that it may not always be possible to generate an E-beam with an optimal $E_{Ee}$ by referencing the extractor voltage. Even though the extractor voltage may be set to optimal extractor voltage 3416, $b^+_{si1}$, for the species, it may not result in an E-beam with the optimum electron energy for exciting the target species to emit light of wavelength $\lambda_1$. This condition may occur drift in the extractor voltage supply or depositions forming on extractor electrode, for instance. One mechanism for verifying that the electron energy of the E-beam is in an optimal energy state for emitting light at the proper wavelength is by using the collector bias voltage as a check. The verification procedure is depicted between $t_{16}$ and $t_{20}$ on the diagram. Initially, the optimal $E_{Ee}$ for the extractor voltage is determined from the collector bias voltage. During the calibration run, the electron source is powered up and optimal extractor voltage 3416 $b^+_{si1}$ is applied to the extractor electrode. A collector bias voltage ($b^+_{si1}$+a) may also be applied to the collector electrode, however, here the intent is to stop the flow of electrons in, the E-beam by adjusting the collector bias voltage 3406 to a negative bias value equal to the electron energy n the E-beam. Essentially, collector bias voltage 3406 is decremented until the electron current generated by the electron collector goes to zero. At that state, negative collector bias voltage 3424 exactly equals the optimal $E_{Ee}$ for the E-beam. A value for negative collector bias voltage 3424 is recorded and whenever necessary, the bias value can be used to verify that the E-beam is in the optimal state, $E_{Ee}$, for exciting the species. During an energy state verification, in a production run for instance, the collector bias voltage is set to negative collector bias voltage 3424 and the extractor voltage is adjusted until no electron current is generated by the electron collector. At this point, the extractor voltage is set for producing electrons at the optimal energy level. The collector bias voltage in then increased to optimal collector bias voltage 3418, the electron current checked and the excitation power to the electron source is adjusted as necessary prior to making an OES measurement.

As discussed above, one shortcoming in prior art exhaust line plasma exciters was their inability to handle changes in the exhaust line pressures. The feedback system of the present exhaust line E-beam exciter is sophisticated enough to compensate for pressure change by adjusting the concentration of electrons in the E-beam. Furthermore, it is expected that these corrections may be implemented in near real-time, thereby minimizing lag time between valid integrations.

FIG. 35 is a timing diagram that represents the pressure feedback compensation aspects of the present E-beam exciter. The feedback adjustment are primarily the responsibility of the electron concentration controller that receives electron current information from the electron collector and pressure information from a pressure sensor located on the exhaust line. E-beam energy 3502 is shown in the top section, pressure 3504 from the pressure sensor in the next section, light intensity 3506 and a relative intensity 3508 used for calibration are in the next lower section. In the following section are three traces, electron current 3516 from the electron collector, and two pressure-corrected reference electron currents, $P_1$ reference current 3512 and $P_2$ reference current 3514. OES integration intervals 3518 are depicted in the bottom section.

Regulation of the concentration of electrons in the E-beam is the responsibility of the electron concentration controller. The object is for the E-beam exciter to achieve reproducible intensity results. This is accomplished by sampling the electrons reaching the collector electron and comparing that count to a reference standard (the electron concentration controller receives an electron current from the collector that is compared to a reference electron count). Density adjustments are made by altering the power to the electron source, which in turn, adjusts the electron current to the reference electron current. Any change in the light intensity can then be attributed to a change in the concentration of the target species in the effluent. Pressure changes in the effluent will also result in an intensity change and mask the intensity change and cannot be detected from the electron current. One mechanism to compensate for pressure change is to adjust the concentration of electrons for pressure (adjust the electron source power). This is possible by defining a plurality of pressure-corrected reference electron currents in advance for the range of production pressures that will be encountered. The timing diagram in FIG. 35 demonstrates how the pressure-corrected reference electron currents are defined and used. As such, aspects of the diagram represent the calibration run and production run.

During calibration, a test gas at a stable pressure $P_1$ is excited with an E-beam having a stable concentration of electrons in a predefined energy state. As a result, light intensity 3506 is produced at some level, say relative intensity 3508, between $t_2$ and $t_3$. $P_1$ reference current 3512 is noted for that pressure. The pressure is then changed, for instance to $P_2$, and the sequence repeated, however, since light intensity 3506 changes due to the pressure change, it is adjusted back to relative intensity 3508 prior to the measurement. Once stabilized, $P_2$ reference current 3514 is recorded for pressure $P_2$, taken between $t_8$ and $t_9$. The calibration sequence is repeated through the range of all possible production pressures, at suitable pressure increments, and the corresponding pressure-corrected reference electron currents are also recorded. The calibration process may be repeated for each energy state that will be used in the production run to verify that the recorded pressure-corrected reference electron currents are valid for those energies, if not, new pressure-corrected reference electron currents are recorded for those energies.

In a production run, the E-beam exciter produces a beam with the identical concentration of electrons and at the predefined energy state as the calibration run. Pressure is sensed by the electron concentration controller to be, for instance, $P_1$ and an appropriate $P_1$ reference current 3512 is accessed. The electron source power is adjusted so that electron current 3516 matches $P_1$ reference current 3512. Intensity information can then be collected. Changes in the operating pressure are unpredictable, and therefore another function of the electron concentration controller is to discard integrations that are unreliable due to a change in the pressure. For instance the measurement begun at $t_2$ should have integrated until after $t_5$, but was terminated at $t_4$ due to a pressure change being detected. Once the electron concentration controller detects a pressure change, it accesses the reference current for the new pressure, and initiates a new excitation series. The new series is depicted between $t_6$ and $t_9$ in the first excitation series. The entire feedback response to the pressure change is shown between $t_4$ and $t_9$. The second excitation series shows the reverse case, with a pressure drop sensed by the electron concentration controller.

FIG. 36 is a timing diagram showing several operating modes of the present E-beam exciter in accordance with a exemplary embodiments of the present invention. The sequence between $t_1$ and $t_7$ show the variable electron energy mode as described with regard in FIGS. 32 and 33. Intensities 3612-3620 are exemplary intensity readings $I_{\lambda 1}$-$I_{\lambda 5}$ in response to the excitation sequence for wavelengths $\lambda_1$-$\lambda_5$. Notice at time $t_5$ intensity $I_{\lambda 4}$ is low, below an acceptable signal-to-noise threshold. One option to increase the intensity is to increase electron source power 3606 throughout the series. However, for the sake of this example, increasing electron source power 3606 might increase the intensity of another wavelength beyond the range of the detector, for instance intensity $I_{\lambda 3}$, which would result in useful intensity information being saturated. Therefore, because the concentration of the E-beam can be controlled independent from $E_E$, E-beam energy 3602 can be held constant and electron source power 3606 increased, resulting in a higher electron density 3602 and higher intensity readings $I_{\lambda 1}$-$I_{\lambda 5}$, thereby improving the SNR for intensity $I_{\lambda 3}$ 3616. The procedure for calibrating the E-beam exciter for collecting intensities from multiple electron densities is also discussed with regard in FIGS. 32 and 33.

The second excitation series, between $t_{10}$ and $t_{13}$, shows a regular excitation period with a regular stabilization interval that occurs prior to a regular collection interval, i.e., the duration of the intervals are determined in advance and the period of the duty cycle determined from that. This is an uncomplicated means for collecting data but may be somewhat inefficient time wise.

The third excitation series, between $t_{13}$ and $t_{25}$, shows an excitation series with an adaptive stabilization interval. The duration of regular collection interval is a function of the integration and therefore cannot be shortened. The duration of stabilization interval, on the other hand, is used for the E-beam exciter to stabilize before the measurement. The collector current is indicative of the E-beam exciter stabilizing once the electron current matches the reference electron current. If it takes a relative short duration for stabilization, the collection interval can commence immediately. Series CYC1, CYC2 and CYC3 demonstrate the efficiency of the adaptive stabilization interval. Notice during CYC1, electron collector current 3622 matches reference current 3624 at $t_{14}$ and the collection interval can begin immediately (in the diagram, a lag period $t_{14}$-$t_{15}$ is applied to ensure the extractor potential has stabilized because it cannot be sampled directly). The benefit of this mode becomes apparent by comparing the periods for CYC1, CYC2 and CYC3.

FIG. 37 is a flowchart illustrating a generic method for detecting excitation fluorescence at multiple excitation energy levels in accordance with an exemplary embodiment of the present invention. The process begins by generating an E-beam with a predetermined electron density $n_E$ and energy $E_{Ee}$ (step 3702) toward an exhaust stream of effluent from a reactor process, for instance (step 3704). The excitation region surrounding the E-beam is monitored for fluorescent species occurring at various wavelengths (step 3706). A determination is made as to whether the E-beam energy should be adjusted for detecting another wavelength or specie (step 3708). If so, the E-beam energy is adjusted (step 3710) and the process reverts to step 3706 for another measurement. If not, the process reverts to step 3706 to continue the measurement.

Figure 38:
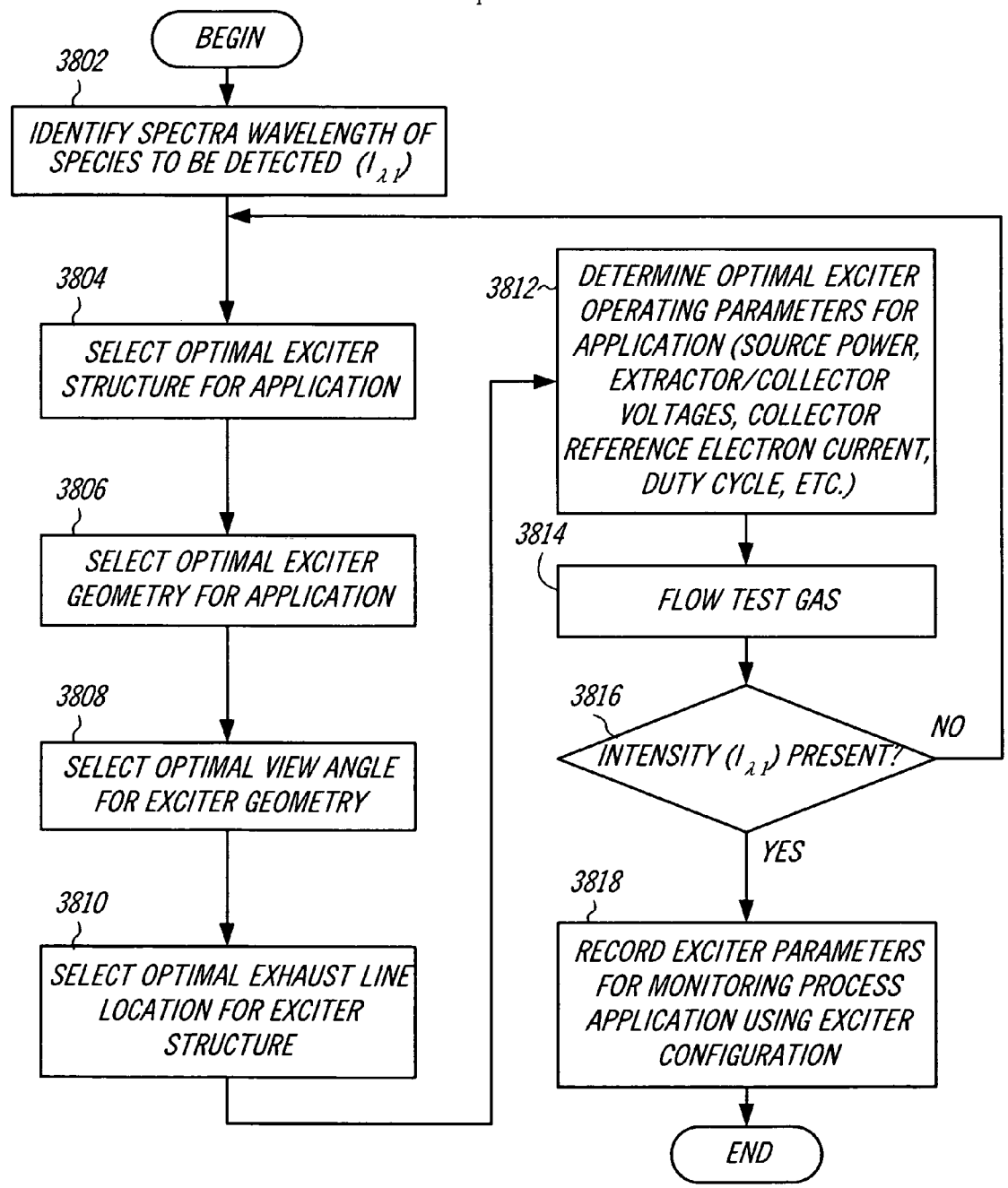
FIG. 38 is a flowchart depicting a method for setting up the present E-beam exciter for detecting a specific species on a tool in accordance with an exemplary embodiment of the present invention.

FIG. 38 is a flowchart depicting a method for setting up the present E-beam exciter for detecting a specific species on a tool in accordance with an exemplary embodiment of the present invention. Initially, the operator should have some estimation as to the spectral wavelength(s) that will emit for the target species (step 3802). Next, an optimal exciter structure is configured for the operating environment (step 3804), for instance, the electron source type, extractor type, shape and dimensions, the type and placement of the beam focusing optics, magnet configuration, whether or not to include a collector to sample electron density, electron density controller, to use a pressure sensor, etc. The E-beam exciter geometry is configured (step 3806). Here, the placement of the extractor and collector electrodes is determined and the spacing between the electron source and extractor electrode and also between extractor and the collector electrodes and the orientation of the E-beam to the effluent flow, etc. After which, the view angles and collection optics can be configured (step 3808). Most probably, OES measurements will be made, but the present device will accommodate other detection devices, e.g., photodiodes, etc. The view angle for the selected geometry is determined and anti-contamination measures are implemented.

The placement of the E-beam exciter on the tool is also considered (step 3810). As a practical matter, the location of the E-beam exciter on the exhaust system should be known prior to configuring the exciter. However, it may turn out to be an iterative process where candidate exciter structures are performance-tested at various locations before the optimal location for the exciter can be confirmed. With the device in place, optimal exciter operating parameters for application can be formulated (step 3812), for instance source power, extractor/collector voltages, collector reference electron current, duty cycle, operating mode etc.

The configuration is then tested with a test gas (step 3814). One or more wavelengths will be monitored for emissions. If the emissions are present (step 3816), the operating parameters can be optimized for the detector, SNR, etc. and recorded for the production run (step 3818). If, at step 3816, the present of the test gas cannot be detected by refining the operating parameters, the E-beam exciter should be reconfigured on the tool and the process revert to step 3804.

FIG. 39 is a flowchart depicting a method for calibrating the present E-Beam exciter to an optimal extractor voltage for detecting wavelength $\lambda_1$ of an excited production species at various process pressures in accordance with an exemplary embodiment of the present invention. This method may be used to achieve the excitation sequences demonstrated in FIGS. 34 and 35. The process begins once the E-Beam exciter has been configured to the tool with a flow of test gas (step 3902). Adjustments are made for detecting the test gas (step 3804) (see FIG. 38). The electron source power, extractor voltage and collector bias voltage are optimized to achieve species fluorescence of desired wavelength and the collector electron current is recorded as reference collector electron current for the current pressure. The beam energy may be iterated through several levels, while maintaining constant exhaust line pressure and reference collector electron current to find range of extractor voltages where light intensity is at linear maximum ($I_{\lambda_s}$) (linear portion of energy curve) and light intensity $I_{\lambda_s}$ is recorded (step 3906). Next, the midpoint of extractor voltage range that correlates to the linear portion of energy curve is recorded as the optimal extractor voltage for exciting the species to produce wavelength $\lambda_1$ (step 3908).

Next, other pressure-corrected reference electron currents are derived for the E-Beam exciter in the application by perturbing the pressure while keeping light intensity $I_{\lambda_s}$ constant by adjusting the power to the electron source (steps 3910, 3912 and 3914), from which a set of pressure-corrected reference collector electron currents are accumulated for use in the production run. The entire process should be repeated for every chemistry in exhaust line (step 3916) and the optimal extractor voltage for exciting the species to produce the desired wavelengths and the set of pressure-corrected reference collector electron currents for the species are recorded and the production run can commence.

FIG. 40 is a flowchart depicting a method for implementing the present E-Beam exciter with a generic duty with an electron current feedback for stabilizing the concentration of beam electrons in accordance with an exemplary embodiment of the present invention. The duty cycle begins with excitation power applied to the electron source and the voltage applied to the extractor and collector (steps 4002 and 4004). The electron concentration controller verifies that the source is powered (step 4006) and begins monitoring the collector current (step 4008). The electron concentration controller compares the electron current received from the collector electrode with a reference current (step 4010) and adjusts the electron source power until the two match (step 4012). Next, data are collected for the wavelengths being monitored (step 4014), after which the excitation period end and the E-Beam exciter is powered down for a predetermined OFF time period (step 4016). As a practical matter, a slight voltage may be retained on the extractor during this period. Additionally, the collector may be pulsed with a reverse bias voltage to clean surface deposits that may have accumulated during the excitation series (step 4018). After the predetermined OFF time period expires, another duty cycle begins (step 4020). It should be mentioned that under certain conditions, the duration of the duty cycle may change. For instance, if a particular wavelength is monitored for a specific intensity, the duty cycle may shorten as the intensity approaches a target value, thereby lessening the accumulation of contaminates on the window during less important measurement periods.

FIG. 41 is a flowchart depicting a method for implementing the present E-Beam exciter with an electron current feedback and pressure corrected reference currents for adjusting the density of the electron beam relative to the line pressure change in accordance with an exemplary embodiment of the present invention. Here, the E-Beam exciter is configured with an electron density controller for receiving collector electron current and pressure information for adjusting the excitation power to the electron source. The process begins by setting the operation parameters for the E-Beam exciter (step 4102) and monitoring the line pressure (step 4104). Using the line pressure, the electron density controller accesses the appropriate reference current for the pressure (step 4106) and begins monitoring the collector electron current (step 4108). The collector electron current should match the reference current for the pressure (step 4110), if not the excitation power to the electron source is adjusted until it matches (step 4112). The intensity at wavelength $\lambda_{S1}$ is integrated and checked for light emissions (step 4114). In a detection process, the process control would be stopped (or alerted) when intensity at wavelength $\lambda_{S1}$ is detected (step 4116), other types of processes would continue after detecting the wavelength. In either case, if wavelength $\lambda_{S1}$ is not detected, the process iterates back to step 4104 for a subsequent excitation series, including gathering a pressure reading (step 4104) and the appropriate reference current for the pressure (step 4106), monitoring the collector current (step 4108) and testing the current for adjusting the excitation power to the electron source, prior to making a light integration.

FIG. 42 is a flowchart depicting a similar method to that described above in FIG. 41 for implementing the present E-Beam exciter for adjusting the density of the electron beam relative to the line pressure change, but over a range of electron energy levels for detecting emissions in multiple wavelengths in accordance with an exemplary embodiment of the present invention. Here again, the E-Beam exciter is configured with an electron density controller for adjusting the excitation power to the electron source. The process begins by powering the electron source (step 4202) and monitoring the pressure (step 4204). The line pressure is utilized to access the appropriate reference current for the pressure. Next, the extractor voltage is set to generate an optimal energy level for excitation of a target species (step 4206). It is expected that the E-Beam exciter will retain several voltages that correlate to various wavelengths and/or species to be excited (see the discussion relating to FIG. 38). As the E-beam energy may have changed, the concentration of electron in the beam may also change, so prior to a collection, the electron concentration controller samples the electron current from the collector electrode (step 4208) and compares it to a reference current for the pressure (step 4210). The excitation power to the electron source is adjusted to achieve a match (step 4212) prior to integrating the light (step 4214). The process then iterates back from step 4204 for another electron energy level (step 4216).

One advantage of the presently described E-Beam exciter is its ability to accurately define and detect a unique spectral signature for a species that consists of a plurality of spectral profiles, with each individual spectral profile taken at a unique (and optimal) excitation level for exciting the species. FIG. 43 is a flowchart depicting a method for defining a unique spectral signature for a species in accordance with an exemplary embodiment of the present invention. The process is performed during a test run with the target species at the expected operation pressure of the production run (step 4302). The E-Beam exciter is then adjusted to achieve an optimal species fluorescence (step 4304). Here it should be mentioned, that some species will produce both bright and dim spectral lines simultaneously (step 4306). The intent is to find an intensity level within the range of the detector in which the SNR of dim lines is acceptable, without saturating bright spectral lines. The collector electron current is recorded for the electron concentration (step 4308). Next, the spectral lines are recorded as the spectral profile of the species at the excitation level (step 4310). The process is repeated for the target species at multiple energy levels for the same operating parameters (step 4312). The spectral profiles for the different energy states are compiled into a unique spectral signature for the species (step 4314). This process may be repeated for all chemistries present in the effluent of the production run.

Using the unique spectral signatures for the gases present in the exhaust defined above, these can be accurately detected even in the presence of relatively complex chemistries. FIGS. 44A and 44B are a flowchart depicting a method for detecting one or more species in an effluent by its unique spectral signature in accordance with an exemplary embodiment of the present invention. The process begins by bringing the E-Beam exciter into stable operation. The line pressure is read (step 4402) and the reference electron current for the pressure is obtained (step 4404). The electron source is powered (step 4406) and the voltages are applied to the extractor and collector electrode (step 4408) to produce a beam. Before proceeding, the source and collector may be checked for operability and the source restarted if necessary (step 4414). Next, the operation conditions for the beam are verified, the collector current is sampled (step 4412) and compared to the reference current (step 4414). If they match, the light is integrated at the various wavelengths being monitored (step 4418), if not, the excitation power to the electron source is adjusted until they match (step 4416).

The excitation sequence then increments though various predetermined energy stages that correlate to the spectral signatures being evaluated (step 4420). At each energy stage, the extractor voltage is incremented (step 4422) and the light is integrated at the various wavelengths being monitored (step 4418). Once the electron energy stages have been evaluated, the E-Beam exciter is powered down (step 4424) and the integrations are evaluated for the presence of a unique spectral signature for a species (step 4426). It is expected that this function will occur at a separate processor or an advanced spectrograph with computational processing features. In either case, a plurality of unique spectral signatures will be retained for reference to the observations that are compared to the latest integration for matches (step 4430). Conceivably, multiple matching spectral signatures will be identified for species in the effluent. The comparison criteria for a match may vary, from an identical match of all spectral profiles for each energy state, to a partial match of some energy states or some spectral lines in all states, or a combination of the two. It should be appreciated that a unique spectral signature for a species could be rather complex and difficult to reproduce completely under production conditions. Once the integrations have been evaluated for their spectral content, a determination is made whether or not to continue (step 4428) and, if appropriate, the process continues with another cycle (step 4432).

Although the present invention has been described with regard to use in applications in the semiconductor industry, the analysis method is applicable in a wide range of applications where a quantitative or qualitative measure of the components in a gas mixture are to be studied, identified, or measured. One example of use will be for Analytical Chemists for studying, identifying, and/or measuring the components in a gas mixture. The excitation methodology described herein is applicable for exciting that gas mixture to fluoresce. The fluorescence spectra could be used for the analysis ICP plasma systems, often used for such analysis, completely fragment the mixture being examined. As the present E-beam system can be set to minimize this fragmentation, one could interrogate both atomic and molecular species. As such, the E-beam system can be used in industrial applications that are not commonly examined with standard ICP Atomic Spectroscopy. Possible applications include but are not limited to: atmospheric chemistry studies, tailpipe emission measurements, smokestack emission measurements, solid and liquid phase chemistry identification using methods and practices similar to those used in ICP Atomic Spectroscopy.

The exemplary embodiments described below were selected and described in order to best explain the principles of the invention and the practical application, and to enable others of ordinary skill in the art to understand the invention for various embodiments with various modifications as are suited to the particular use contemplated. The particular embodiments described below are in no way intended to limit the scope of the present invention as it may be practiced in a variety of variations and environments without departing from the scope and intent of the invention. Thus, the present invention is not intended to be limited to the embodiment shown, but is to be accorded the widest scope consistent with the principles and features described herein.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method of determining an endpoint in an etching process by monitoring excited gas particles undergoing a relaxation from an excited energy state to a lower energy state, comprising:
    identifying a spectral profile of an emission wavelength of a target gas species within a plurality of gas species when the plurality of gas species is excited by an electron beam;
    identifying an electron scattering cross section for the target gas species;
    setting an extractor voltage of an electron beam source for exciting the target gas species to emit the spectral profile based on an electron energy associated with a maximum value of the electron scattering cross section for the target gas species;
    adjusting an energy distribution and concentration of the electron beam based on the electron energy associated with the maximum value of the electron scattering cross section for the target gas species and sufficient to excite the target gas species into an energy state to undergo emission relaxation to produce the spectral profile detectable for determining the endpoint; and
    monitoring the etching process and ending the etching process based upon change of the spectral profile of the target gas species.

2. The method of claim 1, further comprising:
    adjusting the energy distribution and concentration of the electron beam based on the electron energy associated with the maximum value of the electron scattering cross section sufficient to excite a second target gas species into a second energy state to undergo emission relaxation to produce a second spectral profile detectable for determining the endpoint.

3. The method recited in claim 1, wherein adjusting the energy distribution of the electron beam further comprises adjusting the electron beam only to excite the target gas species.

4. The method recited in claim 3, wherein adjusting the energy distribution of the electron beam comprises holding a density of electrons in the electron beam constant at a first concentration of electrons; altering the energy state of the electron beam to a second mean electron energy state; and receiving light from relaxation of the excited target gas species.

5. The method recited in claim 4, further comprising: holding an energy level of electrons in the electron beam constant at the second mean electron energy state; adjusting the density of electrons in the electron beam to a second concentration of electrons; and receiving light emissions from relaxation of the excited target gas species.

6. The method recited in claim 1, wherein the target gas species is a first target gas species, and the method further comprising:
    identifying a spectral profile of an emission wavelength for a second, different target gas species within the plurality of gas species;
    setting an extractor voltage for exciting the second different target gas species to emit the spectral profile based on the electron energy associated with the maximum value of the electron scattering cross section for the second different target gas species;
    adjusting the energy distribution and concentration of the electron beam based on the electron energy associated with the maximum value of the electron scattering cross section for the second different target gas species and sufficient to excite the second different target gas species into the energy state to undergo emission relaxation to produce the spectral profile detectable for determining the endpoint; and
    monitoring the etching process and ending the etching process based upon change of the spectral profile of the second different target gas species.

7. The method recited in claim 1, further comprising: monitoring a density of electrons in the electron beam and verifying the density of electrons in the electron beam at a first concentration of electrons.

8. A method of determining an endpoint in an etching process by monitoring excited gas particles undergoing a relaxation from an excited energy state to a lower energy state, comprising:
    providing a first excitation energy level for an electron source;
    establishing a reference potential at the electron source;

providing a first extractor voltage for an electron beam source for exciting a target gas species to emit a spectral profile based on an electron energy associated with a maximum value of an electron scattering cross section of the target gas species, wherein the first extractor voltage is greater than the reference potential;

generating an electron beam along a beam axis based on the first extractor voltage and sufficient to excite the spectral profile of the target gas species within a plurality of gas species when the plurality of gas species is excited by the electron source;

adjusting an energy distribution and concentration of the electron beam based on the electron energy associated with the maximum value of the electron scattering cross section for the target gas species and sufficient to excite the target gas species into an energy state to undergo emission relaxation to produce an identifying spectral profile detectable for determining the endpoint; and monitoring the etching process and ending the etching process based upon change of the spectral profile of the target gas species.

9. The method recited in claim 8 wherein the target gas species is a first target gas species, and the method further comprising:

identifying a spectral profile of an emission wavelength for a second, different target gas species within the plurality of gas species;

identifying an electron scattering cross section for the second target gas species;

setting an extractor voltage for exciting the second target gas species to emit the spectral profile for the second target gas species based on the electron energy associated with a maximum value of the electron scattering cross section for the second target gas species;

adjusting an energy distribution and concentration of the electron beam based on the electron energy associated with the maximum value of the electron scattering cross section for the second target gas and sufficient to excite the second target gas species into an energy state to undergo emission relaxation to produce the spectral profile detectable for determining the endpoint; and monitoring an etching process and ending the etching process based upon change of the spectral profile of the second target gas species.

* * * * *